US012408555B2

United States Patent
Zheng et al.

(10) Patent No.: US 12,408,555 B2
(45) Date of Patent: Sep. 2, 2025

(54) THREE-DIMENSIONAL PIEZOELECTRIC MATERIALS AND USES THEREOF

(71) Applicant: VIRGINIA TECH INTELLECTUAL PROPERTIES, INC., Blacksburg, VA (US)

(72) Inventors: Xiaoyu Zheng, Blacksburg, VA (US); Huachen Cui, Blacksburg, VA (US); Ryan Hensleigh, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 34 days.

(21) Appl. No.: 17/057,715

(22) PCT Filed: May 24, 2019

(86) PCT No.: PCT/US2019/034065
§ 371 (c)(1),
(2) Date: Nov. 23, 2020

(87) PCT Pub. No.: WO2019/227082
PCT Pub. Date: Nov. 28, 2019

(65) Prior Publication Data
US 2021/0234089 A1    Jul. 29, 2021

Related U.S. Application Data

(60) Provisional application No. 62/676,091, filed on May 24, 2018.

(51) Int. Cl.
H01L 41/193      (2006.01)
B33Y 30/00       (2015.01)
(Continued)

(52) U.S. Cl.
CPC ............ *H10N 30/852* (2023.02); *B33Y 30/00* (2014.12); *B33Y 70/00* (2014.12); *B33Y 80/00* (2014.12);
(Continued)

(58) Field of Classification Search
CPC .................................................... H10N 30/852
(Continued)

(56) References Cited

U.S. PATENT DOCUMENTS

2013/0302633 A1    11/2013  Pellegrino et al.
2016/0322560 A1*   11/2016  Sirbuly ..................... C08K 3/22
2017/0047505 A1     2/2017  Zeng et al.

OTHER PUBLICATIONS

"Invitation to Pay Additional Fees", issued by The United States Patent and Trademark Office, as International Searching Authority for PCT/US2019/034065 on Aug. 6, 2019.
(Continued)

*Primary Examiner* — Derek J Rosenau
(74) *Attorney, Agent, or Firm* — Carin R. Miller; Lex Generalis, LLC

(57) ABSTRACT

Described herein are aspects of a three-dimensional (3D) piezoelectric structure that can be composed of a 3D periodic microlattice that can be composed of a piezoelectric composite material, wherein the 3D periodic microlattice can include a plurality of interconnected 3D node units capable of generating a piezoelectric response upon application of a stress to the 3D periodic microlattice, and wherein the plurality of interconnected 3D node units can form a tailored piezoelectric tensor space. Also described herein are systems that can include one or more of the 3D piezoelectric structures described herein. Also described herein are methods of making and using the 3D piezoelectric structures described herein.

19 Claims, 59 Drawing Sheets

(51) Int. Cl.
　　　B33Y 70/00　　　(2020.01)
　　　B33Y 80/00　　　(2015.01)
　　　H10N 30/093　　(2023.01)
　　　H10N 30/098　　(2023.01)
　　　H10N 30/85　　　(2023.01)
　　　B33Y 10/00　　　(2015.01)
　　　B33Y 40/00　　　(2020.01)

(52) U.S. Cl.
　　　CPC ......... *H10N 30/093* (2023.02); *H10N 30/098* (2023.02); *B33Y 10/00* (2014.12); *B33Y 40/00* (2014.12)

(58) Field of Classification Search
　　　USPC ......................................................... 310/800
　　　See application file for complete search history.

(56) References Cited

OTHER PUBLICATIONS

"International Search Report and Written Opinion", issued by The United States Patent and Trademark Office, as International Searching Authority for PCT/US2019/034065 on Oct. 16, 2019.
Gafforelli, G., Corigliano, A., Xu, R. & Kim, S.-G. Experimental verification of a bridge-shaped, nonlinear vibration energy harvester. Appl. Phys. Lett. 105, 203901 (2014).
Zheng, X. Y. et al. Design and optimization of a light-emitting diode projection microstereolithography three-dimensional manufacturing system. Rev. Sci. Instrum 83, 125001 (2012).
Grupp, D. E. & Goldman, A. M. Giant piezoelectric effect in strontium titanate at cryogenic temperatures. Science 276, 392-394 (1997).
Griffith, M. L. & Halloran, J. W. Freeform fabrication of ceramics via stereolithography. J Am Ceram Soc 79, 2601-2608 (1996).
Jabbari, M. & Hattel, J. Bingham plastic fluid flow model in tape casting of ceramics using two doctor blades—analytical approach. Mater Sci Tech Ser 30, 283-288 (2014).
Manna, S., et al. Tuning the piezoelectric and mechanical properties of the AlN system via alloying with YN and Bn. J. Appl. Phys. 122, 105101 (2017).
Guo, R., Wang, C. A. & Yang, A. K. Effects of pore size and orientation on dielectric and piezoelectric properties of 1-3 type porous PZT ceramics. J Eur Ceram Soc 31, 605-609 (2011).
Ligon et al. 2017 ("Polymers for 3D Printing and Customized Additive Manufacturing" Chem. Rev. 10212-10281.
Min, Y. H., Lee, K. S., Yoon, C. S. & Do, L. M. Surface morphology study of corona-poled thin films derived from sol-gel processed organic-inorganic hybrid materials for photonics applications. J Mater Chem 8, 1225-1232 (1998).
Yang, L., Harrysson, O., West, H. & Cormier, D. Modeling of uniaxial compression in a 3D periodic re-entrant lattice structure. J Mater Sci 48, 1413-1422 (2013).
Wang et al., Multimaterial piezoelectric fibres, Nature Materials, 9, 643-648, 2010.
Masmanidis, S. C. et al. Multifunctional nanomechanical systems via tunably coupled piezoelectric actuation. Science 317, 780-783 (2007).
Wang, H., Zhang, Q. M., Cross, L. E. & Sykes, A. O. Piezoelectric, dielectric, and elastic properties of poly(vinylidene fluoride/trifluoroethylene). J. Appl. Phys. 74, 3394-3398 (1993).
Marselli, S. et al. Porous piezoelectric ceramic hydrophone. J Acoust Soc Am 106, 733-738 (1999).
Song, X. et al. Piezoelectric component fabrication using projection-based stereolithography of barium titanate ceramic suspensions. Rapid Prototyping J 23, 44-53 (2017).
Wang, X. et al. Subatomic deformation driven by vertical piezoelectricity from CdS ultrathin films. Sci. Adv. 2, e1600209 (2016).
Sperling, R. A. & Parak, W. J. Surface modification, functionalization and bioconjugation of colloidal inorganic nanoparticles. Philos T R Soc A 368, 1333-1383 (2010).
He, X. M. et al. Synthetic homeostatic materials with chemo-mechano-chemical self-regulation. Nature 487, 214-218 (2012).
Tumbleston, J. R. et al. Continuous liquid interface production of 3D objects. Science 347, 1349-1352 (2015).
Zheng, X. Y. et al. Ultralight, Ultrastiff Mechanical Metamaterials. Science 344, 1373-1377 (2014).
Anderson, J. C. & Eriksson, C. Piezoelectric properties of dry and wet bone. Nature 227: 491-492 (1970).
Priya, S. & Nahm, S. Lead-free Piezoelectrics, 521 pages (Springer, New York, 2011).
Li, F. et al. Ultrahigh piezoelectricity in ferroelectric ceramics by design. Nat. Mater. 17, 349-354 (2018).
Guerin, S. et al. Control of piezoelectricity in amino acids by supramolecular packing. Nat. Mater. 17:180-186 (2018).
Lu, X., Qu, H. & Skorobogatiy, M. Piezoelectric micro- and nanostructured fibers fabricated from thermoplastic nanocomposites using a fiber drawing technique: comparative study and potential applications. ACS Nano 11:2103-2114 (2017).
Ganeshkumar, R., Cheah, C. W., Xu, R., Kim, S.-G. & Zhao, R. A high output voltage flexible piezoelectric nanogenerator using porous lead-free KNbO3 nanofibers. Appl. Phys. Lett. 111, 013905, 6 pages (2017).
Dagdeviren, C. et al. Conformal piezoelectric systems for clinical and experimental characterization of soft tissue biomechanics. Nat. Mater. 14:728-736 (2015).
Espinosa, H. D., Bernal, R. A. & Minary-Jolandan, M. A review of mechanical and electromechanical properties of piezoelectric nanowires. Adv. Mater. 24, 4656-4675 (2012).
Laurenti, M. et al. Nanobranched ZnO Structure: p-Type doping induces piezoelectric voltage generation and ferroelectric-photovoltaic effect. Adv Mater 27, 4218-4223 (2015).
Shin, S. H. et al. Lithium-doped zinc oxide nanowires-polymer composite for high performance flexible piezoelectric nanogenerator. ACS Nano 8, 10844-10850 (2014).
Harris, D. T., et al. Microstructure and dielectric properties with CuO additions to liquid phase sintered BaTiO3 thin films. J. Mater. Res. 31, 1018-1026 (2016).
Nag, S. K. & Agrawal, D. C. Piezoelectric and mechanical-properties of ceria-doped lead zirconate titanate ceramics. J. Mater. Sci. 27, 4125-4130 (1992).
McCall, W. R., Kim, K., Heath, C., La Pierre, G. & Sirbuly, D. J. Piezoelectric nanoparticle-polymer composite foams. ACS Appl. Mater. Inter. 6, 19504-19509 (2014).
Smay, J. E., Tuttle, B. & Iii, J. C. Piezoelectric and Acoustic Materials for Transducer Applications, 305-318 (Springer, Boston, 2008).
Challagulla, K. S. & Venkatesh, T. A. Electromechanical response of piezoelectric foams. Acta Mater. 60, 2111-2127 (2012).
Huang, J. H. & Kuo, W. S. Micromechanics determination of the effective properties of piezoelectric composites containing spatially oriented short fibers. Acta Mater 44, 4889-4898 (1996).
Bowen et al.(Integr Ferroelectr 32, 1025-1034 (2001).
Rittenmyer et al. (Ferroelectrics 41, 323-329 (1982).
Cui, H., Hesleigh, R., Chen, H. & Zheng, X. Fabrication and Size-dependent Mechanical Properties of Three-dimensional Microarchitected, High-temperature Ceramic Metamaterials. Journal of Material Research 33, 360-371 (2017).
Kim, H. et al. Integrated 3D printing and corona poling process of PVDF piezoelectric films for pressure sensor application. Smart Mater Struct 26, 085027 (2017).
Kim, K. et al. 3D Optical Printing of Piezoelectric Nanoparticle—Polymer Composite Materials. Acs Nano 8, 9799-9806 (2014).
Lifson, M. L., Kim, M. W., Greer, J. R. & Kim, B. J. Enabling Simultaneous Extreme Ultra Lowklin Stiff, Resilient, and Thermally Stable Nano-Architected Materials. Nano Lett 17, 7737-7743 (2017.
Kara, H., Ramesh, R., Stevens, R. & Bowen, C. R. Porous PZT ceramics for receiving transducers. Ieee T Ultrason Ferr 50, 289-296 (2003).
Liu, W. et al. Processing and Properties of Porous PZT Ceramics from Particle-Stabilized Foams via Gel Casting. J Am Ceram Soc 96, 1827-1831 (2013).

(56) References Cited

OTHER PUBLICATIONS

Yang, A. K., Wang, C. A., Guo, R. & Huang, Y. Microstructure and Electrical Properties of Porous PZT Ceramics Fabricated by Different Methods. J Am Ceram Soc 93, 1984-1990 (2010).
Zhang, Y., Chen, L. J., Zeng, J., Zhou, K. C. & Zhang, D. Aligned porous barium titanate/hydroxyapatite composites with high piezoelectric coefficients for bone tissue engineering. Mat Sci Eng C-Mater 39, 143-149 (2014).
Liu, W., Du, L. J., Wang, Y. Z., Yang, J. L. & Xu, H. Effects of foam composition on the microstructure and piezoelectric properties of macroporous PZT ceramics from ultrastable particlestabilized foams. Ceram Int 39, 8781-8787 (2013)).
Deshpande, V. S., Ashby, M. F. & Fleck, N. A. Foam topology bending versus stretching dominated architectures. Acta Mater 49, 1035-1040 (2001).
Dong, L., Deshpande, V. & Wadley, H. Mechanical response of Ti-6Al-4V octet-truss lattice structures. Int J Solids Struct 60-61, 107-124 (2015)).
Tada, H., Paris, P. C. & Irwin, G. R. The stress analysis of cracks handbook. (Del Rdearch Corporation, St. Louis, 1977.
Johnson, F. A., Glover, A. P. & Radon, J. C. Fracture Toughness and Fracture Energy Measurements on Aluminum-Alloys. Eng Fract Mech 8, 381-390 (1976).
Mcintyre, A. & Anderton, G. E. Fracture Properties of a Rigid Polyurethane Foam over a Range of Densities. Polymer 20, 247-253 (1979).
Lam, D. C. C., Lange, F. F. & Evans, A. G. Mechanical-Properties of Partially Dense Alumina Produced from Powder Compacts. J Am Ceram Soc 77, 2113-2117 (1994).
Wouterson, E. M., Boey, F. Y. C., Hu, X. & Wong, S. C. Specific properties and fracture toughness of syntactic foam: Effect of foam microstructures. Compos Sci Technol 65, 1840-1850 (2005).
Hashimoto, K. Y. & Yamaguchi, M. Elastic, piezoelectric and dielectric properties of composite materials. IEEE 1986 Ultras. Symp. 2, 697-702 (1986).
Glushanin, S., Topolov, V. Y. & Krivoruchko, A. V. Features of piezoelectric properties of 0-3 PbTiO3-type ceramic/polymer composites. Mater. Chem. Phys. 97, 357-364 (2006).
Bowen, C. R. & Topolov, V. Y. Electromechanical Properties In Composites Based On Ferroelectrics 1-202 (Springer, London, 2009.
Nix, E. L. & Ward, I. M. The measurement of the shear piezoelectric coefficients of polyvinylidene fluoride. Ferroelectrics, pp. 137-141, 1986.
Eliades, S. J. & Wang, X. Q. Neural substrates of vocalization feedback monitoring in primate auditory cortex. Nature 453, 1102-1106 (2008).
Wu, W. Z., Wen, X. N. & Wang, Z. L. Taxel-addressable matrix of vertical-nanowire piezotronic transistors for active and adaptive tactile imaging. Science 340, 952-957 (2013).
Hu, J. & Park, T. Continuum models for the plastic deformation of octet-truss lattice materials under multiaxial loading. J. Eng. Mater. Technol. 135, 021004, 11 pages (2013).
Zheng, X. et al. Multiscale metallic metamaterials. Nat. Mater. 15, 1100-1106 (2016).
Liu, et al. Elastic and failure response of imperfect three-dimensional metallic lattices: the role of geometric defects induced by Selective Laser Melting. J. Mech. Phys. Solids. 107, 160-184 (2017).
Kar-Gupta, R. & Venkatesh, T. A. Electromechanical response of piezoelectric composites: effects of geometric connectivity and grain size. Acta Mater. 56, 3810-3823 (2008).

* cited by examiner

FIG. 30A

| Projection patterns | θ | $a_{33}$ | $a_{32}$ | $a_{31}$ |
|---|---|---|---|---|
| 6-strut (3+3) | 100° | ~ -0.93 | ~ -0.26 | ~ -0.26 |
| | 90° | ~ -0.98 | ~ -0.12 | ~ -0.12 |
| | 60° | ~ -0.99 | ~ -0.02 | ~ -0.02 |
| | 30° | ~ -0.99 | ~ 0.10 | ~ 0.10 |
| 4-strut | 100° | ~ -0.87 | ~ -0.35 | ~ -0.35 |
| | 90° | ~ -0.81 | ~ -0.41 | ~ -0.41 |
| | 60° | ~ -0.7 | ~ -0.5 | ~ -0.5 |
| | 20° | ~ -0.48 | ~ -0.62 | ~ -0.62 |
| 8-strut (4+4) | 100° | ~ -0.99 | ~ -0.12 | ~ -0.12 |
| | 90° | ~ -1 | ~ 0 | ~ 0 |
| | 60° | ~ -0.75 | ~ -0.47 | ~ -0.47 |
| | 45° | ~ -0.89 | ~ -0.32 | ~ -0.32 |

| Projection patterns | $\theta_1, \theta_2$ | $\bar{a}_{11}$ | $\bar{a}_{22}$ | $\bar{a}_{33}$ |
|---|---|---|---|---|
| 3-strut (dissimilar projection patterns) | $\theta_1 = 120°, \theta_2 = 100°$ | −0.8 | −0.39 | −0.45 |
| | $\theta_1 = 120°, \theta_2 = 90°$ | −0.8 | −0.32 | −0.5 |
| | $\theta_1 = 120°, \theta_2 = 45°$ | −0.8 | −0.18 | −0.56 |
| | $\theta_1 = 120°, \theta_2 = 30°$ | −0.78 | −0.09 | −0.62 |
| 6-strut (dissimilar projection patterns) | $\theta_1 = 90°, \theta_2 = 80°$ | −0.93 | −0.25 | −0.23 |
| | $\theta_1 = 90°, \theta_2 = 60°$ | −0.89 | −0.40 | −0.16 |
| | $\theta_1 = 90°, \theta_2 = 45°$ | −0.85 | −0.51 | −0.08 |
| | $\theta_1 = 90°, \theta_2 = 20°$ | −0.55 | −0.82 | −0.11 |
| 3-strut/5-strut (dissimilar projection patterns) | $\theta_1 = 120°, \theta_2 = 30°$ | −0.99 | −0.1 | −0.81 |
| | $\theta_1 = 75°, \theta_2 = −15°$ | −0.56 | −0.73 | −0.39 |

FIG. 30B

| | |
|---|---|
| Relative dielectric constant | 1900 |
| Dielectric dissipation factor (tanδ) | <2.00 |
| $k_p$ | 0.63 |
| $k_{33}$ | 0.72 |
| $k_{31}$ | 0.36 |
| $k_{15}$ | 0.68 |
| $d_{33}$ | 400 |
| $-d_{31}$ | 175 |
| $d_{15}$ | 590 |
| $g_{33}$ | 24.8 |
| $g_{31}$ | 12.4 |
| $g_{15}$ | 36.0 |
| Young's modulus $Y_{11}$ | 6.3 |
| $Y_{33}$ | 5.4 |

FIG. 31

| Relative Density | Modulus(MPa) | Compliance(1/MPa) |
|---|---|---|
| 0.35 | 15 | 0.06 |
| 0.28 | 9 | 0.11 |
| 0.22 | 6 | 0.16 |
| 0.18 | 7 | 0.14 |
| 0.1 | 3 | 0.33 |
| 0.05 | 1 | 1 |
| 0.34 | 6.5 | 0.15 |
| 0.24 | 2.8 | 0.35 |
| 0.14 | 0.9 | 1.11 |
| 0.06 | 0.1 | 10 |
| 0.41 | 0.11 | 8.84 |
| 0.29 | 0.02 | 43.80 |
| 0.21 | 0.01 | 91.85 |
| 0.18 | 0.009 | 111.11 |
| 0.07 | 0.003 | 333.33 |
| 0.1 | 0.0008 | 1250 |
| 0.03 | 0.00003 | 33333.33 |

| Polymer matrix | Design | Relative Density | Voltage (V) | Charge (pC) | Force (N) | D33 (pC/N) |
|---|---|---|---|---|---|---|
| Stiff Matrix | N=12, θ=90° | 0.05 | 0.039 | 3.9 | 0.1 | 40.5 |
| | | | 0.083 | 8.3 | 0.2 | |
| | | | 0.123 | 12.3 | 0.3 | |
| | | 0.19 | 0.0415 | 4.15 | 0.1 | 42 |
| | | | 0.084 | 8.4 | 0.2 | |
| | | | 0.1275 | 12.75 | 0.3 | |
| | | 0.28 | 0.044 | 4.4 | 0.1 | 43.5 |
| | | | 0.087 | 8.7 | 0.2 | |
| | | | 0.129 | 12.9 | 0.3 | |
| | | 0.38 | 0.0445 | 4.45 | 0.1 | 44.5 |
| | | | 0.09 | 9 | 0.2 | |
| | | | 0.132 | 13.2 | 0.3 | |
| | | 0.45 | 0.046 | 4.6 | 0.1 | 45 |
| | | | 0.088 | 8.8 | 0.2 | |
| | | | 0.135 | 13.5 | 0.3 | |
| Stiff Matrix | N=5, θ=120° | 0.05 | 0.0265 | 2.65 | 0.1 | 27.2 |
| | | | 0.054 | 5.4 | 0.2 | |
| | | | 0.084 | 8.4 | 0.3 | |
| | | 0.15 | 0.028 | 2.8 | 0.1 | 28.5 |
| | | | 0.0568 | 5.68 | 0.2 | |
| | | | 0.087 | 8.7 | 0.3 | |
| | | 0.25 | 0.031 | 3.1 | 0.1 | 31.2 |
| | | | 0.0624 | 6.24 | 0.2 | |
| | | | 0.0942 | 9.42 | 0.3 | |
| | | 0.35 | 0.0316 | 3.16 | 0.1 | 31.4 |
| | | | 0.062 | 6.2 | 0.2 | |
| | | | 0.0951 | 9.51 | 0.3 | |
| | | 0.45 | 0.0321 | 3.21 | 0.1 | 32.1 |
| | | | 0.0634 | 6.34 | 0.2 | |
| | | | 0.0975 | 9.75 | 0.3 | |
| Flexible Matrix | N=12, θ=90° | 0.05 | 0.043 | 4.3 | 0.1 | 44.5 |
| | | | 0.091 | 9.1 | 0.2 | |
| | | | 0.135 | 13.5 | 0.3 | |
| | | 0.19 | 0.0455 | 4.55 | 0.1 | 46 |
| | | | 0.092 | 9.2 | 0.2 | |
| | | | 0.1395 | 13.95 | 0.3 | |
| | | 0.28 | 0.048 | 4.8 | 0.1 | 47.5 |
| | | | 0.095 | 9.5 | 0.2 | |
| | | | 0.141 | 14.1 | 0.3 | |
| | | 0.38 | 0.0485 | 4.85 | 0.1 | 48.5 |
| | | | 0.098 | 9.8 | 0.2 | |
| | | | 0.144 | 14.4 | 0.3 | |
| | | 0.45 | 0.05 | 5 | 0.1 | 49 |
| | | | 0.096 | 9.6 | 0.2 | |
| | | | 0.147 | 14.7 | 0.3 | |
| Flexible Matrix | N=5, θ=120° | 0.05 | 0.0305 | 3.05 | 0.1 | 31.2 |
| | | | 0.062 | 6.2 | 0.2 | |
| | | | 0.096 | 9.6 | 0.3 | |
| | | 0.15 | 0.032 | 3.2 | 0.1 | 32.4 |
| | | | 0.0648 | 6.48 | 0.2 | |
| | | | 0.099 | 9.9 | 0.3 | |
| | | 0.25 | 0.035 | 3.5 | 0.1 | 35.2 |
| | | | 0.0704 | 7.04 | 0.2 | |
| | | | 0.1062 | 10.62 | 0.3 | |
| | | 0.35 | 0.0356 | 3.56 | 0.1 | 35.4 |
| | | | 0.07 | 7 | 0.2 | |
| | | | 0.1071 | 10.71 | 0.3 | |
| | | 0.45 | 0.0361 | 3.61 | 0.1 | 36.1 |
| | | | 0.0714 | 7.14 | 0.2 | |
| | | | 0.1095 | 10.95 | 0.3 | |

*Functionalized particle loading: 2.5 vol% (16 wt %)

| Polymer matrix | Design | Relative Density | Voltage (V) | Charge (pC) | Force (N) | D33 (pC/N) |
|---|---|---|---|---|---|---|
| Stiff Matrix | N=12, θ=90° | 0.28 | 0.096 | 9.6 | 0.15 | 62 |
| | | | 0.013 | 13 | 0.2 | |
| | | | 0.148 | 14.8 | 0.25 | |
| | | | 0.176 | 17.6 | 0.3 | |
| | | 0.33 | 0.288 | 28.8 | 0.45 | 68 |
| | | | 0.225 | 22.5 | 0.36 | |
| | | | 0.162 | 16.2 | 0.3 | |
| | | | 0.09 | 9 | 0.18 | |
| | | 0.38 | 0.11 | 11 | 0.15 | 72 |
| | | | 0.14 | 14 | 0.2 | |
| | | | 0.17 | 17 | 0.25 | |
| | | | 0.23 | 23 | 0.3 | |
| | | 0.45 | 0.072 | 7.2 | 0.1 | 76 |
| | | | 0.09 | 9 | 0.15 | |
| | | | 0.144 | 14.4 | 0.25 | |
| | | | 0.216 | 21.6 | 0.35 | |
| | | 0.32 | 0.4 | 4 | 0.1 | 36 |
| | | | 0.056 | 5.6 | 0.15 | |
| | | | 0.076 | 7.6 | 0.2 | |
| | | 0.4 | 0.04 | 4 | 0.2 | 38 |
| | | | 0.06 | 6 | 0.15 | |
| | | | 0.07 | 7 | 0,2 | |
| | | 0.45 | 0.04 | 4 | 0.1 | 42 |
| | | | 0.07 | 7 | 0,15 | |
| | | | 0.0954 | 9.5 | 0.2 | |

*Functionalized Particle Loading: 30 vol% (88 wt%)

FIG. 33 (ctnd.)

| Piezoelectric charge constant (pC/N) Composition | $d_{31}$ | $d_{32}$ | $d_{33}$ |
|---|---|---|---|
| PEGDA-2.5vol%PZT | -15 | -15 | 52 |
| PEGDA-36vol%PZT | -26 | -26 | 90 |
| Ebecryl 242/114-2.5vol%PZT | -10 | -10 | 55 |

FIG. 34

THREE-DIMENSIONAL PIEZOELECTRIC MATERIALS AND USES THEREOF

CROSS-REFERENCE TO RELATED APPLICATIONS

This application is the U.S. National Stage Application under 35 U.S.C. § 371 of Patent Cooperation Treaty Application No.: PCT/US2019/034065, filed on May 24, 2019, entitled "THREE-DIMENSIONAL PIEZOELECTRIC MATERIALS AND USES THEREOF," which claims the benefit of and priority to U.S. Provisional Patent Application No. 62/676,091, filed on May 24, 2018, entitled "ADDITIVE MANUFACTURING AND DESIGN OF PIEZOELECTRIC MATERIALS WITH ARBITRARY STRUCTURE AND RESPONSE IN 3D" the contents of which are incorporated by reference herein in their entireties.

TECHNICAL FIELD

The subject matter disclosed herein is generally directed to piezoelectric materials.

BACKGROUND

Piezoelectric materials are electromechanical materials that have a wide variety of applications from energy harvesting to sensors. The continued development of piezoelectric materials has led to a huge market of products ranging from those for everyday use to more specialized devices. As such there exists a need for the development of piezoelectric materials and structures.

SUMMARY

Described herein are aspects of a three-dimensional (3D) piezoelectric structure composed of: a 3D periodic microlattice comprising a piezoelectric composite material, wherein the 3D periodic microlattice comprises a plurality of interconnected 3D node units capable of generating a piezoelectric response upon application of a stress to the 3D periodic microlattice, and wherein the plurality of interconnected 3D node units form a tailored piezoelectric tensor space. The piezoelectric composite material can be composed of a plurality of functionalized piezoelectric particles crosslinked to a polymer matrix. The polymer matrix can be composed of photosensitive monomers. The polymer matrix can be composed of a polymer selected from the group of: polydimethylsiloxane (PDMS), poly(ethylene glycol) diacrylate, polyvinylidene fluoride (PVDF), hexanediol diacrylate (HDDA) a thermoset polymer, a thermoplastic polymer, and combinations thereof. The functionalized piezoelectric particles can be composed of a piezoelectric particle and a functionalization moiety, wherein the functionalization moiety is covalently attached to the piezoelectric particle. The piezoelectric particle can be selected from the group of: quartz, berlinite ($AlPO_4$), sodium potassium tartrate tetrahydrate, topaz, a tourmaline-group mineral, ($PbTiO_3$), langasite ($La_3Ga_5SiO_{14}$), gallium orthophosphate ($GaPO_4$), lithium niobite ($LiNbO_3$), lithium tantalite ($LiTaO_3$), barium titanate ($BaTiO_3$), lead zirconate titanate (PZT), potassium niobite ($KNbO_3$), sodium tungstate ($Na_2WO_3$), $Ba_2NaNb_5O_5$, $Pb_2KNb_5O_{15}$, sodium potassium niobite (K,Na)$NbO_3$), bismuth ferrite ($BiFeO_3$), sodium niobite ($NaNbO_3$), bismuth titanate ($Bi_4Ti_3O_{12}$), sodium bismuth titanate ($NaBi(TiO_3)_2$), Zinc oxide (ZnO), niobite-lead titanate (PMN-PT), and combinations thereof. The functionalization moiety can be a moiety capable of forming hydroxyl groups on the nanoparticle surfaces to form covalent linkage with the polymer matrix. The functionalization moiety can be selected from the group of: a moiety comprising an acrylate containing group, trimethoxysilylpropyl methacrylate (TMSPM), trimethoxysilylpropyl acrylate (TMSPA), and combinations thereof. The functionalized piezoelectric particles can be crosslinked to the polymer matrix via the functionalization moiety.

Also described herein are aspects of a three dimensional (3D) piezoelectric structure composed of: two or more interconnected three dimensional (3D) piezoelectric structures as described herein, wherein at least two of the 3D piezoelectric structures have different 3D microlattices and wherein the at least two 3D piezoelectric structures having different 3D microlattices produce a different piezoelectric response upon application of a stress to the two or more interconnected 3D piezoelectric structures.

The 3D piezoelectric structure can be manufactured using an additive manufacturing technique. In aspects, the additive manufacturing technique is can be a light-based additive manufacturing technique.

Also described herein are aspects of a system composed of: one or more three dimensional (3D) piezoelectric structures as described herein; and one or more electrodes, wherein the one or more electrodes are coupled to at least one of the one or more 3D piezoelectric structures. The system can further include an electric current generator, wherein the electric current generator is coupled to at least one of the one or more 3D piezoelectric structures. The system can further include an output sensor, wherein the electric output sensor is coupled to at least one of the one or more 3D piezoelectric structures and wherein the output sensor is configured to receive an output signal from the one or more 3D piezoelectric structures. The output signal can be an electrical signal. In aspects the output signal can be a mechanical signal.

Also described herein are aspects of a method that can include the step(s) of applying a stress to a three dimensional (3D) piezoelectric structure as described herein or to one more 3D piezoelectric structures in the system as described herein; and generating a piezoelectric response to the applied stress, wherein the piezoelectric response is generated by the 3D piezoelectric structure as described herein or by one or more of the 3D piezoelectric structure in the system as described herein. The stress can be an electrical current and the piezoelectric response is a mechanical response. The stress can be a mechanical force and the piezoelectric response is an electrical output.

Also described herein are aspects of a method of generating a 3D piezoelectric structure including the steps of: a) coating a substrate with functionalized piezoelectric particles; b) exposing the functionalized piezoelectric particles to a photosensitive monomeric polymer resin, wherein the functionalized piezoelectric particle comprises a piezoelectric material and a functionalization moiety comprising a monomeric polymer, wherein the functionalization moiety is covalently bonded to the piezoelectric particle; c) exposing the functionalized piezoelectric particles to light to polymerize the photosensitive monomeric polymer resin and the functionalization moiety of the piezoelectric particle, wherein the exposure to light is controlled to form a layer a 3D-microlattice of the 3D piezoelectric structure; d) coating the layer of the 3D-microlattice and substrate with functionalized piezoelectric particles and e) repeating steps a) to d) as many times as desired to form the 3D-microlattice. The method can further include the step of forming the functionalized piezoelectric particle, wherein the step comprises functionalizing a particle comprising a piezoelectric material with the functionalization moiety by covalently bonding the functionalization moiety to the particle to form the functionalized piezoelectric particle and wherein the step of forming the functionalized piezoelectric particle occurs before step a).

Also described herein are aspects of a method of generating 3D piezoelectric lattice architectures capable of generating directional voltage or strain response, composed of the steps of (a) design three-dimensional unit cell structures, wherein each unit cell structures comprises symmetric or asymmetric strut members which give rise to different electric charge density distributions; (b) design arbitrary piezoelectric charge coefficient tensors via varying the angles and orientation of intersecting artificial unit cell members; and (c) tessellating the of unit cell structures into piezoelectric lattice materials of any macroscopic shapes.

Use of artificial unit cell design methods to design piezoelectric materials with different voltage responses to stresses in different directions.

Use of the piezoelectric voltage responses to detect and decouple stress components, wherein the stress components can be selected from the group consisting of: shear stress, normal stress, twisting, bending, and combinations thereof.

Use of the artificial unit cell design methods to design piezoelectric lattice materials to detect elastic waves and sound signals coming from different directions and locations.

BRIEF DESCRIPTION OF THE DRAWINGS

Further aspects of the present disclosure will be readily appreciated upon review of the detailed description of its various embodiments, described below, when taken in conjunction with the accompanying drawings.

(FIGS. 1A-G) Node unit designs from 3-, 4-, 5- and 8-strut identical projection patterns, respectively. A node unit with higher nodal connectivity can be constructed by superposition of projection patterns comprising a smaller number of projected struts.

(FIG. 2A) Schematic illustration of surface functionalization method and strong bonds between the nanoparticles and the polymer matrix after the ultraviolet curing process. (FIG. 2B) Schematic illustration of the relationship between the surface functionalization level and the piezoelectric response. The piezoelectric response increases with the surface functionalization level as a result of increasing stress transfer. (FIG. 2C) Schematic illustration of the high-resolution additive manufacturing system. (FIG. 2D) Scanning electron microscope images of 3D-printed piezoelectric microlattices. Scale bars, 300 μm.

(FIGS. 3A-3C) Optical images of representative piezoelectric metamaterials comprised of N=5 node units and their corresponding real-time voltage outputs under impact coming from the 1-, 2- and 3-directions, respectively. (FIG. 3D) Experimental and finite element analysis (FEA) results of the effective piezoelectric voltage constant $g_{33}^{eff}$ versus the relative density of N=8 and N=12 lattice materials. (FIG. 3E) Comparison of specific piezoelectric charge coefficients and elastic compliance between the piezoelectric metamaterials presented here and typical piezoelectric materials. (FIG. 3F) Drop-weight impact test on the as-fabricated piezoelectric lattice (N=12). (FIG. 3G) The real-time voltage output of the lattice corresponding to various drop weights. The transient impact stress activates the electric displacement of the metamaterial in the 3-direction, shown as the trace of the voltage output against the impact time. (FIG. 3H) Impulse pressure and transmitted pressure versus the mass of the drop weights. The significant gap (shaded area) between the detected impulse pressure and transmitted pressure reveals simultaneous impact energy absorption and self-monitoring capability of the 3D piezoelectric metamaterial.

(FIGS. 4A-4B) Camera image of a self-monitoring 3D-printed piezoelectric bridge infrastructure. All four piers are poled together along the 3-direction and the electrodes are attached to the top and bottom surface of the piers. $V_1$ to $V_4$ denote the voltage output between the corresponding electrodes. The locations of the dropping steel ball are indicated with dashed lines. (FIGS. 4C-4D) Real-time voltage outputs from the self-monitoring piezoelectric piers. (FIGS. 4E-4F) The normalized strain amplitude map (grey scale) converted from the voltage map indicates the different locations of the impact.

(FIG. 5A) Illustration of force directionality sensing application using piezoelectric metamaterials stacked from four types of designed building blocks to achieve arbitrary force directions. (FIG. 5B) As-fabricated piezoelectric infrastructure comprised of stacked architectures with encoded piezoelectric constants. (FIGS. 5C-5D) Voltage output patterns corresponding to different impact directions indicated by red arrows. The insets show the binary voltage patterns registered with different impact directions. The impact force in the 1-direction is registered with permutation voltage matrix [−, −, +, +], with [+, +, −, +] for the 2-direction and [−, −, −, +] for the 3-direction, respectively.

(FIG. 10C) Schematics for analyzing the composite using the theoretical model presented in our manuscript. (FIG. 10D)

Schematics of the open foam unit cell. (FIGS. 10E-10F) Contribution map of the struts under different stress mode (3-1 mode and 3-3 mode).

(FIG. 13B) FTIR result showing the effects of reaction time on the surface functionalization, peaks around 4 hrs. (FIG. 13C) d constant as a function of the surface linker loading for functionalization of PZT nanoparticles. (FIG. 13D) Comparison of d constant as a function of PZT nanoparticle volume loading percentage under two conditions: with functionalization and without functionalization.

(FIG. 15B) Optical image of as-coated piezoelectric photosensitive resin films with different particle loadings.

(FIG. 19E) Voltage generated from the sensor during three cycles of finger folding and unfolding.

(FIG. 20B) Energy generation and stability of the generator over time with voltage output. The result of the voltage output durability test over 60 min for verification of the energy harvesting stability. The magnified views of the regions highlighted by yellow lines represent clear and stable generated output voltage from the energy harvester. (FIG. 20C) Schematic circuit diagram for measuring the output performance of the energy harvester. (FIG. 20D) A photograph of the LED sign board with 13 high-intensity LEDs powered by the energy harvester.

(FIG. 22B) Voltage output on the 4 electrodes as a function of time.

FIGS. 24A-34D show direct piezoelectric coefficient testing and system calibration (FIG. 24A) Schematics of the system setup for measuring piezoelectricity on the as-fabricated architected metamaterials.

FIG. 25 shows a FOM of porous and bulk piezoelectric materials.

FIG. 26 shows a comparison of specific piezoelectric charge coefficients and tunable elastic compliance between the piezoelectric metamaterials presented in this study and typical piezoelectric materials.

(FIG. 27B) Load vs. Displacement curve of the CCT sample with N=12, ⊖=90° and 28% relative density. (FIG. 27C) Fracture energy and tensile strength of the piezoelectric metamaterial as a function of relative density. (FIG. 27D) Material selection chart for the fracture energy versus relative density for a few available porous materials.

FIG. 28 shows the geometric relationship between impact point and pier locations for determining the location of the impact point.

FIG. 29 shows schematics of the wiring method of the spatial stacking of multiple piezoelectric building blocks. The 25 building blocks are connected to 9 voltage channels of a data acquisition system (NI USB-6356). The blocks labeled as the same number are parallel and connected to the same voltage channel.

FIGS. 30A and 30B show tables demonstrating normalized d3M distributions.

FIG. 31 shows a table demonstrating properties of the PZT particles used in an example of a piezoelectric composite.

FIG. 32 shows a table demonstrating measurement of compliance against relative density of the piezoelectric metamaterials.

FIG. 33 shows a table demonstrating measurement of piezoelectric charge and voltage constant against relative density.

FIG. 34 shows a table demonstrating piezoelectric coefficient of the bulk functionalized PZT nanocomposite.

DETAILED DESCRIPTION

Figures 1A, 1B, 1C, 1D, 1E, 1F, 1G:
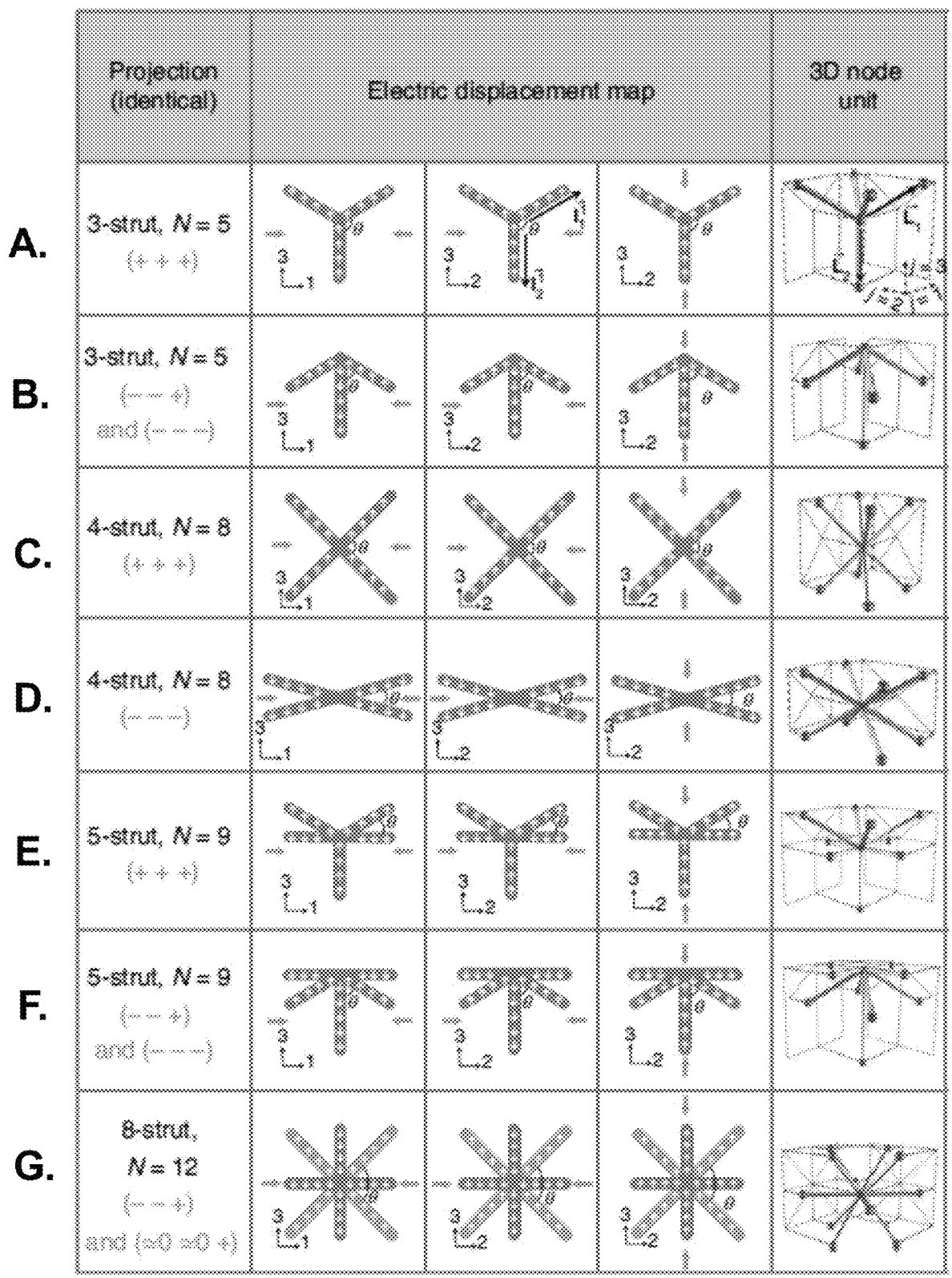
FIGS. 1A-1G show design of piezoelectric metamaterials for tailorable piezoelectric charge constants. Designing 3D node units by configuring the projection patterns.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further aspect includes from the one particular value and/or to the other particular value. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used in the specification and the appended claims, the singular forms "a," "an," and "the" include plural referents unless the context clearly dictates otherwise.

As used herein, "about," "approximately," "substantially," and the like, when used in connection with a numerical variable, can generally refers to the value of the variable and to all values of the variable that are within the experimental error (e.g., within the 95% confidence interval for the mean) or within +/−10% of the indicated value, whichever is greater. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Embodiments of the present disclosure will employ, unless otherwise indicated, techniques of organic chemistry, additive manufacturing, physics, engineering, materials science, and the like, which are within the skill of the art. Such techniques are explained fully in the literature.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible unless the context clearly dictates otherwise.

Definitions

As used herein, "attached" can refer to covalent or non-covalent interaction between two or more molecules. Non-covalent interactions can include ionic bonds, electrostatic interactions, van der Walls forces, dipole-dipole interactions, dipole-induced-dipole interactions, London dispersion forces, hydrogen bonding, halogen bonding, electromagnetic interactions, π-π interactions, cation-π interactions, anion-π interactions, polar π-interactions, and hydrophobic effects.

The term of art "block copolymer" refers to a copolymer having an arrangement of blocks that are linked via covalent bonds, where each type of block are chemically distinct polymers that form the repeat units of the block copolymer. "Block copolymers" can self-assemble from the constituent blocks. "Block copolymers" can have many topologies. For example, a "block copolymer" can be diblock (e.g. AB or BA), triblock (e.g. ABA, BAB). Block copolymers can be linear or branched. "Block copolymers" can be segmented (e.g. those composed of many alternating small blocks of two or more different types of repeating unit), graft, comb, or brush (e.g. those composed of one long main chain of one repeating unit and several smaller blocks of a second repeating unit branching off of the polymer backbone), or radial or star (e.g. those composed of several arms branching from a central attachment point each terminated with an end-block).

As used herein, copolymer generally refers to a single polymeric material that is composed of two or more different monomers. The copolymer can be of any form, such as random, block, graft, etc. The copolymers can have any end-group, including capped or acid end groups. Copolymers include, but are not necessarily limited to, those including 1, 2, 3, 4, or more different monomers.

The term "molecular weight", as used herein, can generally refer to the mass or average mass of a material. If a polymer or oligomer, the molecular weight can refer to the relative average chain length or relative chain mass of the bulk polymer. In practice, the molecular weight of polymers and oligomers can be estimated or characterized in various ways including gel permeation chromatography (GPC) or capillary viscometry. GPC molecular weights are reported as the weight-average molecular weight (Mw) as opposed to the number-average molecular weight (Mn). Capillary viscometry provides estimates of molecular weight as the inherent viscosity determined from a dilute polymer solution using a particular set of concentration, temperature, and solvent conditions.

As used herein, the terms "optional" or "optionally" means that the subsequently described event or circumstance can or cannot occur, and that the description includes instances where said event or circumstance occurs and instances where it does not.

As used herein, "polymer" refers to molecules made up of monomers repeat units linked together. "Polymers" are understood to include, but are not limited to, homopolymers, copolymers, such as for example, block, graft, random and alternating copolymers, terpolymers, etc. and blends and modifications thereof. "A polymer" can be can be a three-dimensional network (e.g. the repeat units are linked together left and right, front and back, up and down), a two-dimensional network (e.g. the repeat units are linked together left, right, up, and down in a sheet form), or a one-dimensional network (e.g. the repeat units are linked left and right to form a chain). "Polymers" can be composed, natural monomers or synthetic monomers and combinations thereof. The polymers can be biologic (e.g. the monomers are biologically important (e.g. an amino acid), natural, or synthetic.

As used herein, "reactive side chain" refers to the pendant group of a monomer or monomeric unit within a polymer, which contains an organic functional group that reacts with another organic functional group to form a covalent bond.

As used herein, "surface," in the context herein, refers to a boundary of a product. The surface can be an interior surface (e.g. the interior boundary of a hollow product), or an exterior or outer boundary or a product. Generally, the surface of a product corresponds to the idealized surface of a three dimensional solid that is topological homeomorphic with the product. The surface can be an exterior surface or an interior surface. An exterior surface forms the outermost layer of a product or device. An interior surface surrounds an inner cavity of a product or device, such as the inner cavity of a tube. As an example, both the outside surface of a tube and the inside surface of a tube are part of the surface of the tube. However, internal surfaces of the product that are not in topological communication with the exterior surface, such as a tube with closed ends, can be excluded as the surface of a product. In some embodiments, an exterior surface of the product is chemically modified, e.g., a surface that can contact an immune system component. In some embodiments, where the product is porous or has holes in its mean (idealized or surface), the internal faces of passages and holes are not considered part of the surface of the product if its opening on the mean surface of the product is less than 1 μm.

As used herein, "substantial" and "substantially," specify an amount of between 95% and 100%, inclusive, between 96% and 100%, inclusive, between 97% and 100%, inclusive, between 98% 100%, inclusive, or between 99% 100%, inclusive.

As used herein, "substantially free" can mean an object species is present at non-detectable or trace levels so as not to interfere with the properties of a composition or process.

As used herein, the terms "weight percent," "wt %," and "wt. %," which can be used interchangeably, indicate the percent by weight of a given component based on the total weight of a composition of which it is a component, unless otherwise specified. That is, unless otherwise specified, all wt % values are based on the total weight of the composition. It should be understood that the sum of wt % values for all components in a disclosed composition or formulation are equal to 100. Alternatively, if the wt % value is based on the total weight of a subset of components in a composition, it should be understood that the sum of wt % values the specified components in the disclosed composition or formulation are equal to 100.

As used herein, "microfeature" refers to a physical feature or aspect of a structure that is something smaller than the entire structure whose largest dimension is about 1000 microns or less. Microfeatures can generally range in size from about 10 μm to about 1000 microns. In some aspects the microfeature can range in size from about 20 μm to about 1000 microns.

DISCUSSION

The direct piezoelectric constant correlates the electric displacement of a material with an applied stress (Ferren, R. A. Advances in polymeric piezoelectric transducers. Nature 350:26-27 (1991), Anderson, J. C. & Eriksson, C. Piezoelectric properties of dry and wet bone. Nature 227:491-492 (1970), Priya, S. & Nahm, S. Lead-free Piezoelectrics (Springer, New York, 2011)). Owing to their ability to convert mechanical to electrical energy and vice versa, piezoelectric materials have widespread applications in pressure sensing (Li, F. et al. Ultrahigh piezoelectricity in ferroelectric ceramics by design. Nat. Mater. 17, 349-354 (2018) and Guerin, S. et al. Control of piezoelectricity in amino acids by supramolecular packing. Nat. Mater. 17:180-186 (2018)), ultrasonic sensing (Egusa, S. et al. Multimaterial piezoelectric fibres. Nat. Mater. 9:643-648 (2010) and Lu, X., Qu, H. & Skorobogatiy, M. Piezoelectric micro- and nanostructured fibers fabricated from thermoplastic nanocomposites using a fiber drawing technique: comparative study and potential applications. ACS Nano 11:2103-2114 (2017)), actuation (Masmanidis, S. C. et al. Multifunctional nanomechanical systems via tunably coupled piezoelectric actuation. Science 317, 780-783 (2007) and Wang, X. et al. Subatomic deformation driven by vertical piezoelectricity from CdS ultrathin films. Sci. Adv. 2, e1600209 (2016)) and energy harvesting (Ganeshkumar, R., Cheah, C. W., Xu, R., Kim, S.-G. & Zhao, R. A high output voltage flexible piezoelectric nanogenerator using porous lead-free $KNbO_3$ nanofibers. Appl. Phys. Lett. 111, 013905 (2017) and Gafforelli, G., Corigliano, A., Xu, R. & Kim, S.-G. Experimental verification of a bridge-shaped, nonlinear vibration energy harvester. Appl. Phys. Lett. 105, 203901 (2014)). The piezoelectric charge constants of bulk piezoelectric ceramics, polymer-piezoelectric composites and their respective foams are dictated by their intrinsic crystallographic structures and compositions (Dagdeviren, C. et al. Conformal piezoelectric systems for clinical and experimental characterization of soft tissue biomechanics. Nat. Mater. 14:728-736 (2015)), resulting in common coupling modes of operation (Grupp, D. E. & Goldman, A. M. Giant piezoelectric effect in strontium titanate at cryogenic temperatures. Science 276, 392-394 (1997)). Additionally, their intrinsic microstructures are strongly coupled with other physical properties, including mass densities and mechanical properties (Espinosa, H. D., Bernal, R. A. & Minary-Jolandan, M. A review of mechanical and electromechanical properties of piezoelectric nanowires. Adv. Mater. 24, 4656-4675 (2012)). Chemical modifications such as doping (Laurenti, M. et al. Nanobranched ZnO Structure: p-Type doping induces piezoelectric voltage generation and ferroelectric-photovoltaic effect. Adv Mater 27, 4218-4223 (2015) and Shin, S. H. et al. Lithium-doped zinc oxide nanowires-polymer composite for high performance flexible piezoelectric nanogenerator. ACS Nano 8, 10844-10850 (2014)) have been introduced to change the piezoelectric constants in certain directions by altering the crystallographic structures, but their design space is restricted by the limited set of doping agents (Harris, D. T., et al. Microstructure and dielectric properties with CuO additions to liquid phase sintered $BaTiO_3$ thin films. J. Mater. Res. 31, 1018-1026 (2016)). It also comes at the cost of other coupled physical properties such as mechanical flexibility and sensitivity (Nag, S. K. & Agrawal, D. C. Piezoelectric and mechanical-properties of ceria-doped lead zirconate titanate ceramics. J. Mater. Sci. 27, 4125-4130 (1992) and Manna, S., et al. Tuning the piezoelectric and mechanical properties of the AlN system via alloying with YN and BN. J. Appl. Phys. 122, 105101 (2017)). Casting and templating techniques have been used to produce piezoelectric foams (McCall, W. R., Kim, K., Heath, C., La Pierre, G. & Sirbuly, D. J. Piezoelectric nanoparticle-polymer composite foams. ACS Appl. Mater. Inter. 6, 19504-19509 (2014) and Smay, J. E., Tuttle, B. & III, J. C. Piezoelectric and Acoustic Materials for Transducer Applications 305-318 (Springer, Boston, 2008)) that showcase the potential for reduced mass densities and improved hydrostatic figures of merit, but their piezoelectric coefficients, described by a square foam model (Challagulla, K. S. & Venkatesh, T. A. Electromechanical response of piezoelectric foams. Acta Mater. 60, 2111-2127 (2012)) are largely limited by the intrinsic crystalline orientation and occupy only a narrow area within piezoelectric anisotropy space. As such there exists a need for piezoelectric structures with a greater piezoelectric space.

With the limitation of current piezoelectric materials in mind, described herein are aspects of 3D piezoelectric structures and systems thereof that can be composed of a 3D periodic microlattice composed of a piezoelectric composite material, where the 3D periodic microlattice includes a plurality of interconnected 3D node units capable of generating a piezoelectric response upon application of a stress to the 3D periodic microlattice, and wherein the plurality of interconnected 3D node units form a tailored piezoelectric tensor space. Also described herein are 3D piezoelectric structures that can include multiple 3D periodic microlattices, wherein one or more of the 3D periodic microlattices are different from each other in at least one aspect and generate a different piezoelectric response up application of a stress to the 3D piezoelectric structure. Also described herein are aspects of systems that can include one or more of the 3D piezoelectric structures described herein. In some aspects, the systems can include electrodes, electric current generators, output sensors, processing units, computer readable memory, and the like that can be coupled to the 3D structure(s) within the system. Further, these structures can be made from materials that are suitable for additive manufacturing methods, which allows increased flexibility in architecture design and tunability. Thus, also described herein are additive manufacturing methods for generating the 3D piezoelectric structures described herein.

The 3D structures described herein can occupy a vast piezoelectric anisotropy design space enabling arbitrary selection of the coupled operational mode, which cannot be achieved by current piezoelectric materials. The 3D structures described herein, upon polarization, can have piezoelectric responses in any direction, which can be selectively reversed, suppressed, and/or enhanced, which can allow a distinct voltage response signature to be obtained in response to an applied stress. The 3D structures described and demonstrated herein can provide a platform for rationally designed electromechanical coupling materials for smart infrastructures for use in a variety of applications. Other compositions, compounds, methods, features, and advantages of the present disclosure will be or become apparent to one having ordinary skill in the art upon examination of the following drawings, detailed description, and examples. It is intended that all such additional compositions, compounds, methods, features, and advantages be included within this description, and be within the scope of the present disclosure.

3D Piezoelectric Structures and Systems Thereof

3D Piezoelectric Structures

Described herein are aspects of a three-dimensional (3D) piezoelectric structure (see e.g. FIGS. 19A-19D, 35, and 36) that can have a 3D periodic microlattice (see e.g. FIGS. 2D, 3A-3C, and 37). The 3D periodic microlattice can be composed of a piezoelectric composite material. The 3D periodic microlattice can be rationally designed to contain and be formed of a plurality of interconnected 3D node units (see e.g. FIGS. 1A-1I, 6A-6G, 7A-9, and 30A-30B) that form a tailored piezoelectric tensor space and are capable of generating a piezoelectric response when a stress is applied to the 3D periodic lattice.

The periodic 3D microlattice can have periodic structural design that can result from the architecture of the 3D node units. The 3D node units can be composed of struts that are arranged in 3D space based on the desired piezoelectric effect that can be tuned based on rational design of the 3D nodes as described elsewhere herein. One or more struts of the 3D nodes can be connected to one or more struts of one or more other 3D nodes in the 3D microlattice and thus can form interconnected 3D node units. The 3D nodes can be tessellated in two and/or three dimensions to form the periodic structural architecture of the periodic 3D microlattice. Tessellation can be regular, semiregular, or demiregular. The arrangement and architecture of the 3D node units collectively can form a tailored piezoelectric space. By "tailored" it is meant that the space is rationally designed by controlling the configuration of the 3D microlattice through rational design of the 3D node units to achieve a specific piezoelectric space with a desired and predetermined piezoelectric response. In aspects, the desired use or application of the 3D piezoelectric structure can drive rational design and thus the specific configuration of the tailored piezoelectric space.

The 3D periodic lattice can generate a piezoelectric response when a stress is applied to the 3D periodic lattice. The stress can be mechanical (e.g. a force (e.g. strain or tension)) or electrical (e.g. an electric current applied to the 3D piezoelectric lattice). A corresponding piezoelectric response can be generated in response to the stress. Where the stress is mechanical, the response can be electrical. Where the stress is electrical, the response can be mechanical. The 3D piezoelectric structures herein can be flexible. The degree of flexibility can be determined by the specific composition of the piezoelectric composite material as well as the particular configuration of the 3D lattice. Generally, a piezoelectric composite material containing more polymeric components can be more flexible than piezoelectric component containing a higher amount of a non-polymeric piezoelectric component as discussed elsewhere herein. Further, the differences in the structural of the 3D lattice can impact its flexibility. Different 3D lattice structures can have different flexibility even if made from the same piezoelectric composite material. Due to this flexibility, in aspects, the 3D piezoelectric structure can be configured to respond to both mechanical and electrical stresses simultaneously.

The piezoelectric composite material can be composed of a plurality of functionalized piezoelectric particles cross-linked to a polymer matrix. In aspects, the functionalized piezoelectric particles can be substantially uniformly distributed throughout the polymer matrix. In aspects, the functionalized piezoelectric particles can be randomly distributed throughout the polymer matrix. In aspects, the functionalized piezoelectric particles can be non-uniformly distributed throughout the polymer matrix. In aspects, the piezoelectric composite material can be substantially non-porous. In aspects, the functionalized particles can be non-randomly distributed throughout the polymer matrix. In some aspects, one type of functionalized piezoelectric particles are present in the polymer matrix. In some aspects, more than one type of functionalized piezoelectric particles are present in the polymer matrix. In this context, different types of functionalized piezoelectric particles are those that differ in at least one characteristic (particle size, material, functionalization moiety, and the like). The piezoelectric composite material can be flexible.

The wt % of the functionalized piezoelectric particles contained in the polymer matrix can range from about 10 wt % to about 95 wt %. In aspects the wt % of the functionalized piezoelectric particles contained in the polymer matrix can be about 10 wt %, 10.5 wt %, 11 wt %, 11.5 wt %, 12 wt %, 12.5 wt %, 13 wt %, 13.5 wt %, 14 wt %, 14.5 wt %, 15 wt %, 15.5 wt %, 16 wt %, 16.5 wt %, 17 wt %, 17.5 wt %, 18 wt %, 18.5 wt %, 19 wt %, 19.5 wt %, 20 wt %, 20.5 wt %, 21 wt %, 21.5 wt %, 22 wt %, 22.5 wt %, 23 wt %, 23.5 wt %, 24 wt %, 24.5 wt %, 25 wt %, 25.5 wt %, 26 wt %, 26.5 wt %, 27 wt %, 27.5 wt %, 28 wt %, 28.5 wt %, 29 wt %, 29.5 wt %, 30 wt %, 30.5 wt %, 31 wt %, 31.5 wt %, 32 wt %, 32.5 wt %, 33 wt %, 33.5 wt %, 34 wt %, 34.5 wt %, 35 wt %, 35.5 wt %, 36 wt %, 36.5 wt %, 37 wt %, 37.5 wt %, 38 wt %, 38.5 wt %, 39 wt %, 39.5 wt %, 40 wt %, 40.5 wt %, 41 wt %, 41.5 wt %, 42 wt %, 42.5 wt %, 43 wt %, 43.5 wt %, 44 wt %, 44.5 wt %, 45 wt %, 45.5 wt %, 46 wt %, 46.5 wt %, 47 wt %, 47.5 wt %, 48 wt %, 48.5 wt %, 49 wt %, 49.5 wt %, 50 wt %, 50.5 wt %, 51 wt %, 51.5 wt %, 52 wt %, 52.5 wt %, 53 wt %, 53.5 wt %, 54 wt %, 54.5 wt %, 55 wt %, 55.5 wt %, 56 wt %, 56.5 wt %, 57 wt %, 57.5 wt %, 58 wt %, 58.5 wt %, 59 wt %, 59.5 wt %, 60 wt %, 60.5 wt %, 61 wt %, 61.5 wt %, 62 wt %, 62.5 wt %, 63 wt %, 63.5 wt %, 64 wt %, 64.5 wt %, 65 wt %, 65.5 wt %, 66 wt %, 66.5 wt %, 67 wt %, 67.5 wt %, 68 wt %, 68.5 wt %, 69 wt %, 69.5 wt %, 70 wt %, 70.5 wt %, 71 wt %, 71.5 wt %, 72 wt %, 72.5 wt %, 73 wt %, 73.5 wt %, 74 wt %, 74.5 wt %, 75 wt %, 75.5 wt %, 76 wt %, 76.5 wt %, 77 wt %, 77.5 wt %, 78 wt %, 78.5 wt %, 79 wt %, 79.5 wt %, 80 wt %, 80.5 wt %, 81 wt %, 81.5 wt %, 82 wt %, 82.5 wt %, 83 wt %, 83.5 wt %, 84 wt %, 84.5 wt %, 85 wt %, 85.5 wt %, 86 wt %, 86.5 wt %, 87 wt %, 87.5 wt %, 88 wt %, 88.5 wt %, 89 wt %, 89.5 wt %, 90 wt %, 90.5 wt %, 91 wt %, 91.5 wt %, 92 wt %, 92.5 wt %, 93 wt %, 93.5 wt %, 94 wt %, 94.5 wt %, or about 95 wt %. In aspects the wt % of the functionalized piezoelectric particles contained in the polymer matrix can range from about 10-95 wt %, 10-90 wt %, 10-85 wt %, 10-75 wt %, 10-70 wt %, 10-65 wt %, 10-60 wt %, 10-55 wt %, 10-50 wt %, 10-45 wt %, 10-40 wt %, 10-35 wt %, 10-30 wt %, 10-25 wt %, 10-20 wt %, 10-15 wt %. In aspects the wt % of the functionalized piezoelectric particles contained in the polymer matrix can range from about 20-95 wt %, 20-90 wt %, 20-85 wt %, 20-75 wt %, 20-70 wt %, 20-65 wt %, 20-60 wt %, 20-55 wt %, 20-50 wt %, 20-45 wt %, 20-40 wt %, 20-35 wt %, 20-30 wt %, 20-25 wt %. In aspects the wt % of the functionalized piezoelectric particles contained in the polymer matrix can range from about 30-95 wt %, 30-90 wt %, 30-85 wt %, 30-75 wt %, 30-70 wt %, 30-65 wt %, 30-60 wt %, 30-55 wt %, 30-50 wt %, 30-45 wt %, 30-40 wt %, or 30-35 wt %. In aspects the wt % of the functionalized piezoelectric particles contained in the polymer matrix can range from about 40-95 wt %, 40-90 wt %, 40-85 wt %, 40-75 wt %, 40-70 wt %, 40-65 wt %, 40-60 wt %, 40-55 wt %, 40-50 wt %, 40-45 wt %. In aspects the wt % of the functionalized piezoelectric particles contained in the polymer matrix can range from about 50-95 wt %, 50-90 wt %, 50-85 wt %, 50-75 wt %, 50-70 wt %, 50-65 wt %, 50-60 wt %, or 50-55 wt %. In aspects the wt % of the functionalized piezoelectric particles contained in the polymer matrix can range from about 60-95 wt %, 60-90 wt %, 60-85 wt %, 60-75 wt %, 60-70 wt %, or 60-65 wt %. In aspects the wt % of the functionalized piezoelectric particles contained in the polymer matrix can range from about 70-95 wt %, 70-90 wt %, 70-85 wt %, 70-75 wt %. In aspects the wt % of the functionalized piezoelectric particles contained in the polymer matrix can range from about 80-95 wt %, 80-90 wt %, or 80-85 wt %. In aspects the wt % of the functionalized piezoelectric particles contained in the polymer matrix can range from about 80-95 wt %, 80-90 wt %, or 80-85 wt %. In aspects the wt % of the functionalized piezoelectric particles contained in the polymer matrix can range from about 85-95 wt %, 80-95 wt %, 85-90 wt % or 80-90 wt %. In aspects the wt % of the functionalized piezoelectric particles contained in the polymer matrix can be about 88% wt % (or about 50 vol %).

The polymer matrix can be formed form any suitable polymer. Suitable polymers can be any polymer that can polymerize or crosslink with with a functional moiety on the functionalized piezoelectric particles. In aspects, the suitable polymer is one that is photosensitive (e.g. can be cured or polymerized via exposure to light). In aspects, the suitable polymer can be composed of photosensitive monomeric units (or monomers). The polymer can be any polymer suitable for 3D printing. In aspects, the polymer matrix can include a polymer selected from the group of: polydimethylsiloxane (PDMS), poly(ethylene glycol) diacrylate, polyvinylidene fluoride (PVDF), hexanediol diacrylate (HDDA) a thermoset polymer, a thermoplastic polymer, and combinations thereof.

Figure 2A:
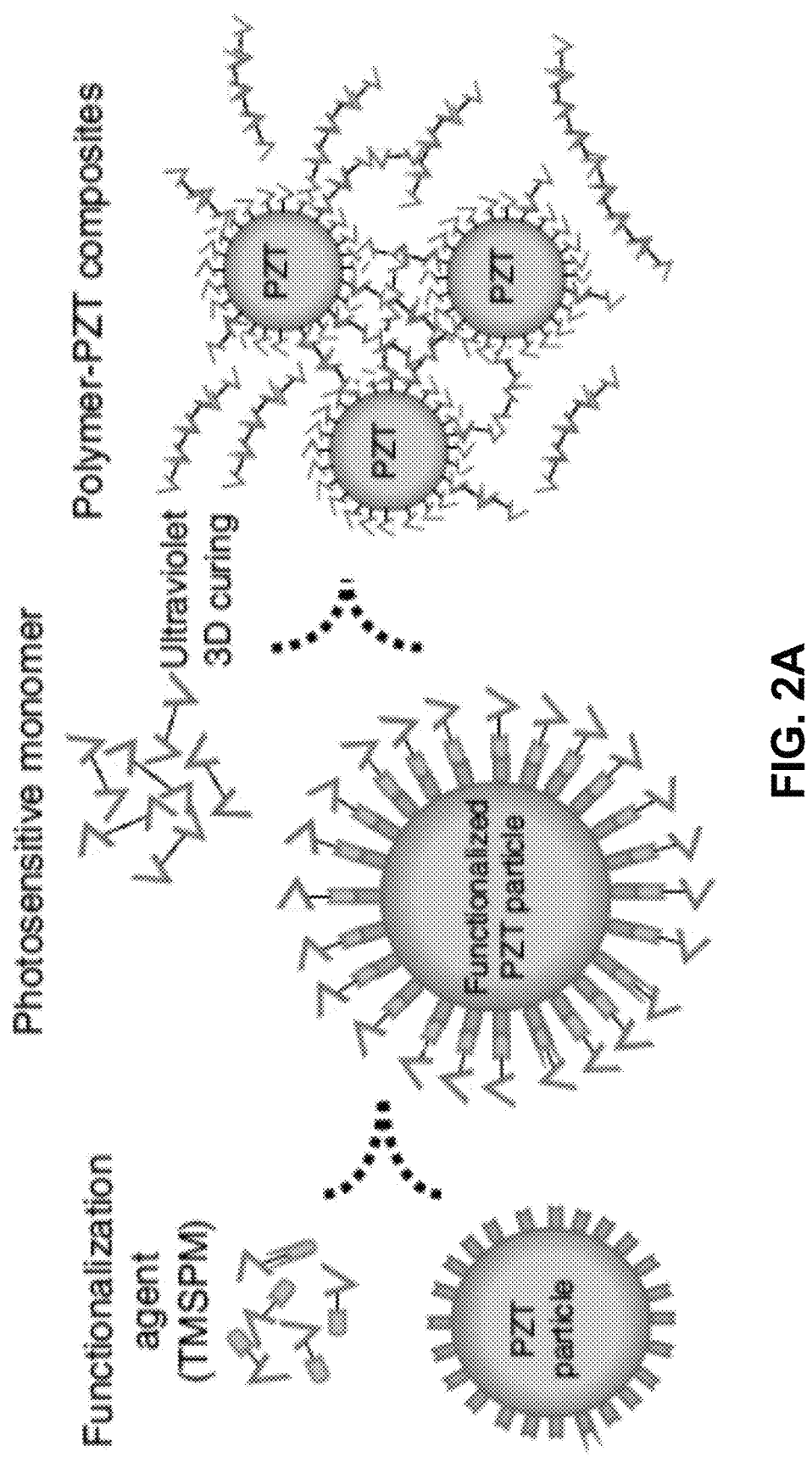
FIGS. 2A-2D show surface functionalization of PZT with photosensitive monomers and 3D printing of piezoelectric metamaterials with complex micro-architectures.

The functionalized piezoelectric particles can be composed of a piezoelectric particle and a functionalization moiety (see e.g. FIG. 2A). It will be appreciated that the term "particle," as used herein, can include any particulate, including substantially round particles, cubes, fibers and the like. The functionalization moiety can be covalently attached to the piezoelectric particle. The functionalization moiety can facilitate inclusion of the piezoelectric particle into the polymer matrix by polymerizing or crosslinking with monomers of the polymer matrix during polymerization or curing (see e.g. FIG. 2A). The piezoelectric particle can be selected from the group of, but not limited to: quartz, berlinite ($AlPO_4$), sodium potassium tartrate tetrahydrate, topaz, a tourmaline-group mineral, ($PbTiO_3$), langasite ($La_3Ga_5SiO_{14}$), gallium orthophosphate ($GaPO_4$), lithium niobite ($LiNbO_3$), lithium tantalite ($LiTaO_3$), barium titanate ($BaTiO_3$), lead zirconate titanate (PZT), potassium niobite ($KNbO_3$), sodium tungstate ($Na_2WO_3$), $Ba_2NaNb_5O_5$, $Pb_2KNb_5O_{15}$, sodium potassium niobite ($(K,Na)NbO_3$), bismuth ferrite ($BiFeO_3$), sodium niobite ($NaNbO_3$), bismuth titanate ($Bi_4Ti_3O_{12}$), sodium bismuth titanate ($NaBi(TiO_3)_2$), Zinc oxide (ZnO), niobite-lead titanate (PMN-PT), and combinations thereof. The functionalization moiety can be any moiety or group that can form covalent linkages between nanoparticles and a polymer matrix. In aspects, the functionalization moiety can be a moiety capable of forming hydroxyl groups on the nanoparticle surfaces to form covalent linkage with the polymer matrix. In aspects, the functionalization moiety can be selected from the group of, but not limited to: a moiety comprising an acrylate containing group, trimethoxysilylpropylmethacrylate (TMSPM), trimethoxysilylpropyl acrylate (TMSPA), and combinations thereof.

The diameter of the piezoelectric particle can range from about 1 nm to about 1,000 µm. In aspects, the diameter of the functionalized piezoelectric particle can range from about 1 nm to about 1,000 µm.

In some aspects, the 3D piezoelectric structure only contains one type of 3D microlattice. However, it will be appreciated that the 3D piezoelectric structure can be composed of multiple types of 3D microlattices that are interconnected to form a single 3D piezoelectric structure. Thus, also described herein are 3D piezoelectric structures comprising: two or more interconnected three dimensional (3D) piezoelectric structures as previously described where at least two of the 3D piezoelectric structures have different 3D microlattices and wherein the at least two 3D piezoelectric structures having different 3D microlattices produce a different piezoelectric response upon application of a stress to the two or more interconnected 3D piezoelectric structures. By altering the inclusion and placement of different 3D microlattices, the performance and functionality of the 3D piezoelectric structure can be modified. In this way the 3D piezoelectric structure can have another level of tuneability to produce a desired functionality based on the desired piezoelectric response. FIGS. 5A-5D and 38 can demonstrate aspects of a 3D piezoelectric structure having component 3D piezoelectric structural units where at least two of the component 3D piezoelectric structural units have different microlattices (e.g. the 3D piezoelectric structure can include different 3D microlattices as previously described).

In further aspects, any of the 3D piezoelectric structures described herein can be combined as layers or otherwise connected units to form a multi-structure system. They can be coupled such that they can be operated collectively in a desired way to achieve a particular desired and functionality. See e.g. FIG. 5A.

The 3D piezoelectric structures can be polled during its manufacture or by contact polling after construction.

Rational Design of the 3D Piezoelectric Structure

Also described herein is a strategy for rational design of 3D piezoelectric structures described herein that can allow generation of 3D piezoelectric structures across the full design space of piezoelectric coefficients. It will be appreciated that the strategy can be forward, meaning that a structure can be designed and suitable applications for that particular structure can be determined post generation, or backward, meaning that a specific application or functionality of the 3D piezoelectric structure can be determined and the structure can be modeled and ultimately generated based on that modeling (which may be iterative, but not undue) to achieve that desired functionality. One of ordinary skill in the art will appreciate modification of the design strategy steps discussed herein to implement both forward and backward design approaches to develop 3D piezoelectric structures with desired architectures and functionalities despite these structures not being explicitly set forth herein. The rational design strategy is also discussed in the Example Section herein and e.g. FIGS. 1A-1I, 5A-5D, 6A-6G, 7A-7B, 8A-8B, 9, FIGS. 10A-10F, 28, 29, 30A-30B, and 33.

In aspects, the rational design strategy involves analyzing configurations of projection patterns from a 3D node unit. Evolutions of the projection patterns give rise to diverse electric displacement maps, from which the piezoelectric coefficient tensor space $d_{3M}$ (M=1-3) can be designed. In the design models, intersecting structs of a 3D node can be represented as vectors originating from the node. The projection patterns are then built where the 2D projection of the vectors are projected onto three orthogonal planes through the global 1-2-3 coordinate system of the 3D piezoelectric structure. Electric displacement maps of the 3D nodes within the 3D piezoelectric structure can be generated based on the projection patterns and the distribution of the piezoelectric tensor space. The electric displacement maps can then be used to generate a 3D node unit which then can be used to control the specific architecture of the 3D microlattice.

The strut projection patterns can be altered (e.g. by changing the relative orientation, specific positioning of the struts, number of node connections, by superpositioning nodes, changing the coupling of piezoelectric coefficient, etc.). Further aspects of the rational design strategy can be appreciated, e.g. in the Example section set forth herein.

Systems

The 3D piezoelectric structures can be included in a system that contains other components outside of the 3D piezoelectric structure(s). Other components can include, but are not limited to, electrodes, electric current generators, output sensors, computer readable memory, processors capable of accessing and/or controlling the computer readable memory, a server, an actuator, a housing substrate, an energy storage device, receivers, etc. The additional component(s) can be directly or indirectly coupled to one or more 3D micro lattices present in the 3D piezoelectric structure.

Described herein are aspects of a system that can be composed of one or more three dimensional (3D) piezoelectric structures as described elsewhere herein and on or more additional components, where the one or more additional components are coupled to at least one of the one or more 3D piezoelectric structures. In aspects, the additional component can be an electric current generator. In aspects, the additional component can be an output sensor. The output sensor can be configured to receive an output signal from the one or more 3D piezoelectric structures. In aspects the output signal is an electrical signal. In some aspects, the output signal is a mechanical force.

Methods of Making the 3D Piezoelectric Structures

Described herein are methods of making the 3D piezoelectric structures described herein. In aspects, the 3D piezoelectric structures described herein can be generated by an additive manufacturing technique. In some aspects, a light-based additive manufacturing technique is used. In some aspects, the 3D structure can be formed using an additive manufacturing process. Any suitable multi-material additive manufacturing process can be used to form the 3D structure ranging from fused deposition modeling (FDM) also known as fused filament fabrication (FFF), to light-based additive manufacturing processes. In some aspects, the additive manufacturing process is a light-based additive manufacturing process. Light-based additive manufacturing processes are those that form solid forms by polymers from their respective constituent units (monomers or polymers) using light energy. The constituent units can be photomonomers and/or photopolymers, which are monomers and polymers that are light-reactive or light-activated (e.g. they can polymerize upon being contacted with light).

FFF based techniques generally rely on extruding feedstock filaments composed from printhead nozzles, heating the feedstock filaments to facilitate deposition of the material into layers, depositing the melted filaments into layers to form the 3D object, and allowing the material to cool and harden to form the 3D object. Many variations of FFF techniques, including multi-material printing techniques, are known in the art. See e.g. Ligon et al. 2017 ("Polymers for 3D Printing and Customized Additive Manufacturing" Chem. Rev. 10212-10281). Light-based additive manufacturing techniques can fall into various categories of additive manufacturing types. Suitable light-based additive manufacturing techniques can include, but are not limited to, selective laser sintering (SLS), Vat-photopolymerization processes (e.g. stereolithography (SLA) and digital light processing techniques (DLP)), and material jetting. In Vat-polymerization processes, the 3D object is built up on a build platform that is submerged in a vat of liquid, unpolymerized resin. Light is projected into the resin where the next layer of the 3D object is to be formed and cures the resin in that area to form the layer. The process is repeated as necessary to form the object. There are many variations on Vat-polymerization processes including SLA and DLP. SLA forms layers one part of the layer at a time. In typical DLP, unlike SLS, a single flash of projected light is used to create an entire layer at once. In SLS, a laser light is focused on material powder to sinter them and form them into cohesive layers. In material jetting, droplets of liquid resin, plastic, or wax are deposited on a build platform to create layers of an object. Solidification can occur by cooling or by exposure to light. Other suitable 3D printing techniques will be appreciated by one of ordinary skill in the art in view of this disclosure, see e.g. Ligon et al. 2017 ("Polymers for 3D Printing and Customized Additive Manufacturing" Chem. Rev. 10212-10281). One example of a light-based additive manufacturing method that can be used is set forth in Pat. App. Pub. No. WO 2018/013829, which is incorporated by reference as if expressed herein in its entirety.

In aspects, the method of generating a 3D piezoelectric structure can include the steps of: a) coating a substrate with functionalized piezoelectric particles; b) exposing the functionalized piezoelectric particles to a photosensitive monomeric polymer resin, wherein the functionalized piezoelectric particle comprises a piezoelectric material and a functionalization moiety comprising a monomeric polymer, wherein the functionalization moiety is covalently bonded to the piezoelectric particle; c) exposing the functionalized piezoelectric particles to light to polymerize the photosensitive monomeric polymer resin and the functionalization moiety of the piezoelectric particle, wherein the exposure to light is controlled to form a layer a 3D-microlattice of the 3D piezoelectric structure; d) coating the layer of the 3D-microlattice and substrate with functionalized piezoelectric particles; and e) repeating steps a) to d) as many times as desired to form the 3D-microlattice. See e.g. FIGS. 2C, 14A-14C and 15A.

In aspects, the method of generating the 3D piezoelectric structure can include the step of forming the functionalized piezoelectric particle. Forming the functionalized piezoelectric particles can include functionalizing a particle that is composed of a piezoelectric material with the functionalization moiety by covalently bonding the functionalization moiety to the particle to form the functionalized piezoelectric particle. See e.g. FIG. 2A.

In aspects, as disused with respect to FIGS. 14A-14C and 15A in the Example Section below, a light-based additive manufacturing method can be utilized that involves controlling the uncured resin/functionalized piezoelectric material thickness between layers. This can be accomplished using a blade that levels the printing material prior to exposure to light. Advantages to this are discussed elsewhere herein.

Methods of Using the 3D Piezoelectric Structures

Also described herein are methods of using the 3D piezoelectric structures. In aspects, the method can include applying a stress to a three dimensional (3D) piezoelectric structure described herein and generating a piezoelectric response to the applied stress, wherein the piezoelectric response is generated by the 3D piezoelectric structure. In aspects, the piezoelectric response can be a mechanical response. In aspects the piezoelectric response can be an electrical output. In aspects, the response can be measured, monitored, stored, or otherwise utilized to achieve a desired function.

The 3D structures described herein have wide applicability to generate smart devices and structures. They can be used to generate structures that are themselves sensors, actuators, and/or energy storage devices. They can be used in wearable smart devices and materials, medical devices (implantable and non-implantable), and essentially any desired structural material where integrated functionality is desirable. Further, they can be utilized and integrated as energy storage devices. The methods described herein facilitate designing arbitrary combinations of piezoelectric charge coefficients (d constant), and allow end users to configure and prescribe voltage signals in response to stress coming from different directions.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure. The following examples are put forth so as to provide those of ordinary skill in the art with a complete disclosure and description of how to perform the methods and use the probes disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Example 1

This Example can demonstrate generation of direct piezoelectric responses through rationally designed piezoelectric architectural units that can be manufacture via additive manufacturing of highly sensitive piezo-active lattice materials. Families of three-dimensional (3D) structural node units assembled from parameterized projection patterns can be first designed, which can allow generation of and manipulation of a set of electric displacement maps with a given pressure, thereby achieving full control of piezoelectric constant tensor signatures. These unit cells are then tessellated in three dimensions, which form metamaterial blocks that occupy a vast piezoelectric anisotropy design space. This can allow for arbitrary selection of the coupled operational mode. Upon polarizing the as-fabricated piezoelectric material, it can be demonstrated in this Example that piezoelectric behavior in any direction can be selectively reversed, suppressed, or enhanced and that distinct voltage response signatures can be achieved with applied stress. This Example can demonstrate functionalized lead zirconate titanate (PZT) nanoparticle colloids. These nanoparticles were then covalently bonded with entrapped photo-active monomers. The concentrated piezoelectric colloids were subsequently sculpted into arbitrary 3D form factors through high resolution additive manufacturing. It was observed that building blocks with designed piezoelectric signatures can be assembled into various intelligent infrastructures to achieve a variety of functions, including force magnitude and directionality sensing, impact absorption, self-monitoring, and/or location mapping, without any additional sensing component. The free-form PZT nanocomposite piezoelectric metamaterials demonstrated herein can achieve a high piezoelectric charge constant and voltage constant at low volume fractions and can also simultaneously possess high flexibility. Such characteristics have not been attainable in previous piezoelectric foams or polymers.

Figure 1H:
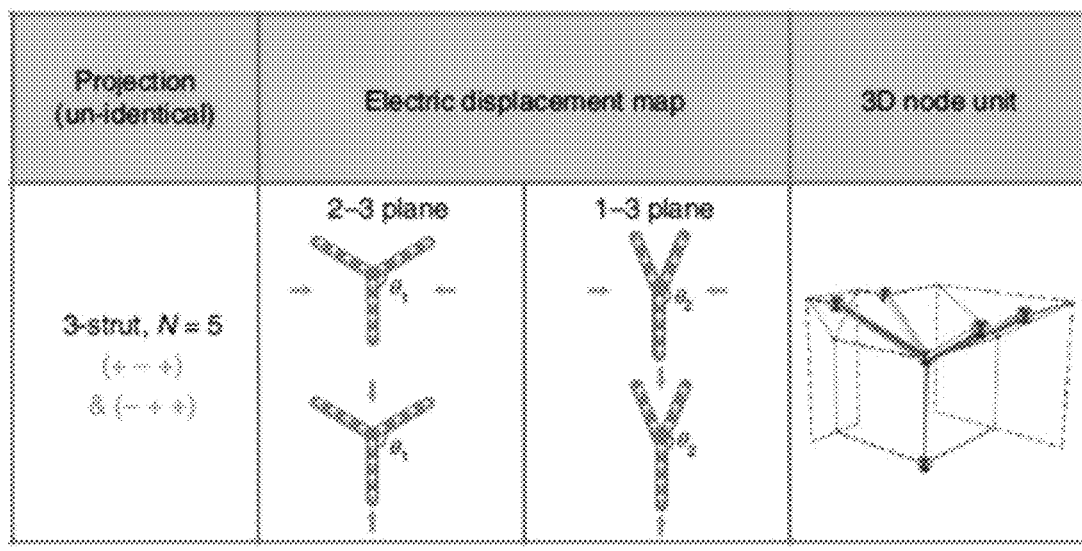
(FIG. 1H) Node unit with dissimilar projection patterns showing decoupled d31, d32. The white arrows in the projection patterns pointing towards the positive or negative 3-direction indicate the positive or negative electric displacement contribution to poling direction 3. Arrows in FIGS. 1A-1H indicate the compression loading along the 1-, 2- or 3-direction.
Figure 1I:
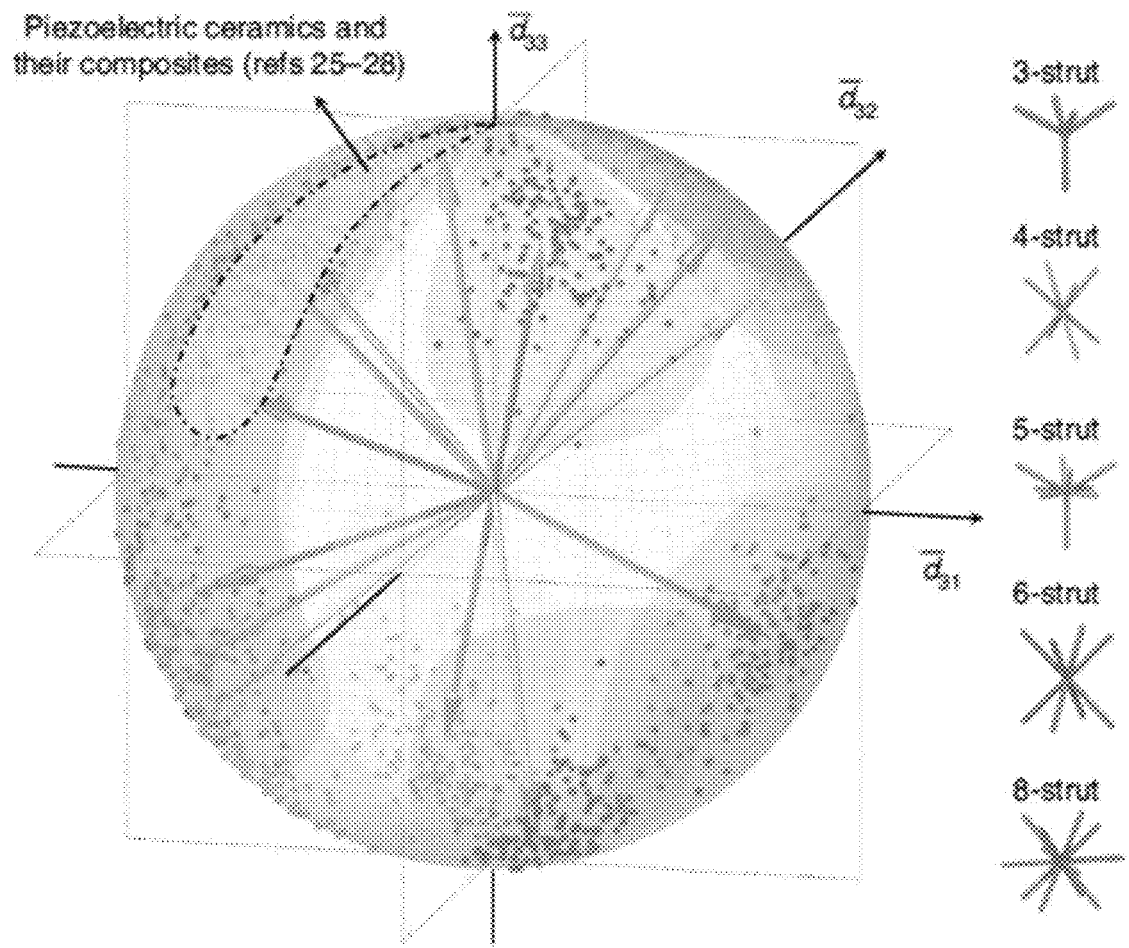
(FIG. 1I) A dimensionless piezoelectric anisotropy design space accommodating different 3D node unit designs with distinct d3M distributions; each d3M is normalized by the length of the vector {d31,d32,d33} and thus d31, d32 and d33 form a right-handed 3D coordinate system. The dimensionless piezoelectric coefficients of their parent monolithic piezoelectric ceramics and their composites are labelled within the dashed region, {− − +} quadrant.

Design of 3D piezoelectric responses. A strategy to realize the full design space of piezoelectric coefficients through the spatial arrangement of piezoelectric ligaments was developed and described herein. The scheme involves analyzing configurations of projection patterns from a 3D node unit classified by connectivity. The evolutions of projection patterns give rise to diverse electric displacement maps (FIGS. 1A-1H) from which the piezoelectric coefficient tensor space d3M (M=1-3) can be designed, going beyond the limitations of the monolithic piezoelectric ceramics, polymers and their composite feedstock whose piezoelectric coefficients are located in the $\{--+\}$ quadrants[1-4] and $\{++-\}$ quad-rants[5,6]. Here the dimensionless piezoelectric tensor space, d3M, is defined by normalizing d3M by the length of the vector $\{d_{31}, d_{32}, d_{33}\}$. To capture the broadest possible design space, the design was started with the minimum number of intersecting microstruts at a node that can be tessellated into 3D periodic lattices. All intersecting struts are represented as vectors originating from the node, that is, Li (i=1-N, where N is the node unit connectivity). In building the projection patterns, lij was defined as the 2D projection of Li onto three orthogonal planes through the global 1-2-3 coordinate system of the 3D piezoelectric cube ((FIG. 1A)

$$Li = \frac{1}{2}\sum\nolimits_{j}^{3} 1_i^j,$$

where j=1, 2 or 3). As an example, a piezoelectric ceramic and its composites was used, which have d3M distributed in the $\{--+\}$ quadrants[25-28], as the base material with which to construct the electric displacement maps. The white arrows pointing upwards or downwards against the 3-direction indicate the positive or negative electric displacement response of the strut along the 3-direction (that is, the poling direction). Configuring the projection patterns in these planes results in diverse electric displacement maps, allowing access to different quad-rants of the d3M property space (described elsewhere herein). A basic 3D node unit containing 3, 4 and 5 intersecting struts on the projection patterns is illustrated in FIGS. 1A-1F. We start with 3D node units with identical 3-strut projection patterns on the 1-3 and 2-3 planes, that is, $d_{31}=d_{32}$ (FIGS. 1A-1B). Configuring the projection pattern by rotating the relative orientations of two of the projected struts ($\theta=\angle 1_1{}^1 1_2{}^1$) redistributes the electric displacement contributions, as indicated by the white arrows reversing direction in the projection pattern (FIGS. 1A-1B). Rotating the projection patterns allows us to inversely reorient the intersecting spatial struts with correlations as calculated in (described elsewhere herein). This results in the d3M tensor shifting from the {+ + +} quadrant to highly anisotropic distribution near the positive $d_{33}$ axis {0 0+} and then to the {− − +} quadrant with negative $d_{31}$ and $d_{32}$ as well as positive $d_{33}$ (FIG. 1I). Further decrease of the relative orientation reverses all values of the d3M to occupy the {− − −} quadrant (FIGS. 30A-30B). Similarly, for a 4-strut or 5-strut projection pattern with two-axis symmetry, decreasing the relative orientation ($\theta=\angle 1_1{}^1 1_2{}^1$) of projected struts results in a change of d3M distribution from the {+ + +} quadrant to the {− − −} quadrant (FIG. 1I) or the {− − +} quadrant owing to the competition of the opposite electric displacement contributions within the struts (FIGS. 1C-1F). The designs can be broadened by increasing the 3D node unit connectivity through superposition (FIG. 1G). Micro-architectures with high nodal connectivity are deformed mainly by compression or tension[7,8]. The $d_{33}$ increases with additional nodal connectivity as compared to lower-connectivity cases in which strain energy from strut bending does not contribute to the electric displacement in the 3-direction.

Moreover, our designs are not restricted to identical projection patterns where d31 and d32 are coupled. 3D node unit designs with dissimilar projection patterns allow independent tuning of $d_{31}$ and $d_{32}$ ('out of 45° plane' distribution of d3M, FIG. 1I, $d_{31} \neq d_{32}$). Dissimilar electric displacement maps were configured by independently varying the relative orientations $\theta_1$ and $\theta_2$ on the 1-3 and 2-3 planes (FIG. 1H, FIGS. 30A-30B). The compression along the 1-direction and 2-direction on the 3D node unit therefore generates different electric displacement maps and results in the decoupling of $d_{31}$ and $d_{32}$ (FIG. 1H).

The $d_{nM}$ of designed units can be computed by collecting the electric displacement from all intersecting strut members Li at equilibrium under applied stress. Such models relate the configuration of the projection patterns lij with the piezoelectric coefficient of interest dnM of the metamaterials (Eq. 47) (see further derivations described in Methods below)

$$d_{nM} = \frac{\sum_{i=1}^{N} \int_{V_i} d_{nm}^i T_{mr}^i \sigma_r^i dV_i}{\sum_{i=1}^{N} \int_{V_i} \delta_{Mm} T_{mr}^i \sigma_r^i dV_i} \quad \text{(Eq. 47)}$$

where $d_{nm}{}^i$ is the piezoelectric coefficient matrix of the base material (n=1, 2, 3, m, M=1-6), $T_{mr}{}^i$ represents the stress-transformation matrix from the local x-y-z coordinate system to the global 1-2-3 coordinate system, $\sigma_r{}^i$ is the stress vector in the local coordinate sys-tem (r=xx,yy,zz,xy,xz,yz), $V_i$ is the volume of the ith strut in the node unit and $\delta Mm$ is the Kronecker delta (see also e.g. Methods below and FIGS. 6A-9). Configuring the projection patterns generate various designs of architectures that occupy different quadrants of the d3M distribution space, as shown in FIG. 1I, where M=1-3. These families of 3D node units constitute a broad 3D piezoelectric constant selection where d3M occupy desired quadrants of the property space, in contrast to the piezo-electric coefficients obtained by piezoelectric square foam models[18] (see also e.g. below and FIGS. 10A-10F). This rich design space creates an enormous palette of novel applications, as demonstrated in later sections.

Figure 2B:
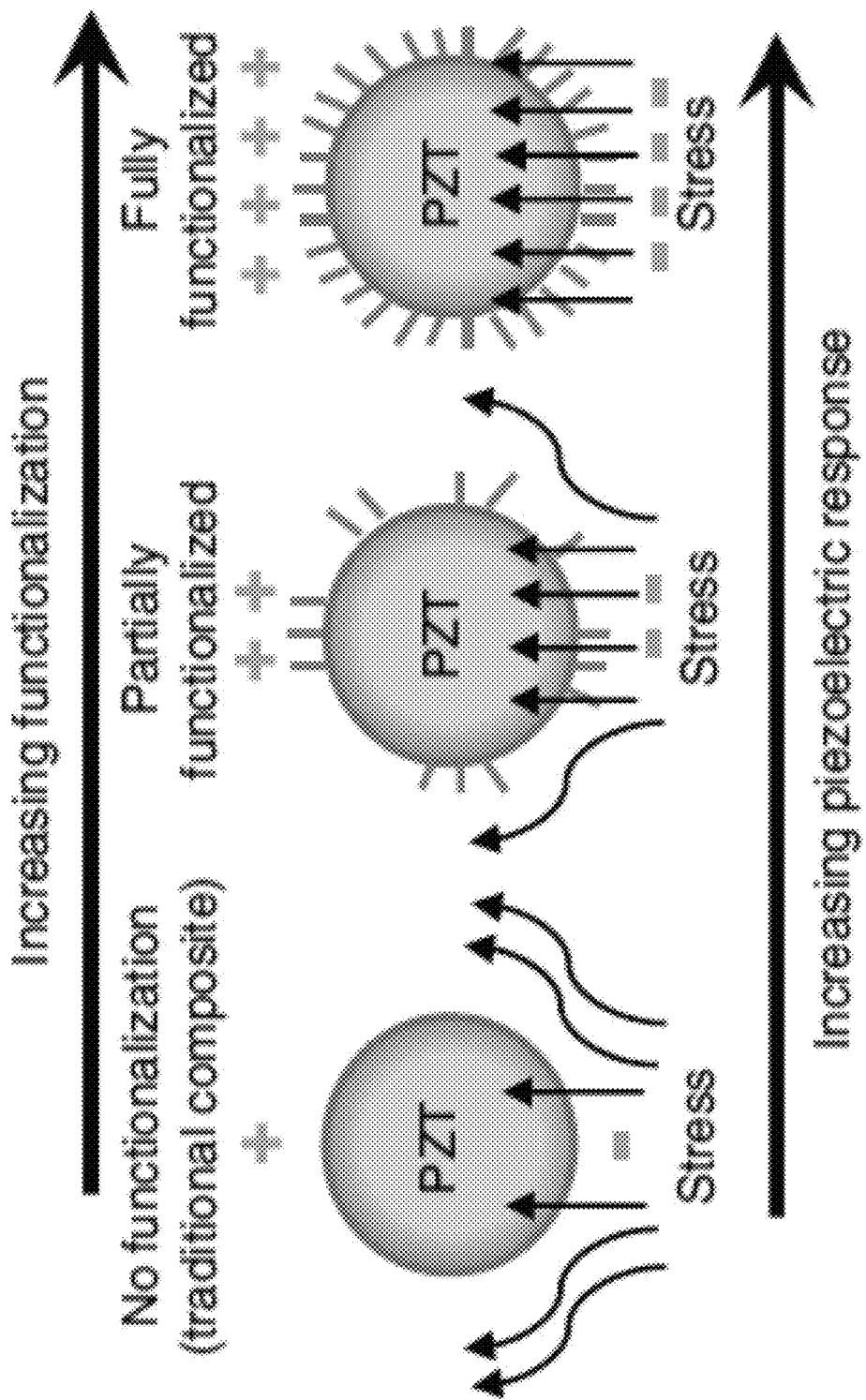
Figure 2C:
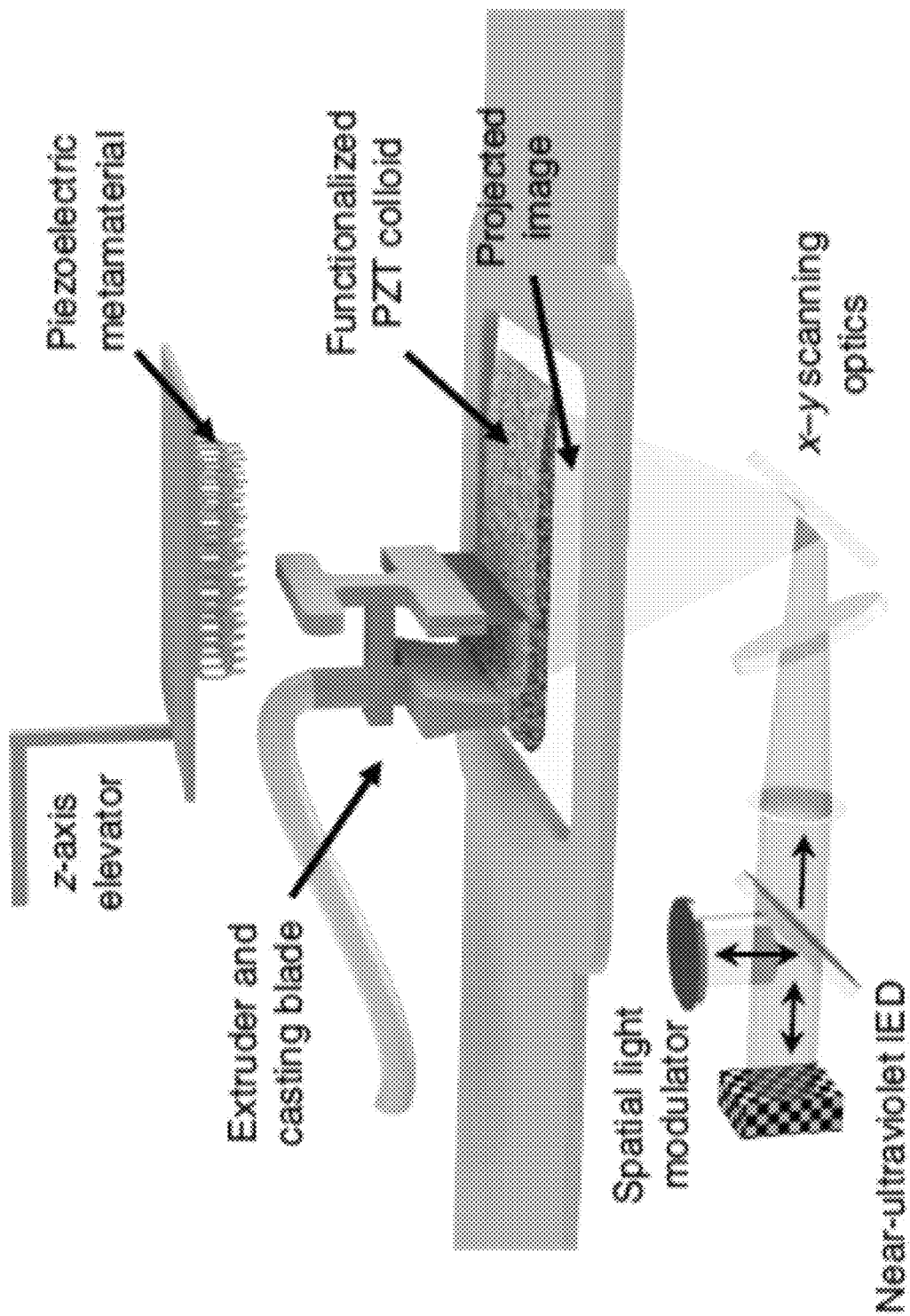
Figure 2D:
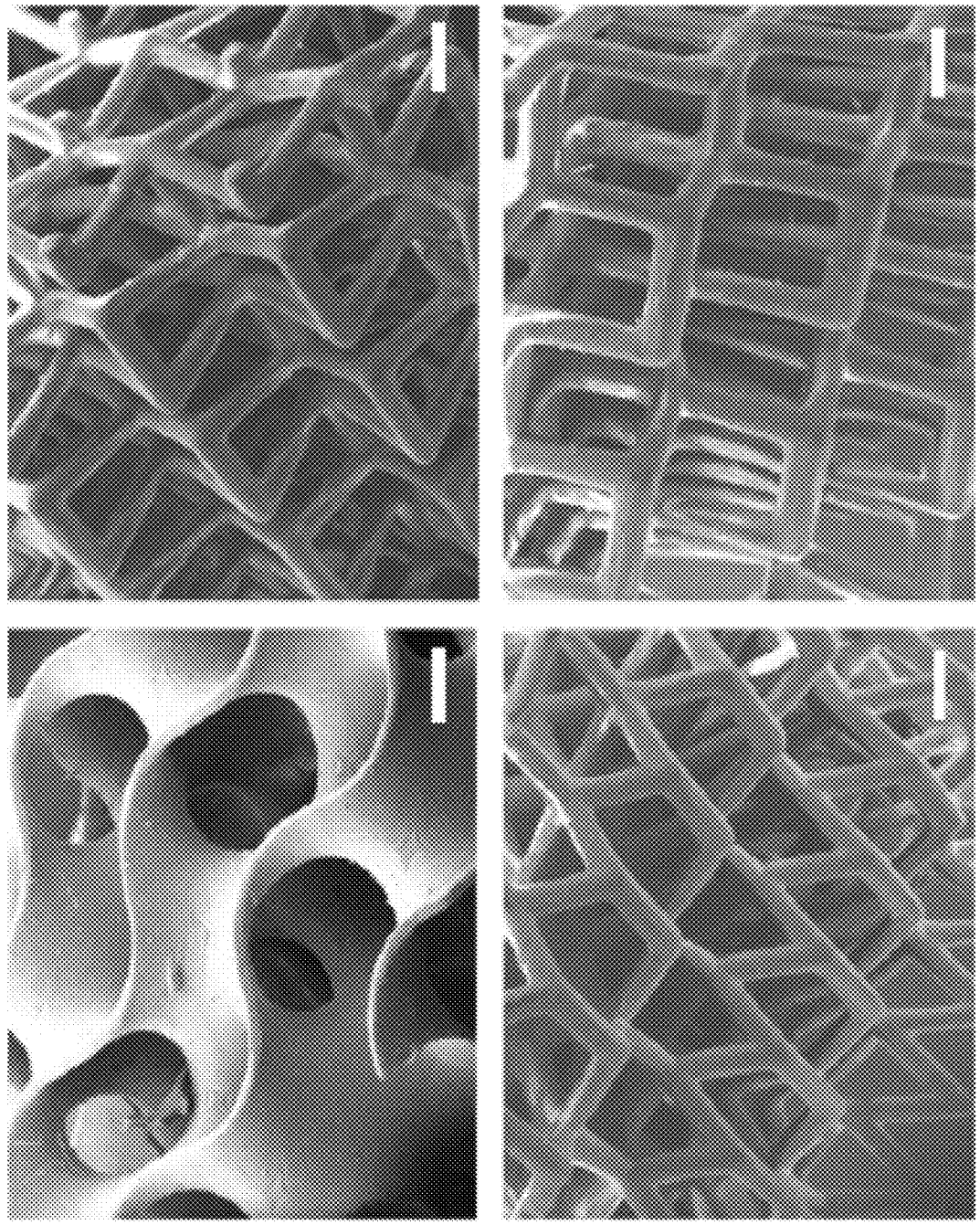

Synthesis and printing of electromechanical metamaterials. The fabrication method of 3D piezoelectric architectures starts by synthesizing surface-functionalized piezoelectric nanoparticles (see also e.g. below and FIGS. 2A-2B and FIG. 31 for particle properties), dispersing them with ultraviolet-sensitive monomers into highly concentrated, uniform colloids (PZT volume loading up to 50%) that can be sculpted into 3D structures by near-ultraviolet light[9] (FIG. 2C). While surface functionalization of approximately 4 vol % piezoelectric nanoparticles has produced an appreciable piezoelectric coefficient as compared to non-functionalized dispersion[9], the trade-off between high piezoelectric responsiveness and processability has limited the realizations of arbitrary piezoelectric 3D micro-architectures with high piezoelectric coefficients. As shown in FIG. 2A, a functionalization agent, (trimethoxysilyl propyl methacrylate) is covalently grafted to the PZT particle surface via siloxide bonds leaving free methacrylate on the surface. The surface functionalization reaction is optimized to maximize surface coverage. These strong covalent bonds between the piezoelectric nanoparticles and the polymer matrix network improve the dispersion quality of the highly concentrated piezo-active colloidal resin (see also e.g. below and FIGS. 11A-12D) by creating a sterically hindered surface. Increasing the functionalization level elevates the piezoelectric output of the nanocomposite to reach the upper bound at a given loading concentration (see also e.g. below and FIG. 2B and FIGS. 13A-13D). Strict control of the thickness of the colloidal paste through the designed recoating system and reduction of oxygen inhibition allow the fabrication of complex 3D piezo-active architectures with fine features (see also e.g. Methods below) from a range of concentrated colloidal particles entrapped with ultraviolet-sensitive monomers (FIGS. 2C-2D and FIGS. 14A-16B). This versatile process is not limited to PZT. Surface functionalization can be implemented to enhance the response of a wide range of piezoelectrics (for example, barium titanate, BTO) or other functional materials such as multiferroics (for example, bismuth ferrite). The as-fabricated nanocomposite system does not require post-heat treatment, and achieves high structural fidelity and uniformity. Configuring the photo-sensitive monomer compositions enables independent tuning of the composite stiffness, allowing us to access rigid to flexible piezo-active materials to convert mechanical stress to voltage signals (see also e.g. below and FIGS. 17-19E and FIG. 32), as well as energy harvesting (see also e.g. below and FIGS. 20A-20D).

Figure 3A:
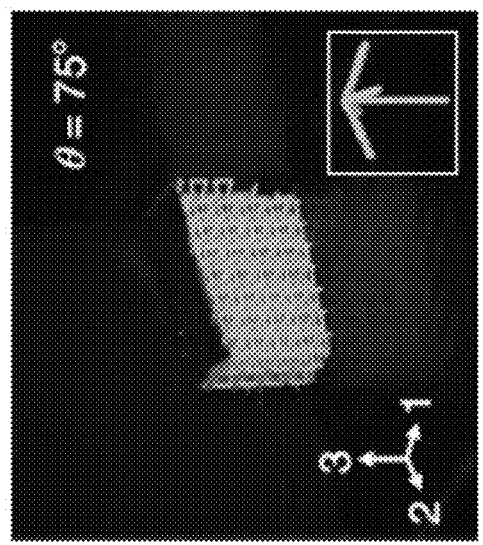
FIGS. 3A-3H show Measurement of 3D piezoelectric responses.
Figure 3A:
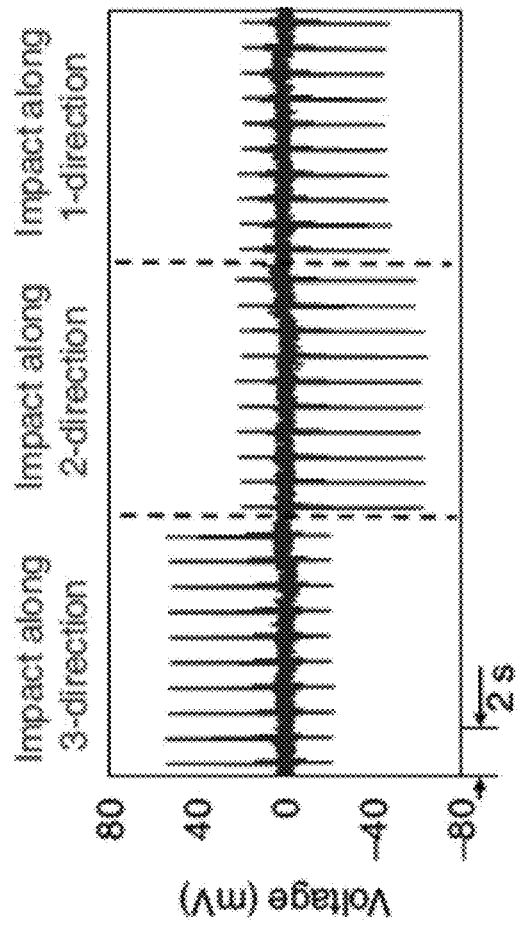
Figure 3B:
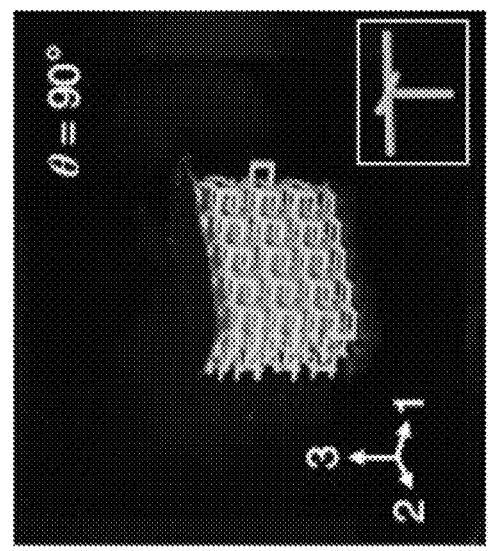
Figure 3B:
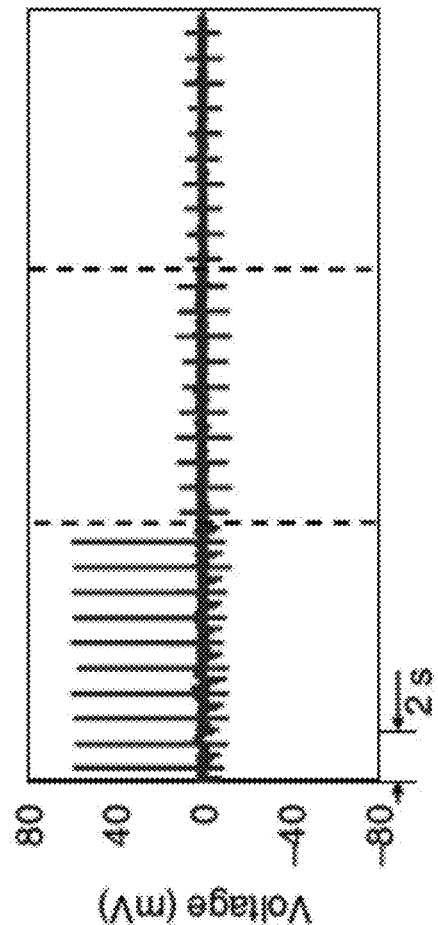
Figure 3C:
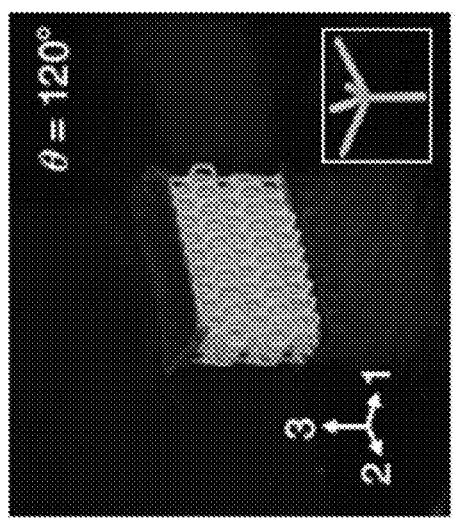
Figure 3C:
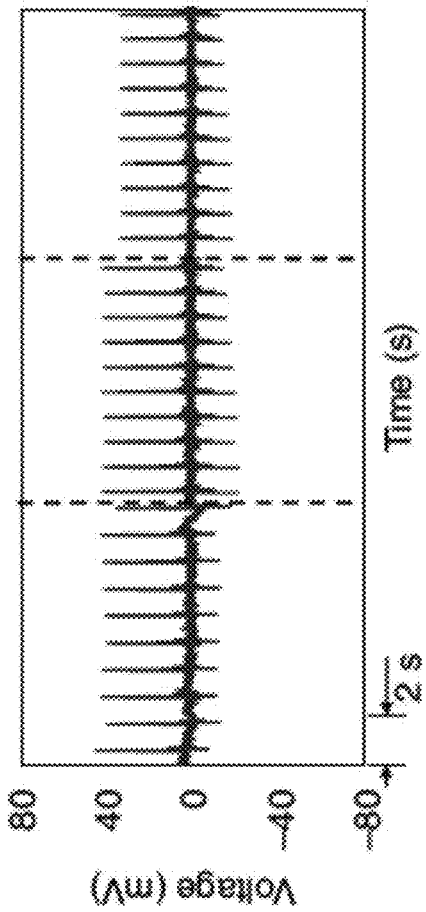
Figure 22A:
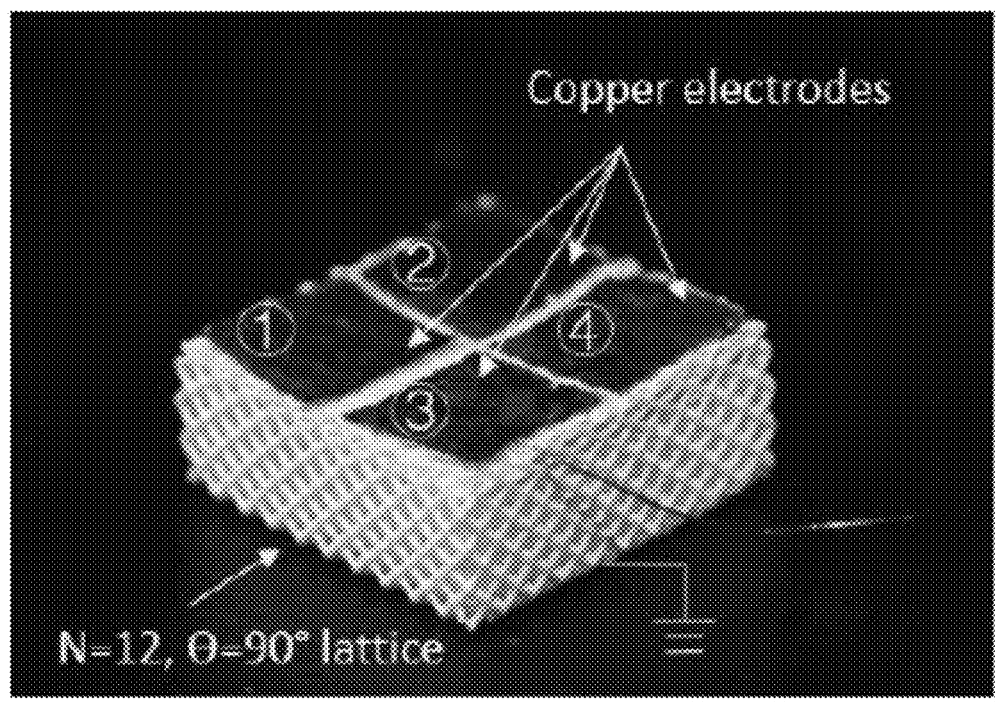
FIGS. 22A-22B show (FIG. 22A) Optical image of the N=12, ⊖=90° lattice with 4 electrodes attached at different positions.
Figure 22B:
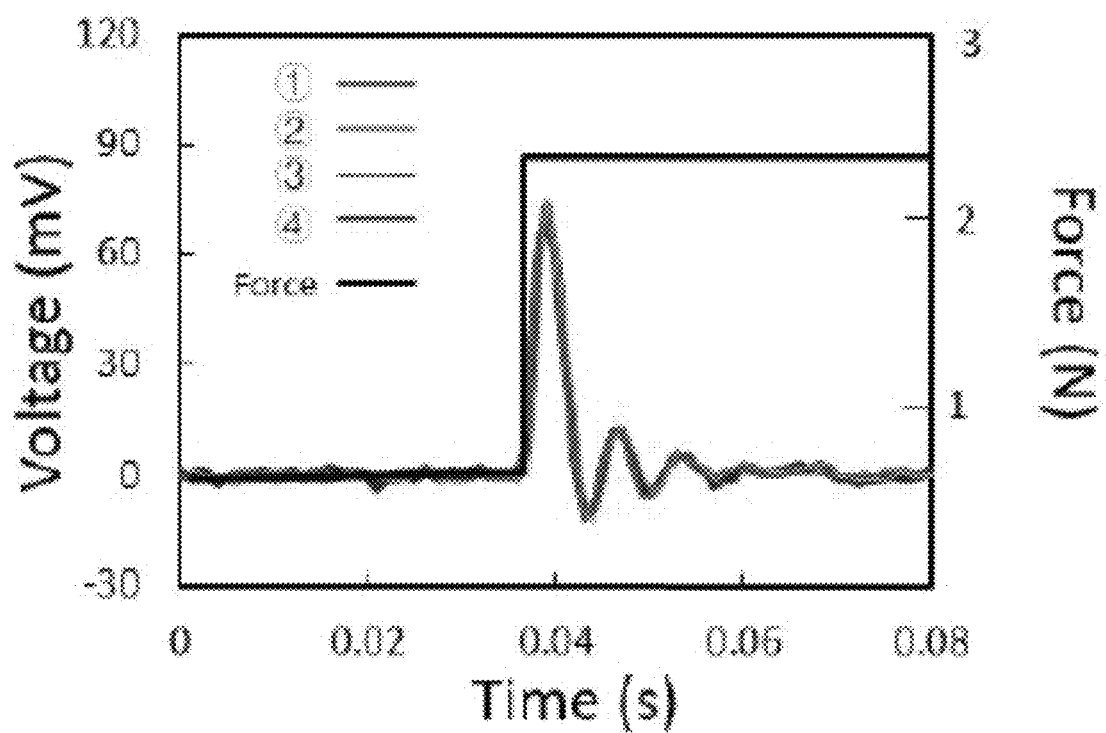
Figure 23:
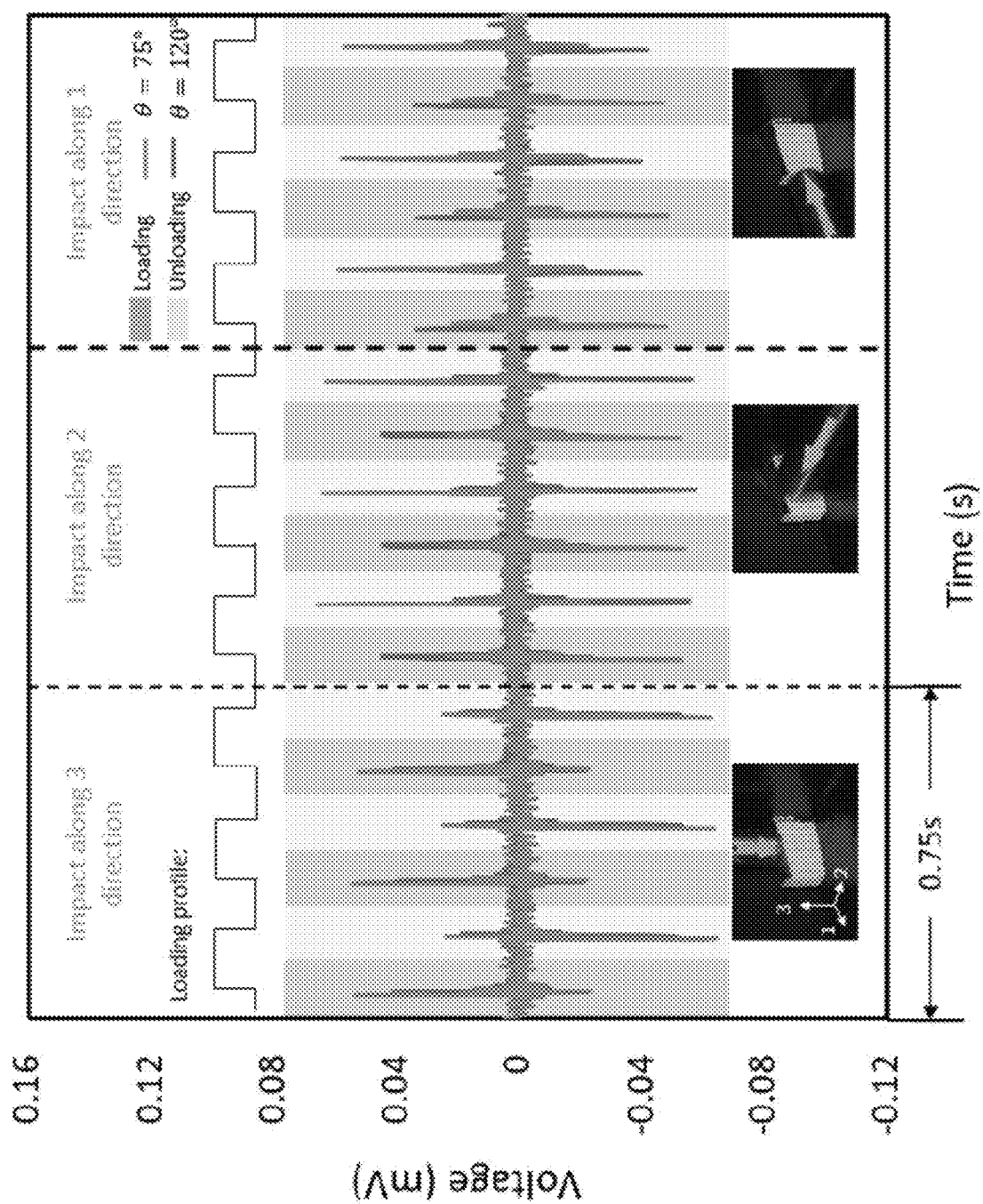
FIG. 23 shows real-time loading and release voltage outputs of two N=5 designs [d3M: {− − +}, d3M: {+ + +} respectively], with square loading profile stimulated from different directions. All samples are polled against 3 direction.

Measurement of 3D piezoelectric responses. To evaluate the piezoelectric responses of the designed piezoelectric metamaterials, cubic lattices composed of periodic unit were printed cells stacked along the three principal directions and poled them under uniform electric fields (see also e.g. Methods below and FIGS. 21-22B for poling the samples). A shaker with an integrated force sensor exerts cyclical loadings on the samples (see also e.g. below). The generated voltages (in the 3-direction) induced by the applied stress was measured with a resistor (40 MΩ) connected to a data acquisition system. We found excellent agreement of the measured {$d_{31}$, $d_{32}$, d33} signatures with the designed response to force from different directions. Here, N=5 designs (3-strut projection pattern, FIGS. 1A-1B) were used to demonstrate the different voltage output patterns due to the distinct distributions of $d_{3M}$. As identical cyclic loadings (about 0.5 N, sawtooth loading profile) are applied along three orthogonal directions, significant differences in the voltage output patterns are observed for three distinct designs (FIGS. 3A-3C; the voltage responses generated from square-loading and unloading profile are shown in FIG. 23). The N=5 piezoelectric meta-material of θ=75° (FIG. 3A) outputs a positive voltage when loaded in the 3-direction, while the sample generates a negative voltage when loaded in the 1- or 2-direction. In contrast, FIG. 3B shows that the voltage outputs of our N=5, θ=90° lattice in the 3-direction are positive while voltage output in the 1- or 2-direction is suppressed, exhibiting highly anisotropic response. By further increasing θ to 120°, the voltage outputs in all 1-, 2- and 3-directions are positive when loaded in any direction, as shown in FIG. 3C, owing to its all-positive $d_{3M}$ distribution.

Figure 3D:
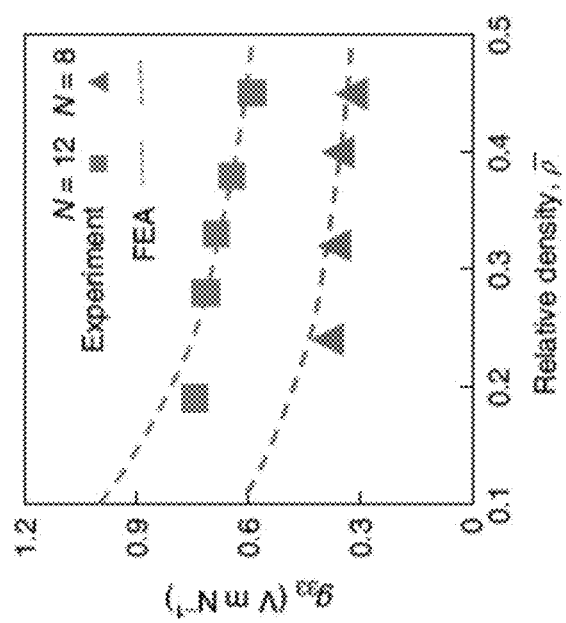
Figure 3E:
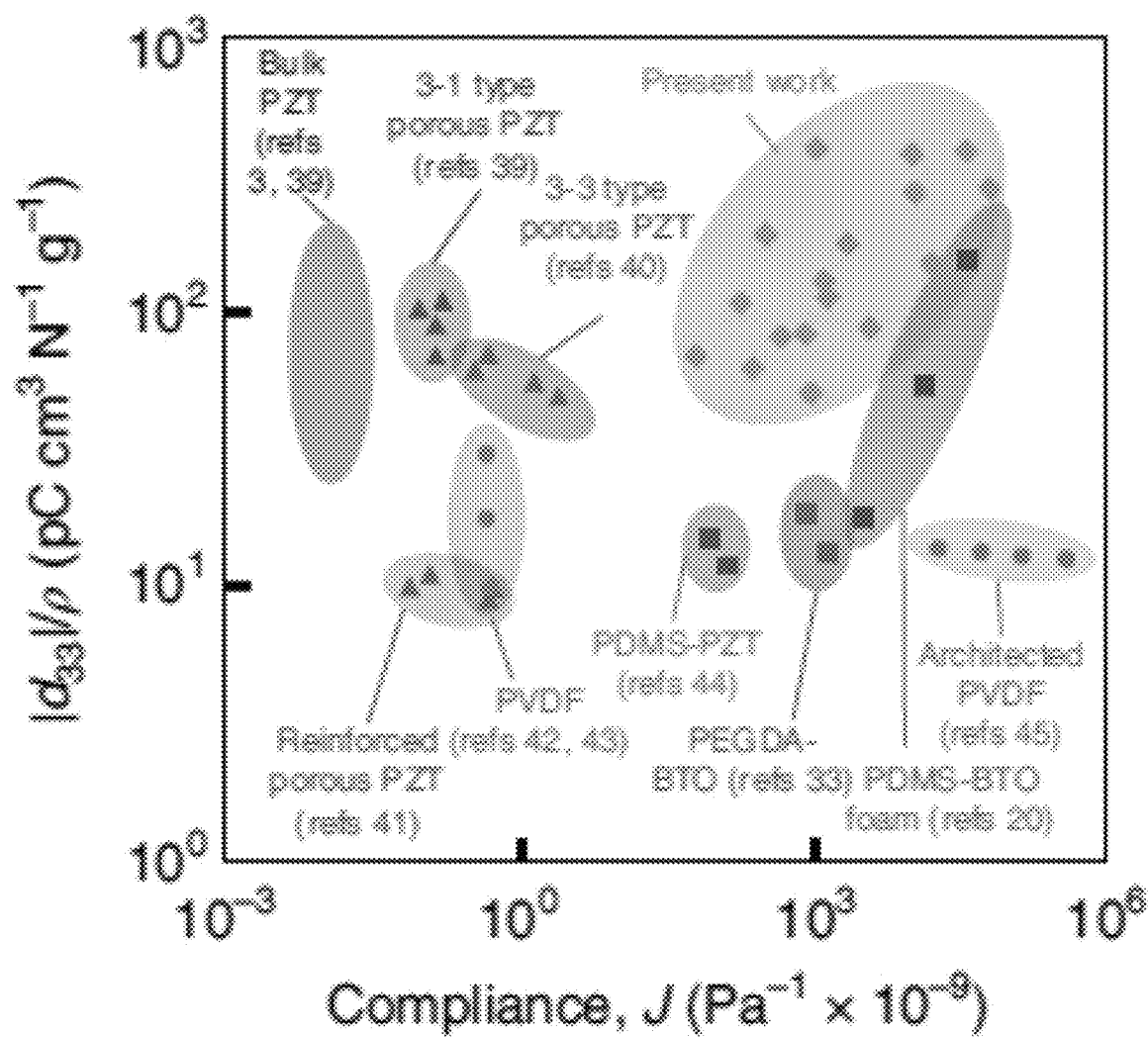
Figure 3F:
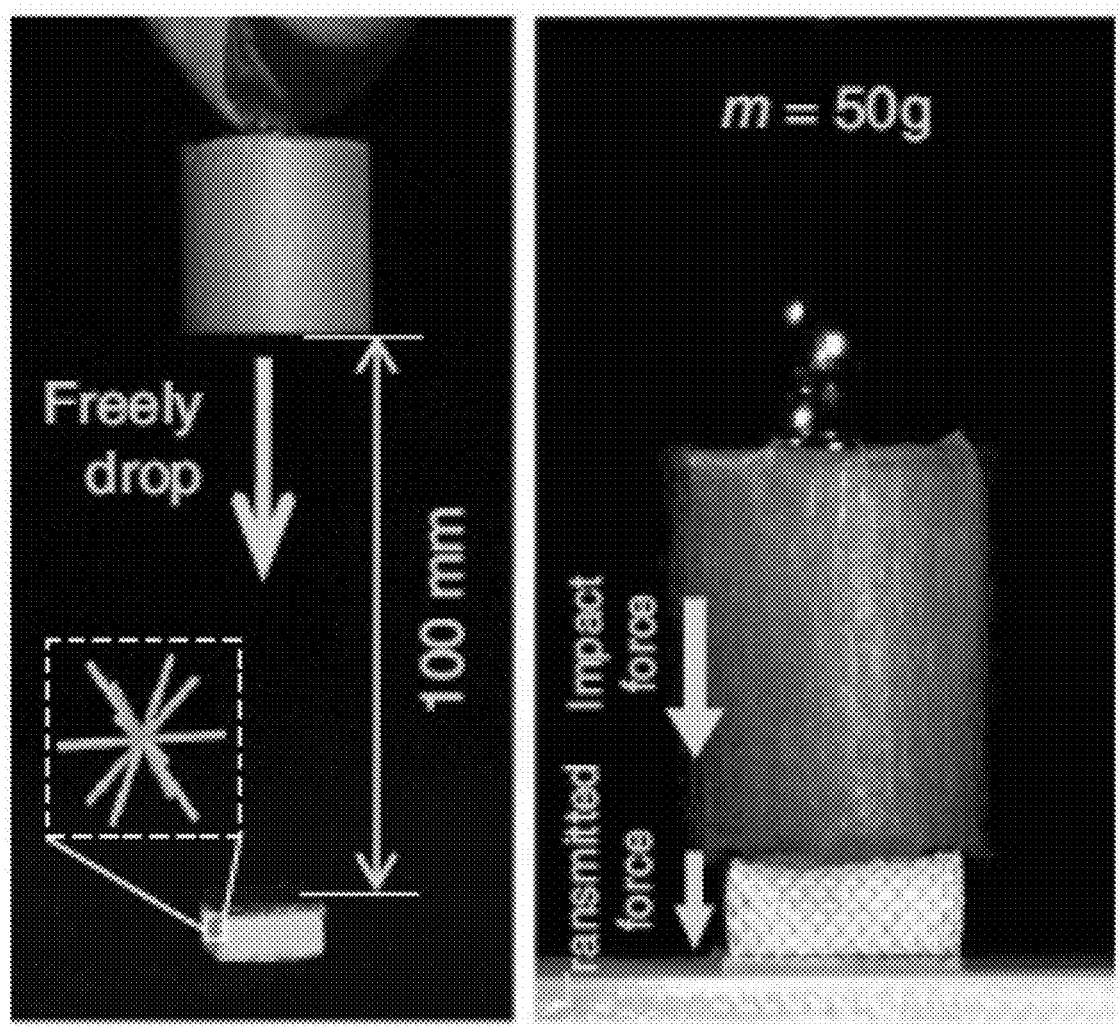
Figure 3G:
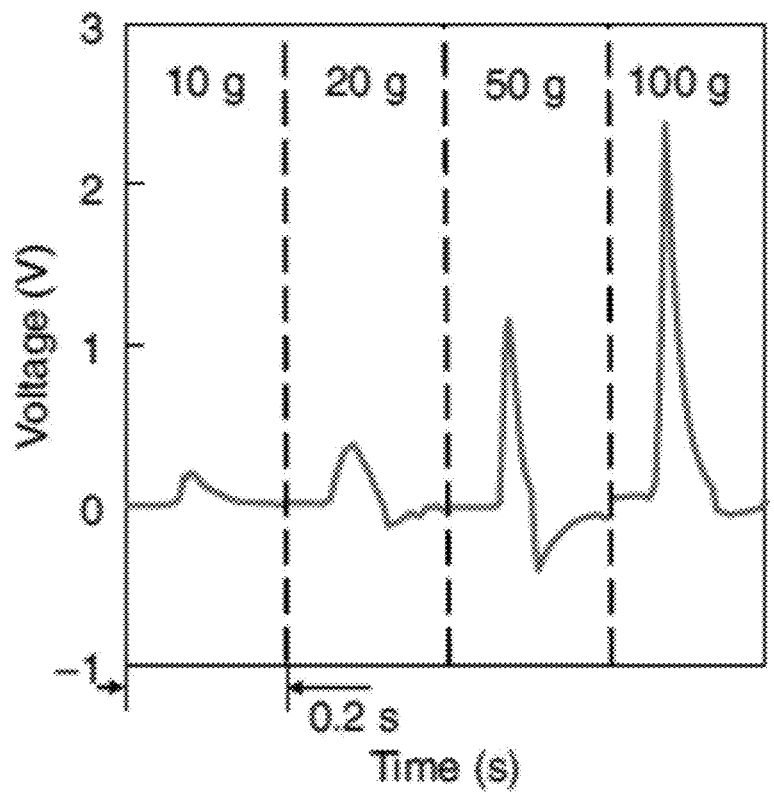
Figure 3H:
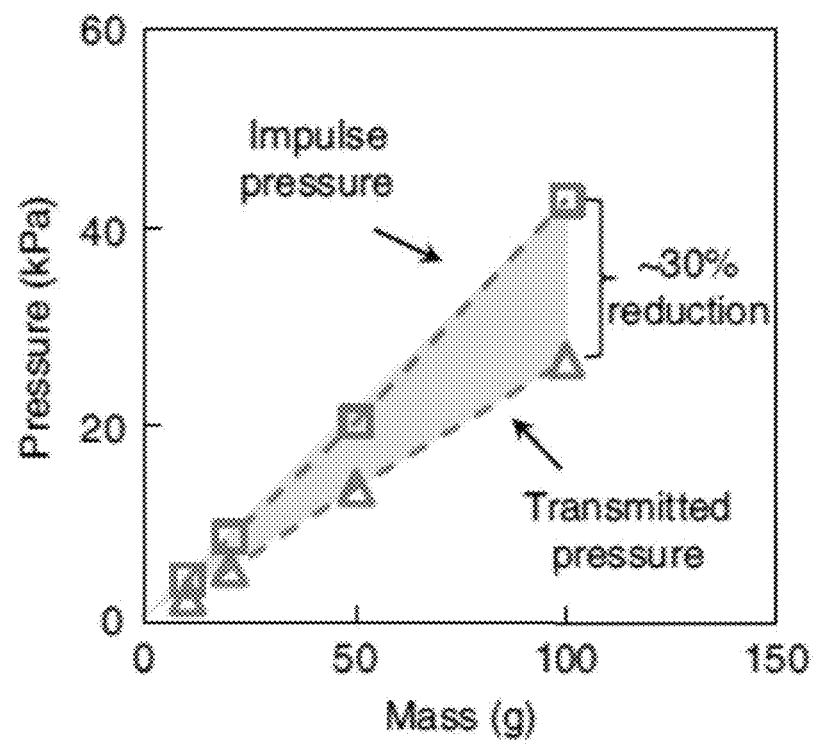
Figure 24A:
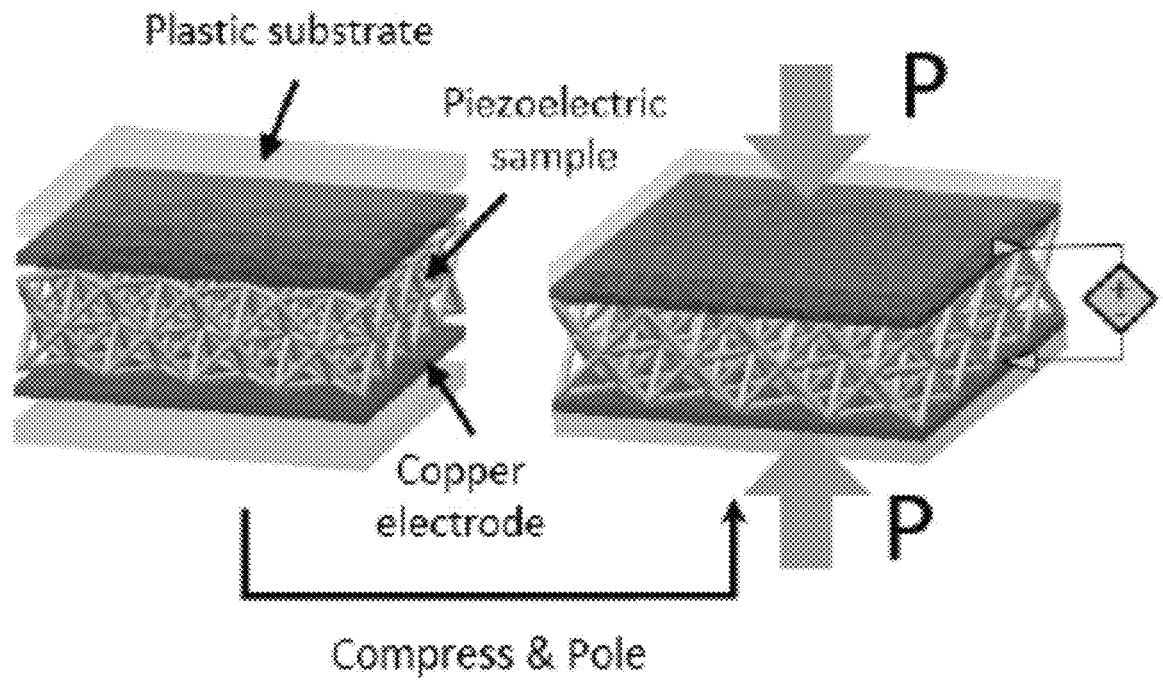
Figure 24B:
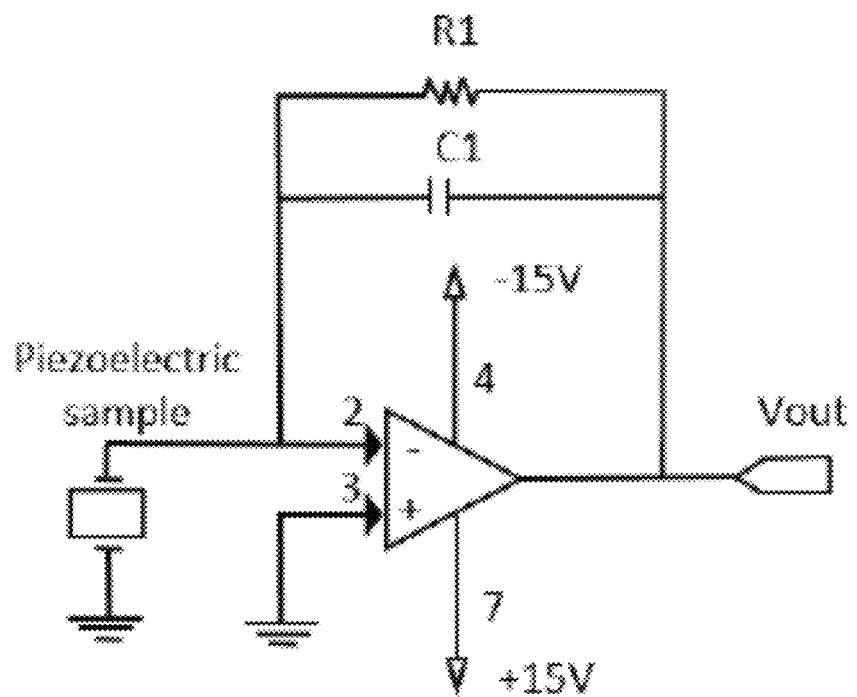
(FIG. 24B) Circuit diagram for measuring the charges generated from the sample with applied stress. Electric charges generated from the piezoelectric metamaterial are collected by the capacitor, C1 (100 pF). The output voltage, Vout, is measured through a data acquisition system (NI myDAQ) via R1 (40M Ω). The piezoelectric coefficients of the metamaterials are calculated from d=($V_{out}$×100 pF)/Fapplied.
Figure 24C:
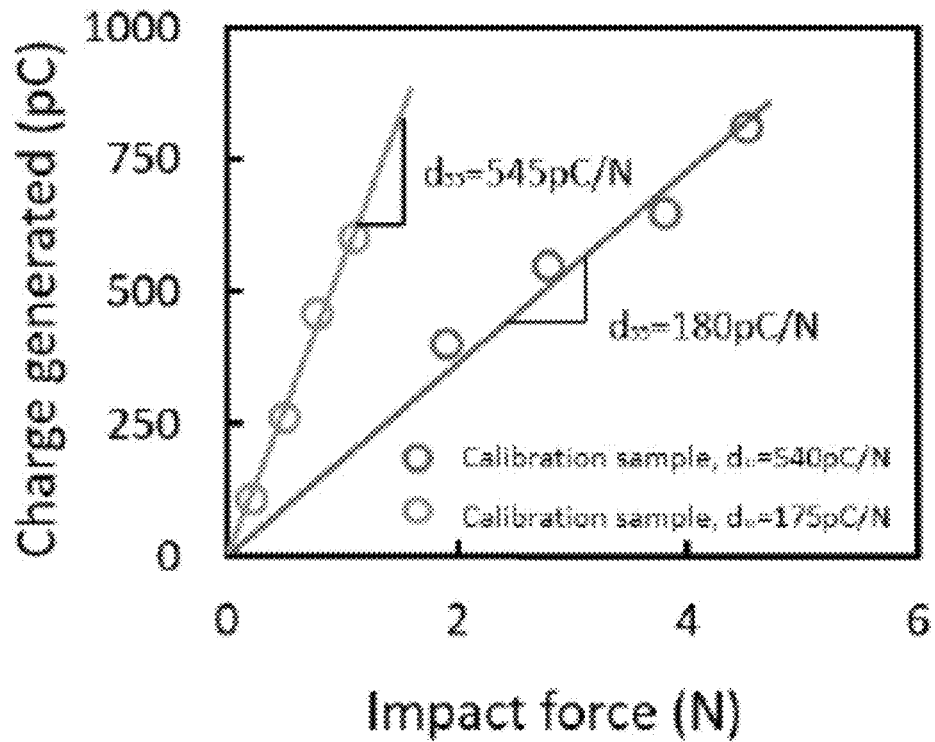
(FIG. 24C) Charge versus applied force plot of two piezoelectric material samples as calibration of the testing fixture whose piezoelectric charge constants are measured by a piezo d33 test system (APC International, Ltd. Piezo d33 Test System).
Figure 24D:
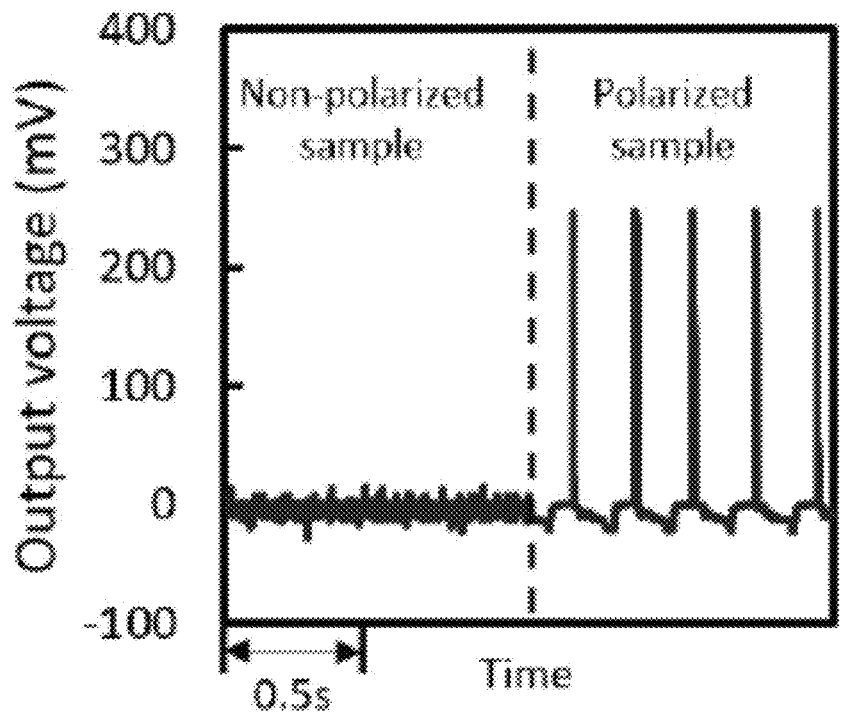
(FIG. 24D) Voltage output of non-polarized sample and polarized sample under about 0.5N compressive force.
Figure 25:
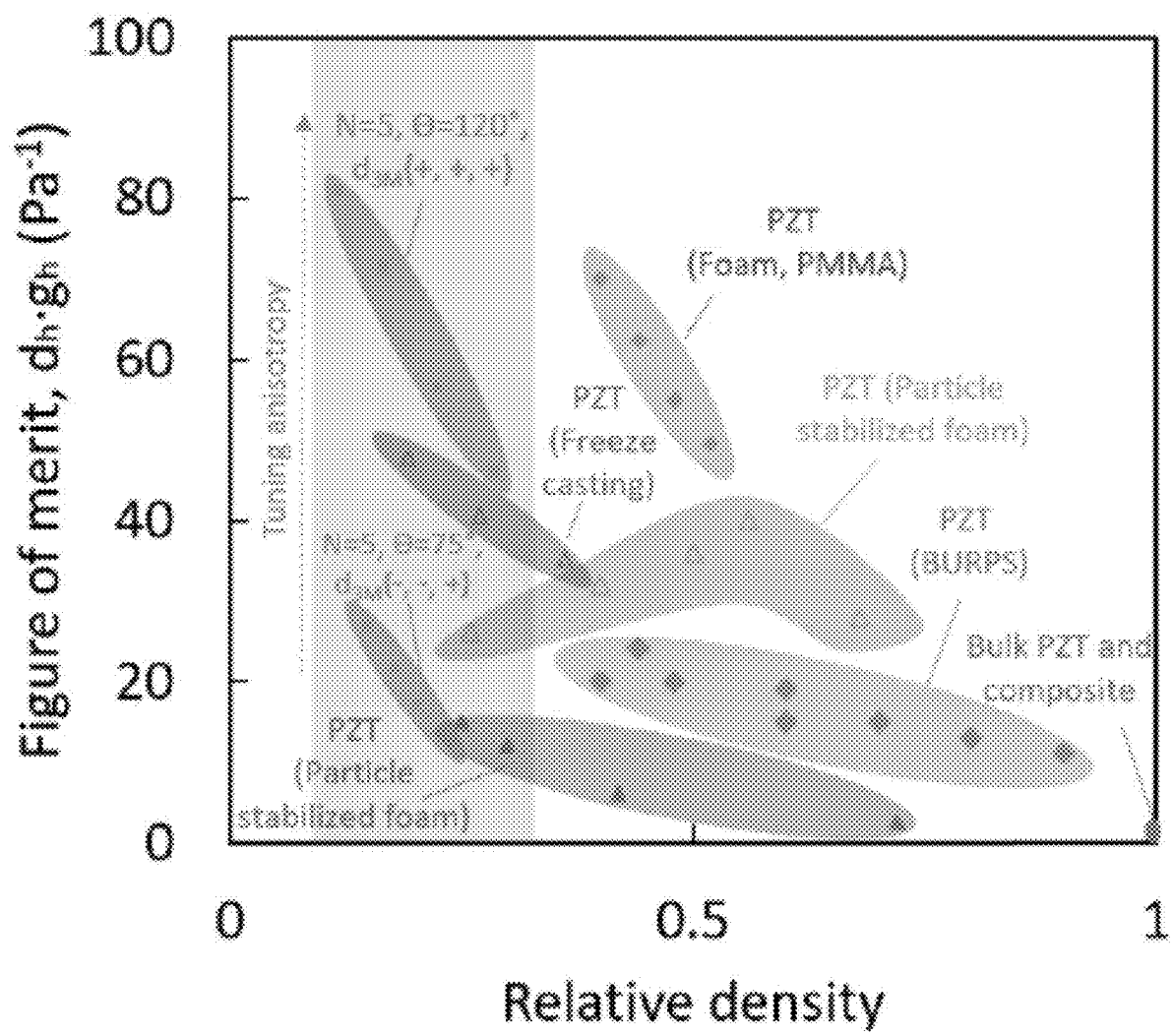
Figure 26:
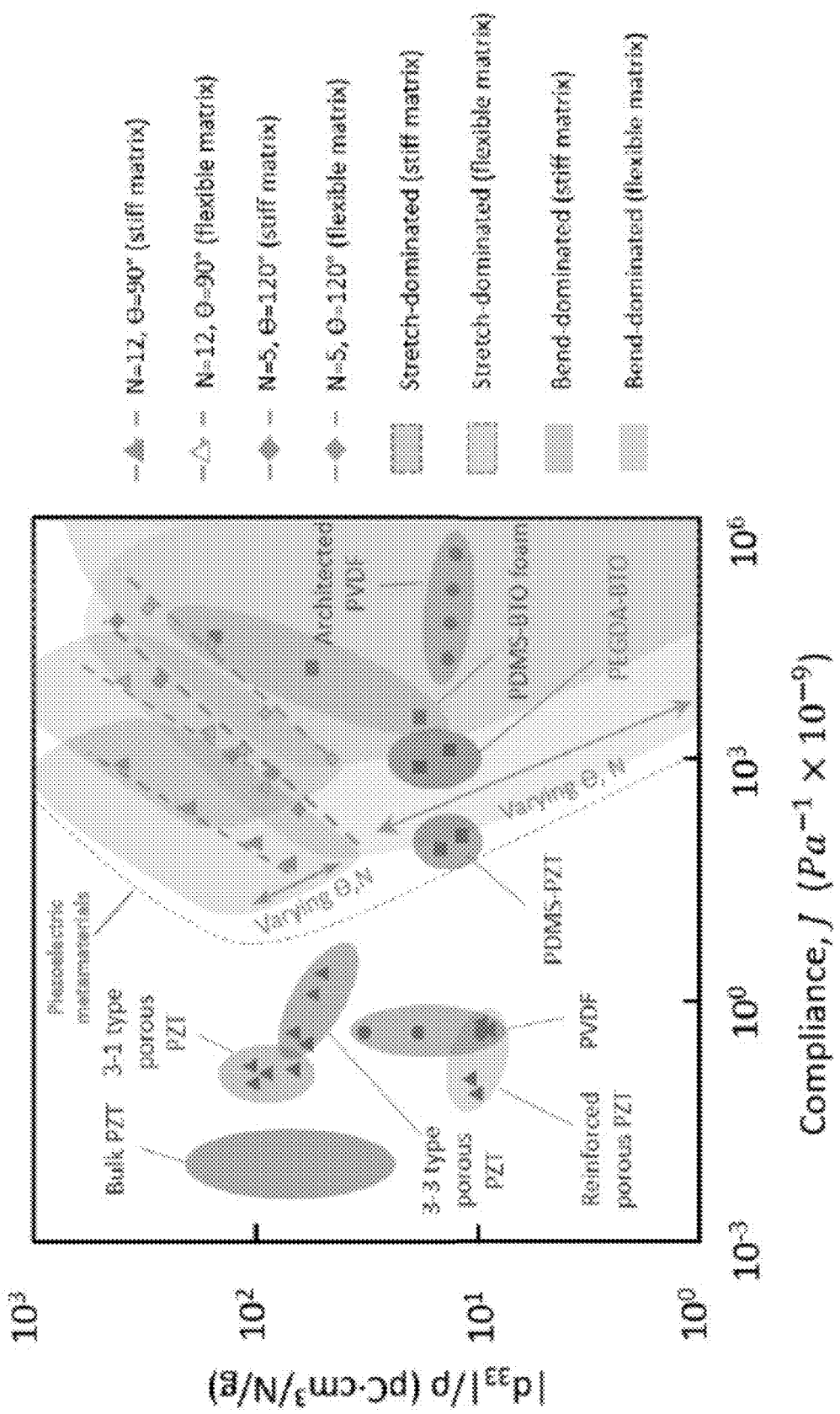

To assess the mechanical-electrical conversion efficiency, the effective piezoelectric voltage constant $g_{33}$, defined as the induced electrical field per unit applied stress, was quantified by measuring the $d_{33}$ and permittivities of the as-fabricated metamaterials. The resistor used in the apparatus is replaced by a circuit to quantify the charge generated in response to applied stress (see also e.g. below and FIGS. 24A-24D and FIG. 33). The $d_{33}$ and $g_{33}$ are then quantified by the ratio of the applied load and the generated charge. The $g_{33}$ results of the metamaterial comprised of highly connected structure (N=12 and N=8) are shown in FIG. 3D (see also e.g. below and FIG. 25 for more details). Remarkably, $g_{33}$ increases with decreasing relative density, indicating a potential application as a simultaneously light-weight and highly responsive sensor. The measured $d_{33}$ over their mass density (that is, $|d_{33}|/\rho$) and compliance are plotted against all piezoelectric materials (see also e.g. below and FIG. 3E). It was observed that these low-density and flexible piezoelectric metamaterials achieve over twice the specific piezoelectric constant of piezoelectric polymer (for example, polyvinylidene fluoride, PVDF) and a variety of flexible piezoelectric composites (FIGS. 3E and 26). Additionally, enhancement of the hydrostatic figures of merit can be obtained via unit cell designs with all identical signs of the $g_{3M}\{+ + +\}$ and $d_{3M}\{+ + +\}$ coefficients (FIG. 25). This enhanced piezoelectric constant along with the highly connected 3D micro-architecture makes the 3D piezoelectric metamaterial an excellent candidate for simultaneous impact absorption and self-monitoring. A series of standard weights ranging from 10 g to 100 g were sequentially dropped onto the as-fabricated 3D piezo-electric lattice (N=12) attached on a rigid substrate (FIG. 3F) to impact the piezoelectric metamaterial. The transient impact stress activates the electric displacement of the metamaterial in the 3-direc-tion, shown as the trace of the voltage output against the impact time (FIG. 3G). The impulse pressure on the piezoelectric metamaterial calculated via the measured $d_{33}$, and the measured pressure transmitted to the rigid substrate against time are plotted in FIG. 3H. The significant gap (shaded area) between the impulse pressure and transmitted pressure reveals the impact energy absorption and protection capability of the piezoelectric 3D metamaterial as a potential smart infrastructure[34,35] (see also e.g. below and FIGS. 27A-27D).

Figure 4A:
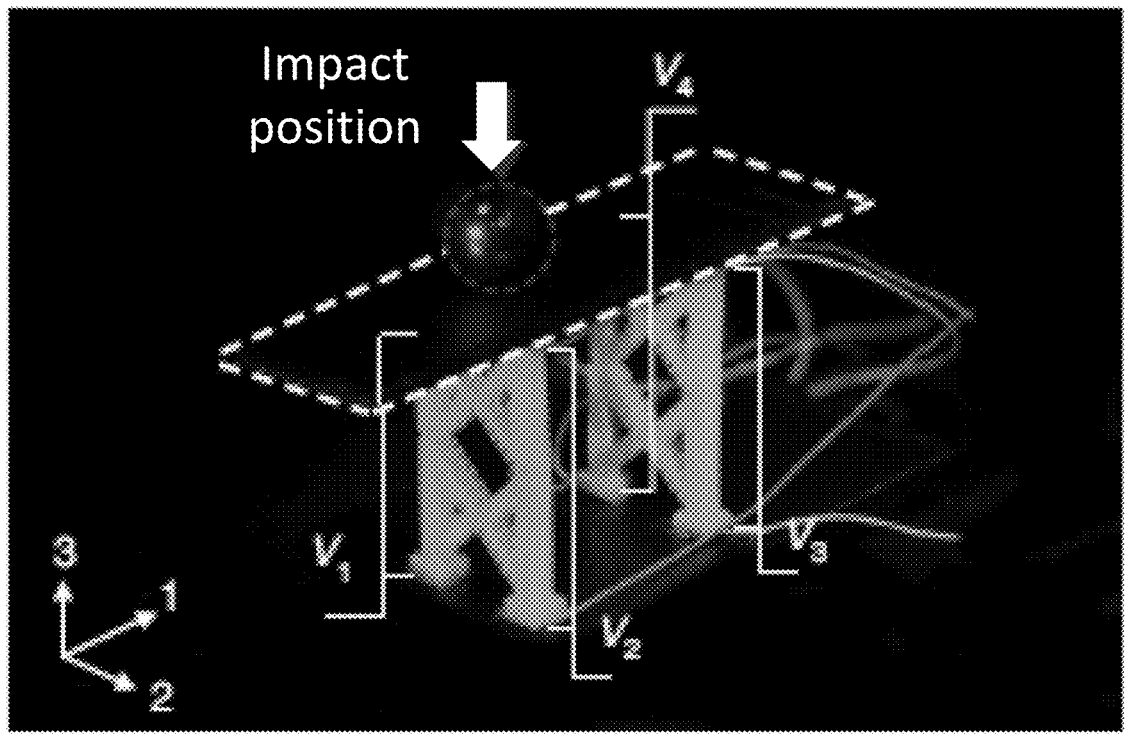
FIGS. 4A-4F show assembly of architected metamaterial blocks as intelligent infrastructures.
Figure 4B:
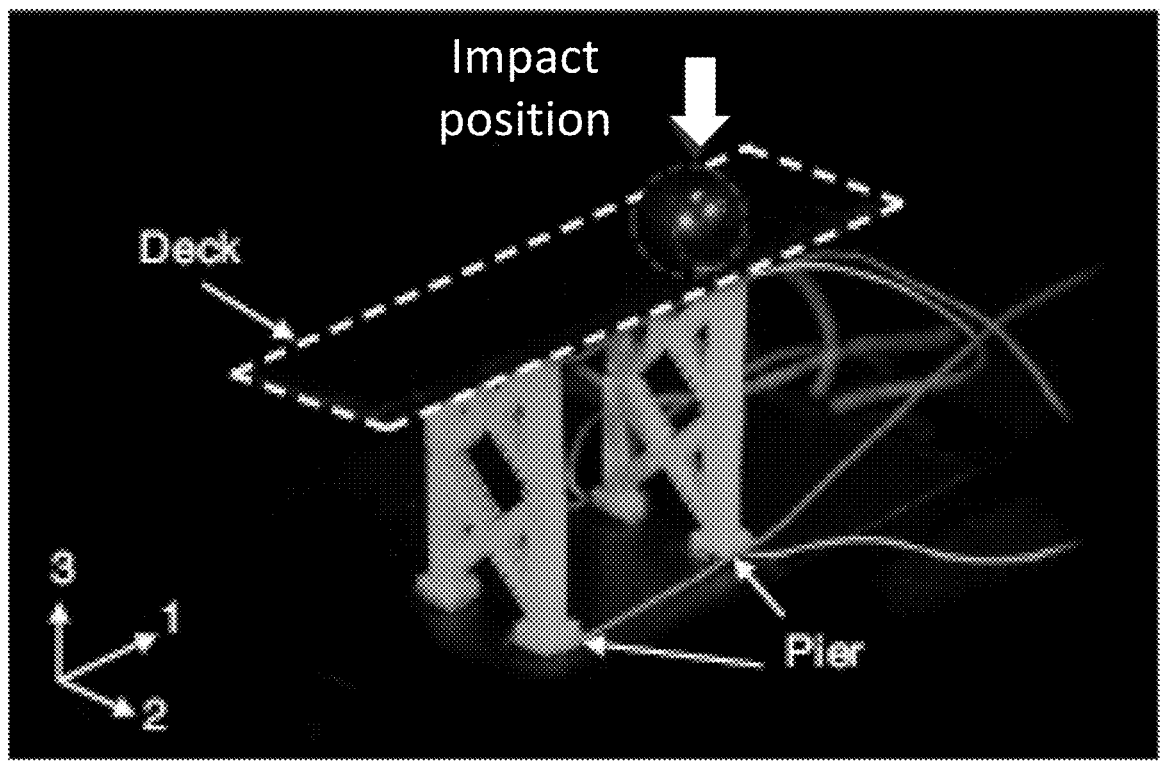
Figure 4C:
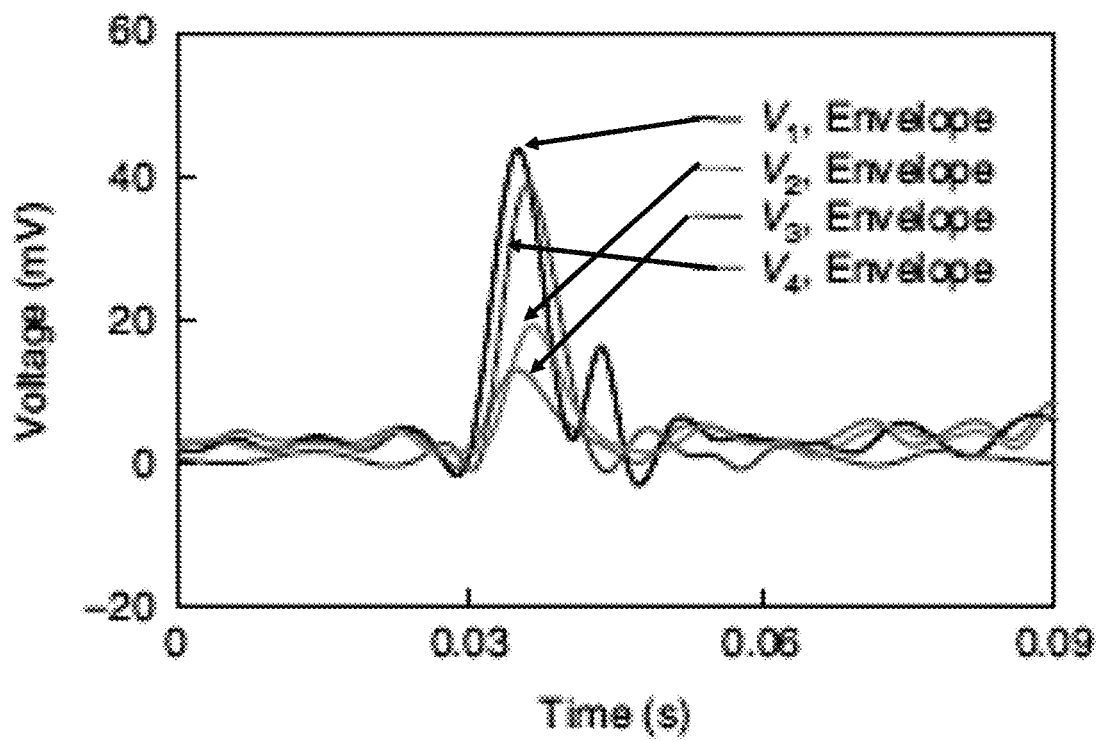
Figure 4D:
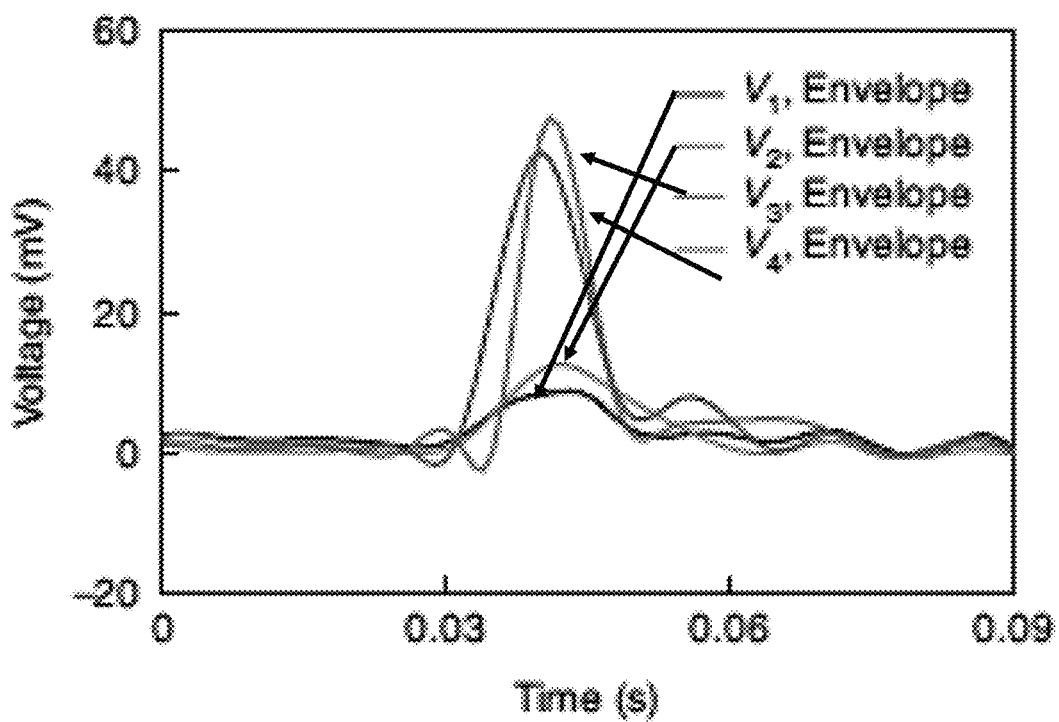
Figure 4E:
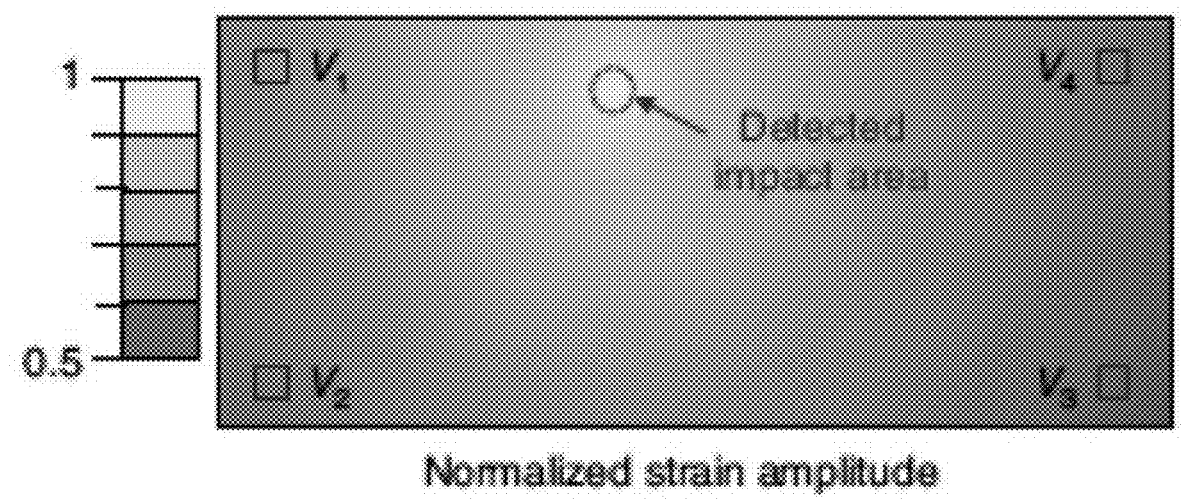
Figure 4F:
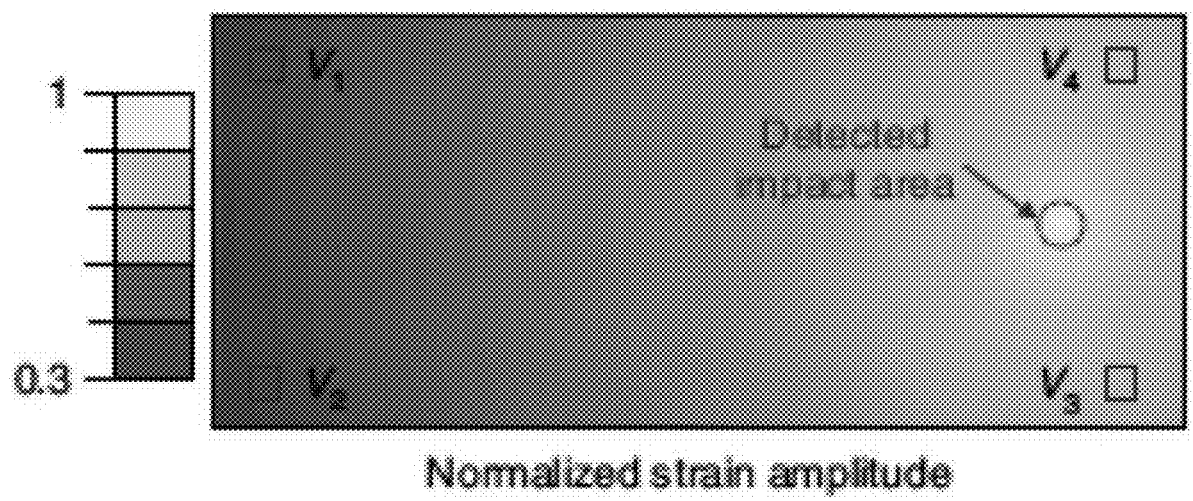

Location and directionality sensing. The 3D digital metamaterial building blocks can be further stacked or printed as smart infrastructures capable of time-resolved pressure self-sensing and mapping without application of an external sensor. Here, piezoelectric metamaterials of N=12 are selected and 3D printed into a four-pier piezoelectric bridge with a non-piezoelectric bridge deck (FIGS. 4A-4B). The external closed circuits with a data acquisition system are connected to the top and bottom surfaces of the piers to monitor the voltage outputs. The 3D-printed piezoelectric metamaterial bridge can directly map the magnitude as well as the location of potentially damaging deformations throughout its structure. To demonstrate, steel balls with a mass of 8 g are sequentially dropped at random onto the deck. The resulting voltage is collected at each of the four electrodes with the amplitude depending on the electrode proximity. The envelopes of the volt-age outputs (plotted in FIGS. 4C-4D) independently monitor the strain amplitude. The impact strain map of the deck can be plotted to determine the impact location (see also e.g. below and FIGS. 4E-4F and FIG. 28). These 3D piezoelectric infrastructures allow one to obtain time-resolved self-monitoring information (for example, displacements, forces, strain mapping) throughout a structure[10,11] without additional external sensors.

Figure 5A:
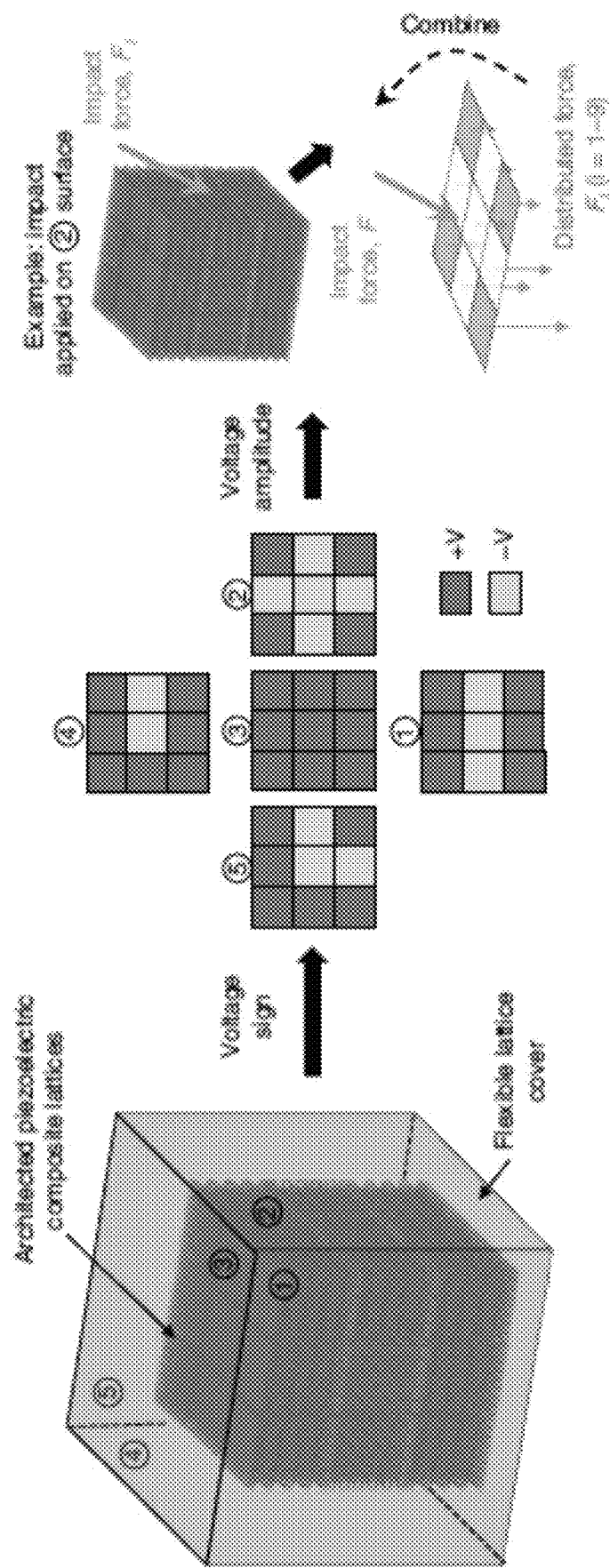
FIGS. 5A-5D show force directionality sensing.
Figure 29:
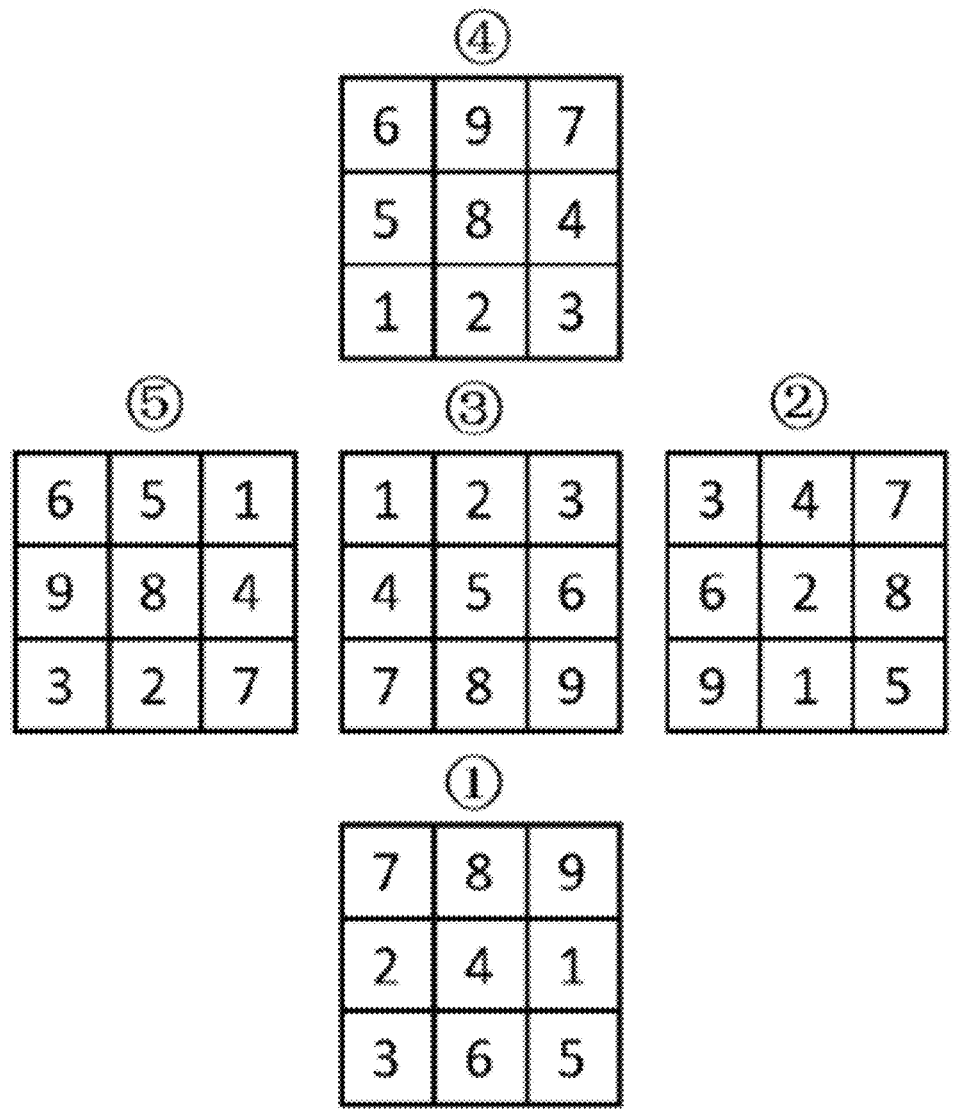
Figure 35:
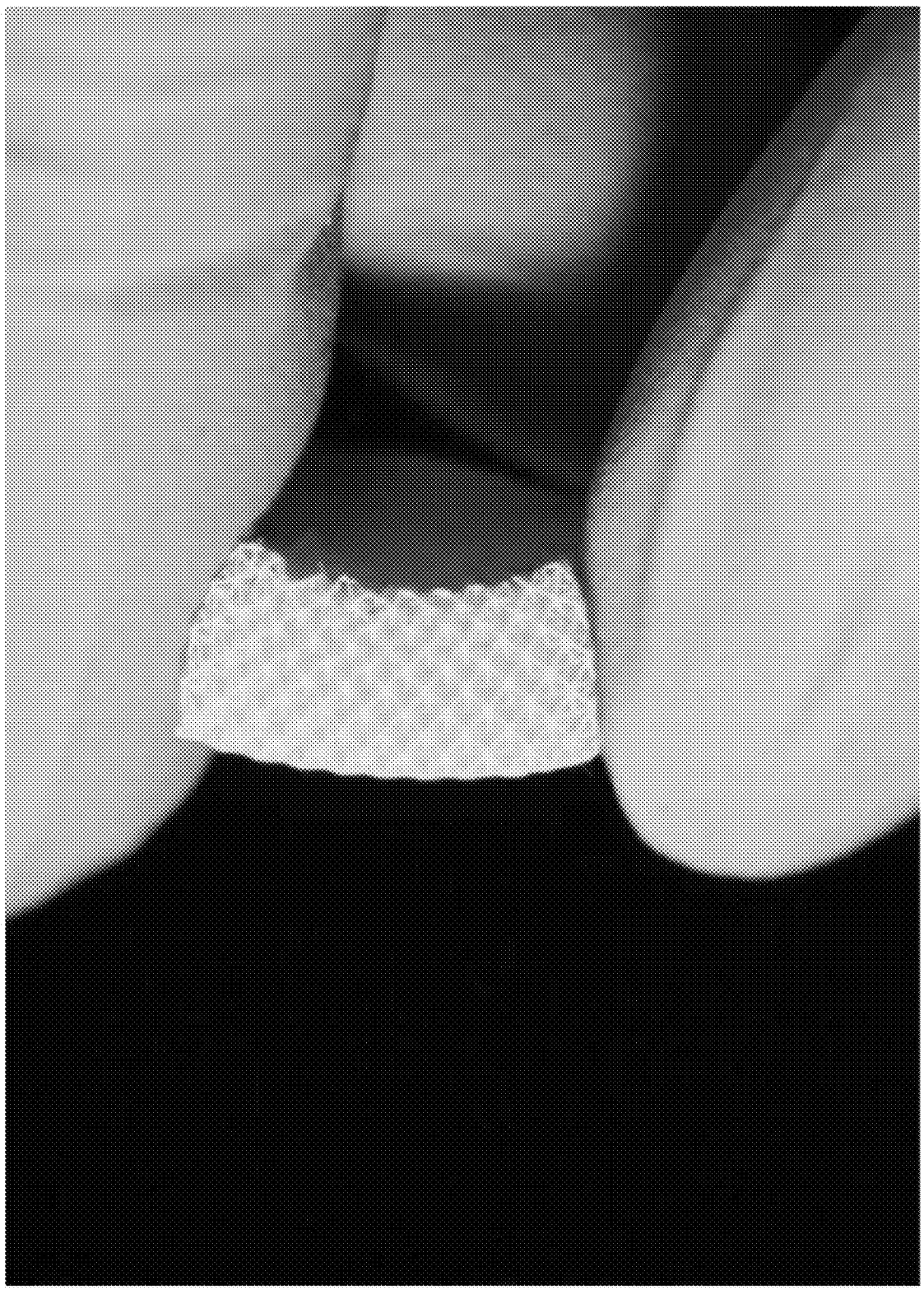
FIG. 35 shows an image demonstrating aspects of a 3D piezoelectric structure as described herein.
Figure 36:
FIG. 36 shows an image demonstrating aspects of a 3D piezoelectric structure as described herein.
Figure 37:
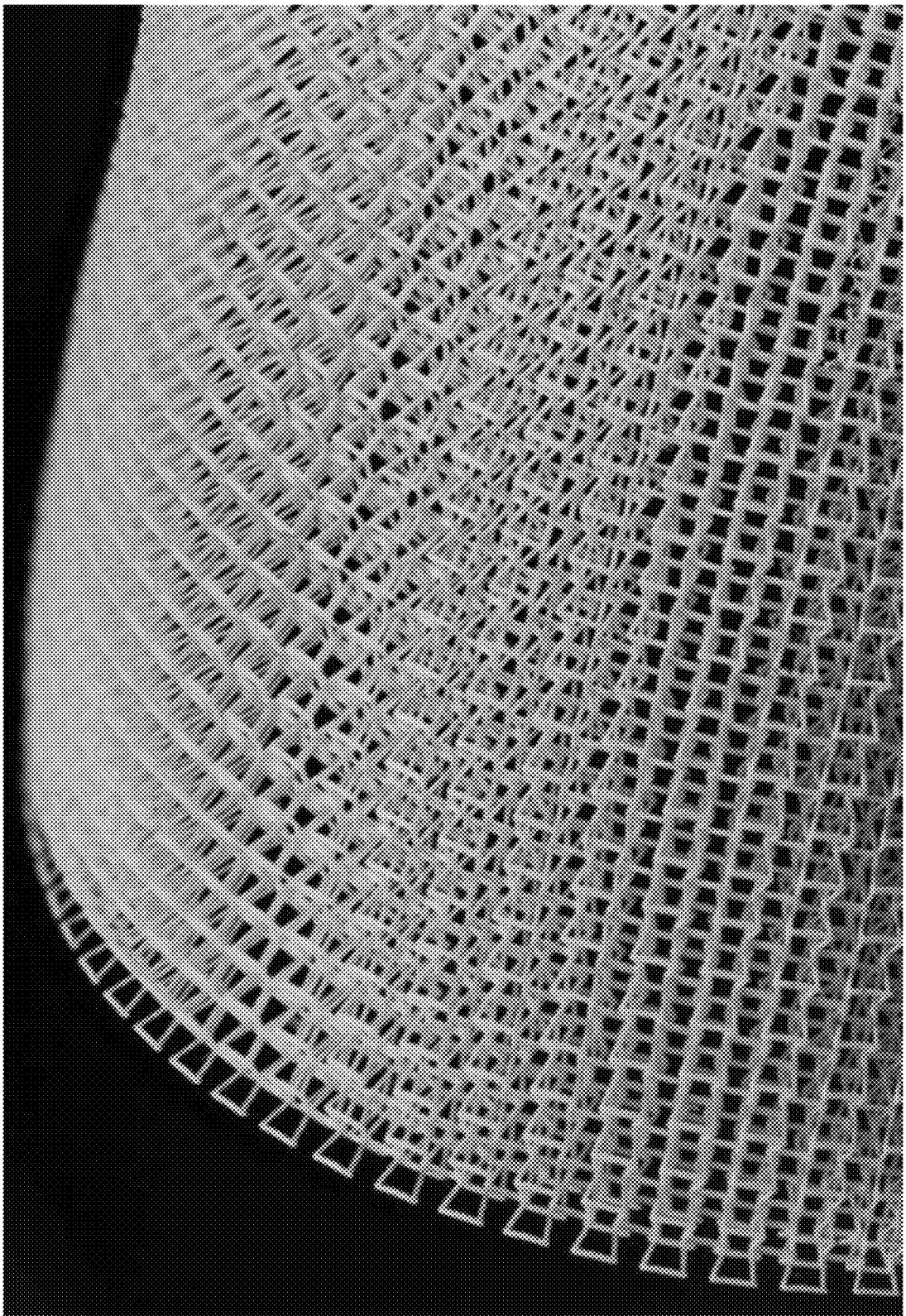
FIG. 37 shows an image demonstrating aspects of a 3D piezoelectric structure as described herein.
Figure 38:
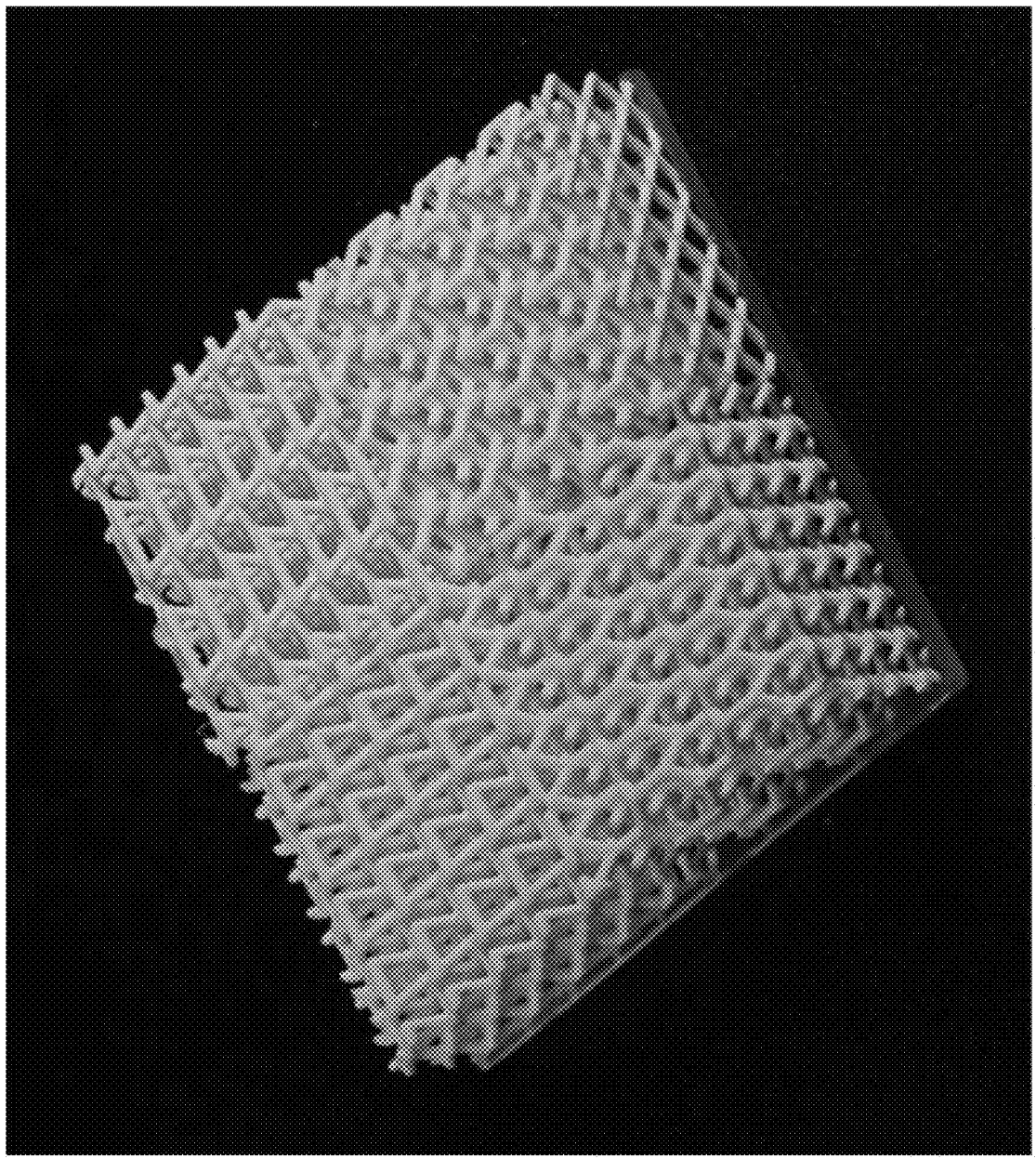
FIG. 38 shows an image demonstrating aspects of a system composed of two or more 3D piezoelectric structure as described herein, where at least two of the 3D piezoelectric structures have different 3D microlattices.

Taking advantage of the distinct directional $d_{3M}$ design space, stacking multiple piezoelectric building blocks, each with a tailored directional response, allows us to program the voltage output pat-terns as binary codes (that is, positive or negative voltage). These stackable metamaterial blocks provide a method of determining directionality, which we leverage to sense pressure from arbitrary directions[12]. FIG. 5A demonstrates the directionality sensing concept using sensing infrastructure assembled from an array of piezoelectric metamaterial cubes with pre-configured $d_{3M}$ tensor signature $\{d_{31}, d_{32}, d_{33}\}$ distributed at different quadrants. Piezoelectric meta-material cubes on the outer surface of the cube (surfaces 1 to 5, as labelled) are connected to voltage output channels, with intersecting faces of the cube sharing one voltage output channel (FIG. 29). Pre-program stacked d3M combinations with each face of the cube allows the output voltage binary map to be uniquely registered with a given pressure applied on that face. The direction and magnitude of any arbitrary force can then be super-positioned and determined from the collected voltage maps (FIG. 5A).

Figure 5B:
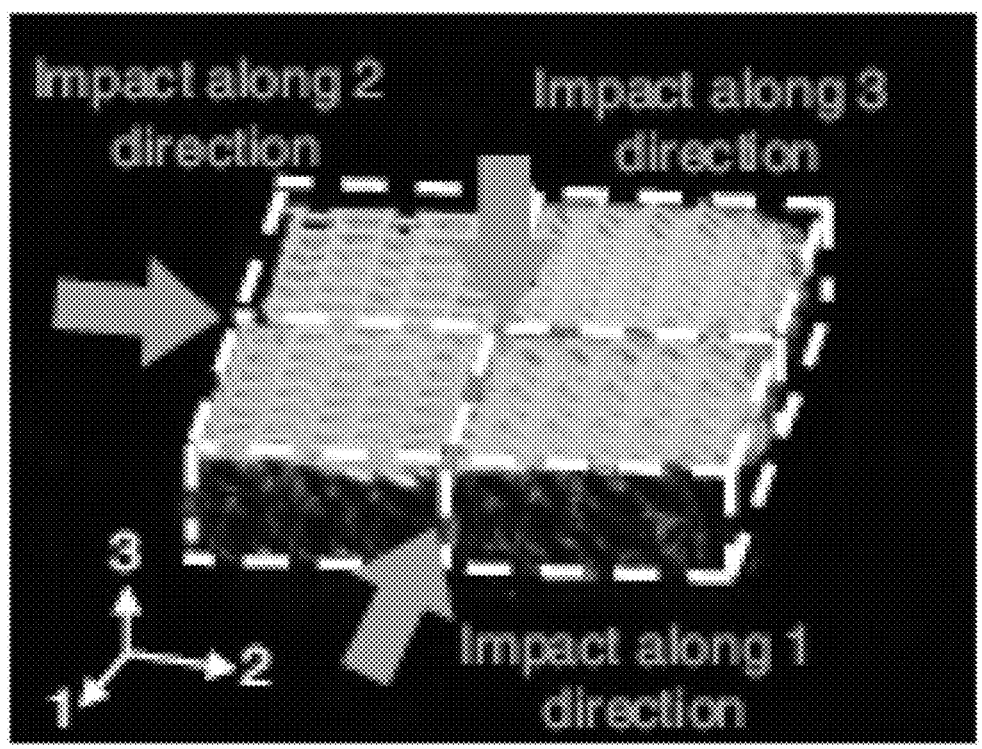
Figure 5C:
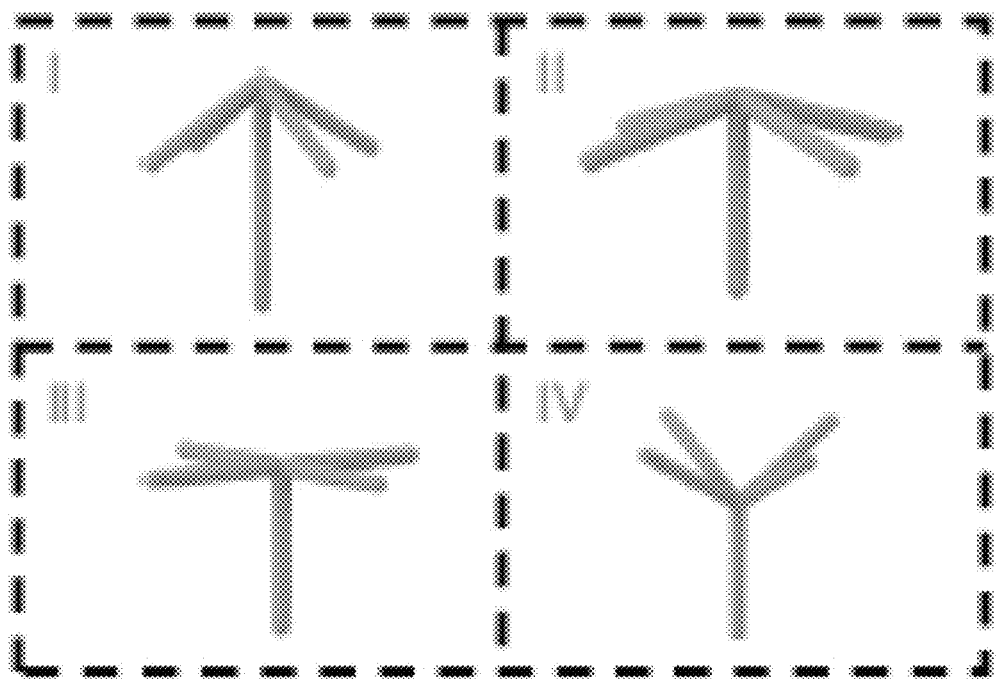
Figure 5D:
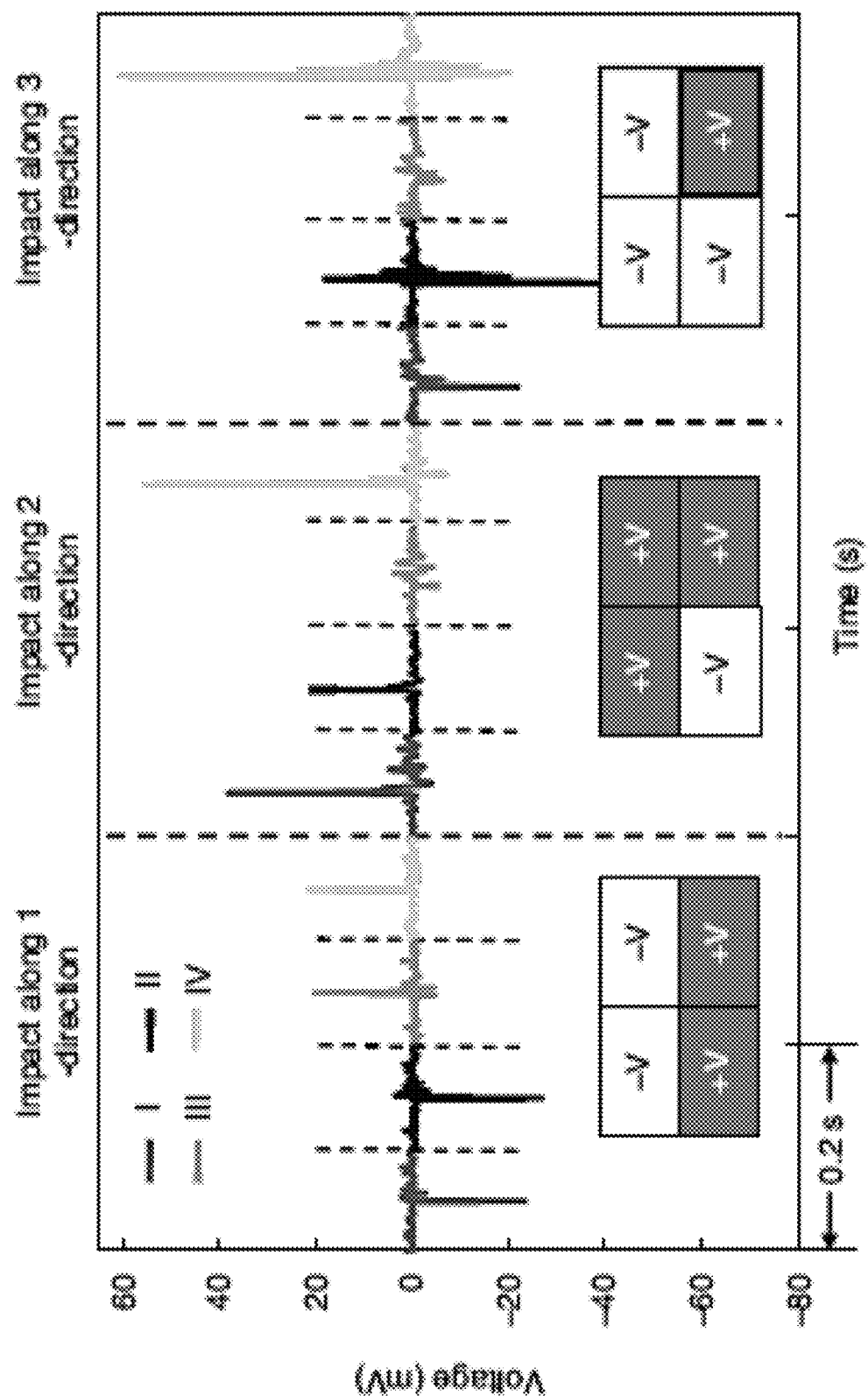
Figures 6A, 6B, 6C, 6D, 6E, 6F, 6G:
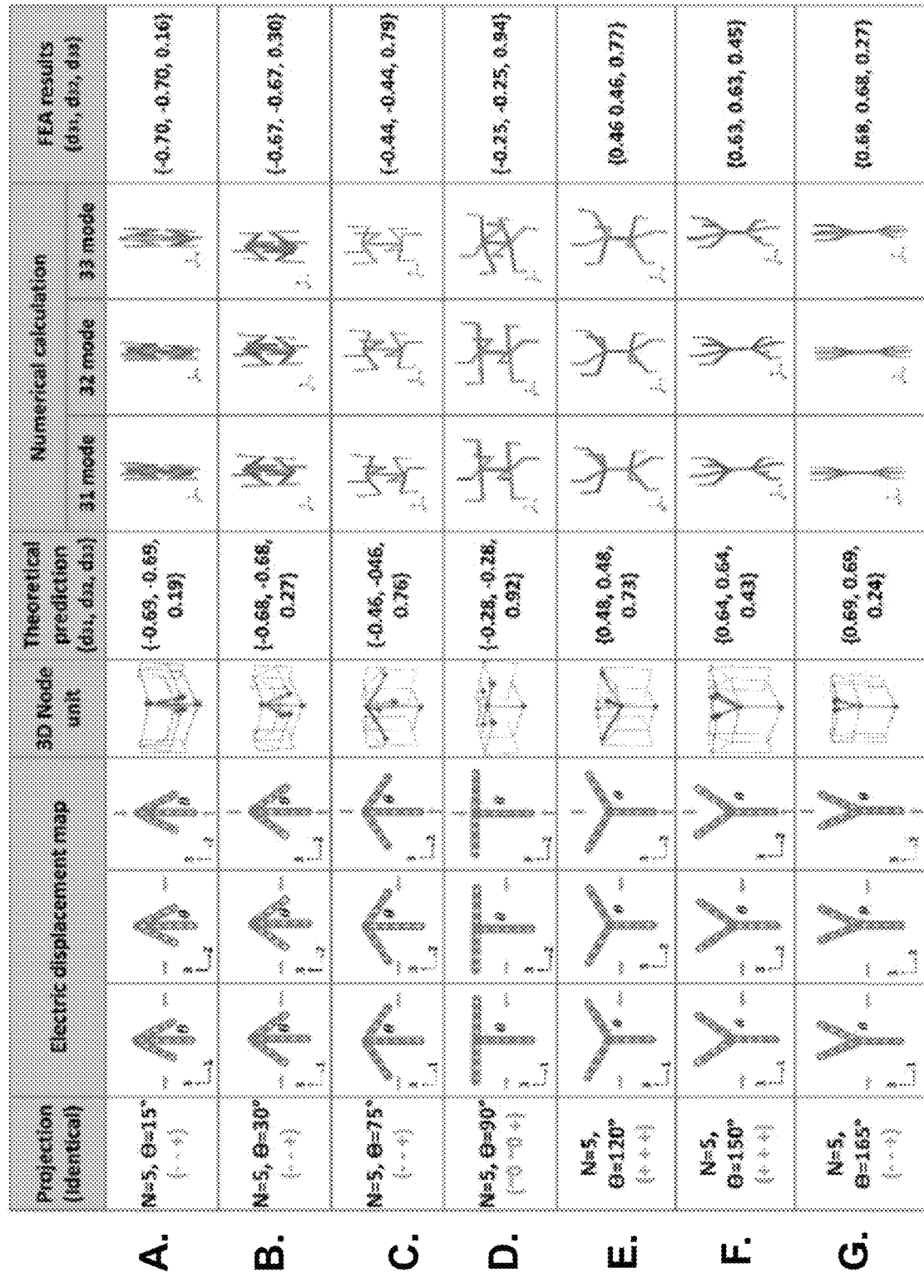
FIGS. 6A-6G show the comparison between analytical results, experiment results and numerical results of the N=5 lattices.

As a proof-of-concept demonstration of directionality sensing, we stacked a piezoelectric metamaterial infrastructure comprised of four cubic units with their unique, designed 3D piezoelectric signatures (FIGS. 5B-5C). The output voltage binary map uniquely registers the corresponding force direction. When impacted from the 1-, 2- and 3-directions (labelled I, II, III and IV in FIG. 5D), three distinct voltage outputs are detected, each correlated with the original respective impact direction (FIG. 5D). The impact force in the 1-direction is registered with permutation voltage matrix [−, −, +, +], with [+,+, −, +] for the 2-direction and [−, −, −, +] for the 3-direction, respectively (FIG. 5D). These digitalized, binary output voltage maps originated from the preconfigured piezoelectric constant signatures decode directionality of the impact as well as its magnitude.

This Example can demonstrate a method of designing electrical-mechanical coupling anisotropy and orientation effects, producing them via additive manufacturing (3D printing) of highly responsive piezo-electric materials. This can create the freedom to inversely design an arbitrary piezoelectric tensor, including symmetry conforming and breaking properties, transcending the common coupling modes observed in piezoelectric monolithic and foams. We see this work as a step towards rationally designed 3D transducer materials in which users can design, amplify or suppress any operational modes ($d_{nM}$) for target applications. Design and tessellation of the piezo-active units can lead to a variety of smart-material functionalities, including vector and tactile sensing, source detection, acoustic sensing and strain amplifications from a fraction of their parent materials. Whereas most 3D printing processes are capable of processing structural materials (polymer, metal or ceramics), multifunctional materials are particularly challenging owing to the inherent trade-off between processing compatibilities and functional properties. In this Example, covalent bonding of concentrated piezoelectric nanocrystals with entrapped ultraviolet-sensitive monomers allows the attainment of high piezoelectric coefficients at a given volume loading. The fabrication methods described and demonstrated herein can be extended to lead-based or lead-free piezoelectric ceramics (PZT, BTO and so on) and other functional materials, allowing high-fidelity printing of complex 3D functional architectures. These 3D-printed multifunctional materials, with simultaneously tuned structural and transduction properties throughout their micro-architectures, eliminate requirements for sensor array deployment, suggesting applications from soft, conformable transducers to rigid, energy-absorbing smart structures.

Methods.

Designing $d_{3M}$ based on unit cell patterns. We developed an analytical model to establish the relationship between the piezoelectric charge constant tensor and the projection pattern parameters. The effective piezoelectric charge constant $d_{nkL}$ is defined to correlate the induced effective electric displacement $D_n$ of a 3D unit cell with applied stress $\sigma_{KL}$ as follows:

$$D_n = d_{nKL}\sigma_{KL} \quad \text{(Eq. 1)}$$

$D_n$, $d_{nkL}$ and $\sigma_{KL}$ represent the effective electric displacement field, the effective piezoelectric charge constant tensor, and externally applied stress field defined in the global 1-2-3 system, respectively (FIG. 1A, n, K, L=1-3). The $d_{nkL}$ of a node unit was computed under applied stress by collecting and volume-averaging the electric displacement contributions $D_n^{(i)}$ and stress in equilibrium with $\sigma_{KL}$ from all strut members $L_i$:

$$\begin{cases} D_n = \dfrac{1}{V}\sum_{i=1}^{N}\int_{V_i} D_n^{(i)} dV_i \\ \sigma_{KL} = \dfrac{1}{V}\sum_{i=1}^{N}\int_{V_i} \delta_{Kk}\delta_{Ll}\sigma_{kl}^{(i)} dV_i \end{cases} \quad \text{(Eq. 2)}$$

where $V_i$ is the volume of the ith strut; V is the effective volume of the node unit cell; $\sigma_{kl}^{(i)}$ is the stress state of the ith strut in the global 1-23 system, respectively, and k,l=1-3; $\delta_{Kk}$ and $\delta_{Ll}$ represent the Kronecker delta to identify the stress components that are in equilibrium with the externally applied load. A local beam coordinate system x-y-z was introduced for struts (FIG. 9), and relate the stress in the global 1-2-3 system $\sigma_{kl}^{(i)}$ and local x-y-z system; $\sigma_{pq}^{(i)}$ by a linear transformation operator containing strut orientation information:

$$\sigma_{kl}^{(i)} = N_{kp}^{(i)}\sigma_{pq}^{(i)}(N_{lq}^{(i)})^T \quad \text{(Eq. 3)}$$

where p,q=x, y, z and $N^{(i)}$ represents the coordinate system transformation matrix containing components with respect to the projection pattern angle ($\theta j$, j=1-3)[13] and has the form:

$$N^{(i)} = \begin{bmatrix} \cos\theta_2 & 0 & \sin\theta_2 \\ 0 & 1 & 0 \\ \sin\theta_2 & 0 & -\cos\theta_2 \end{bmatrix} \begin{bmatrix} 1 & 0 & 0 \\ 0 & \cos\theta_1 & \sin\theta_1 \\ 0 & \sin\theta_1 & -\cos\theta_1 \end{bmatrix} \begin{bmatrix} \cos\theta_3 & \sin\theta_3 & 0 \\ \sin\theta_3 & -\cos\theta_3 & 0 \\ 0 & 0 & 1 \end{bmatrix} \quad \text{(Eq. 4)}$$

Substituting equation (3) into equations (1) and (2) yields the expression of the effective charge constants $d_{nkL}$:

$$\begin{aligned} d_{nKL} &= \frac{D_n}{\sigma_{KL}} \\ &= \frac{\sum_{i=1}^{N} A_i|L_i|d_{nkl}N_{kp}^{(i)}\sigma_{pq}^{(i)}(N_{lq}^{(i)})^T}{\sum_{i=1}^{N} A_i|L_i|\delta_{Kk}\delta_{Ll}N_{kp}^{(i)}\sigma_{pq}^{(i)}(N_{lq}^{(i)})^T} \\ &= \frac{\sum_{i=1}^{N} d_{nkl}N_{kp}^{(i)}\sigma_{pq}^{(i)}(N_{lq}^{(i)})^T}{\sum_{i=1}^{N} \delta_{Kk}\delta_{Ll}N_{kp}^{(i)}\sigma_{pq}^{(i)}(N_{lq}^{(i)})^T} \end{aligned} \quad \text{(Eq. 5)}$$

where $A_i$ and $|L_i|$ are the area of the cross-section and length of the ith strut, respectively. These two variables are assumed to be the same for all struts in the node unit.

This allows the design of $d_{nkL}$—or equivalently in Voigt notation, $d_{nM}$—according to the projection pattern configurations (by convention, KL→M: 11→1; 22→2; 33→3; 12→4; 13→5; 23→6). Application of the method was demonstrated by designing $d_{nM}$ according to the relative orientation 0 between the projected struts (see also e.g. below and FIGS. 6A-9). Here, to convert the tensor notation (KL→M), the coordinate system transformation matrix N (i) (3×3 dimensions) is expanded and rearranged to form the stress transformation matrix T (i) (6×6 dimensions).

Surface functionalized piezoelectric particles. All chemicals were purchased from Sigma-Aldrich and used as received. For functionalization, 0.6 g of PZT was ultrasonically dispersed (VWR Scientific Model 75 T Aquasonic, at about 90 W and about 40 kHz) in 50 g of deionized water with 1.049 g glacial acetic acid for 2 h. To this 1.049 g of 3-(trimethoxysilyl) propyl methacrylate (TMSPM) was added. The mixture was then refluxed while stirring. Particles were cleaned by centrifugation, followed by discarding the supernatant, and then dispersed in ethanol for at least two cycles. Particles were dried overnight under vacuum or gentle heat. The resulting 3D-printable functionalized PZT nanocomposites achieved a controlled volume loading from 2.5 vol % to 50 vol % (equivalent to 16 wt % to 88 wt %).

High-resolution projection stereolithography. The functionalized particles were sonicated in acetone and mixed with photosensitive resin for 3D printing; the acetone was then evaporated by gentle heat and stirring. High-resolution, large-area stereolithography systems were used for the piezoelectric architected material fabrication. The 3D printing configurations for processing these colloidal piezoelectric feedstocks with a range of loading concentrations are described elsewhere herein (FIGS. 14A-16B). The 3D models were built and sliced into 2D images using design method described in Zheng et al. 2016.[14] and Netfabb[15]. These 2D images are used to pattern light from a near-ultraviolet light-emitting diode (LED) using a programmable dynamic photomask. A reductive lens is used to isotropically reduce the near-ultraviolet light pattern to the desired length scale. A larger area build is generated by scanning and reflecting the light patterns within the horizontal x-y plane while maintaining the resolution (FIG. 2C). Aligned with the optics is a substrate, which can be coated with the functionalized ultraviolet-sensitive colloidal paste to a controlled thickness. When illuminated, the colloid replicates the 2D image as a solid layer bound to the substrate or any previous layers. Recoating of the now-solidified layers and the substrate with the colloidal solution, followed by additional exposures from subsequent 2D image slices and synchronized movement of the precision stage, builds the 3D part with complex architectures. The as-fabricated piezoelectric lattices were measured to have strut thickness variation within 3% via X-ray microtomography using the method described in Liu et al.[16]

Figure 21:
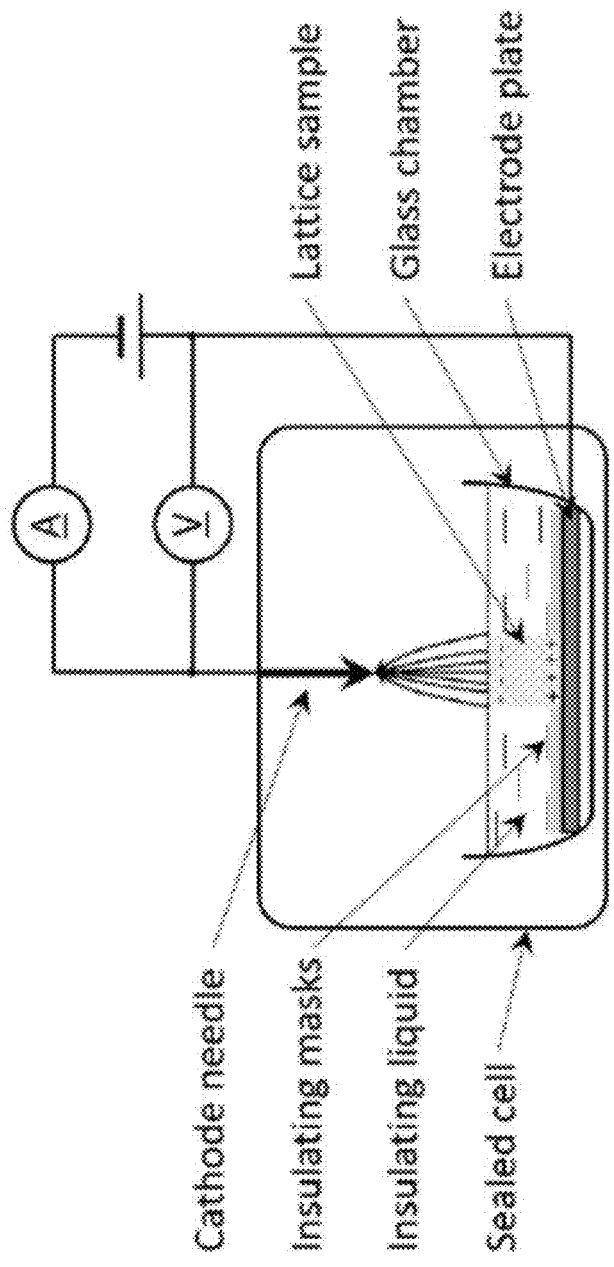
FIG. 21 shows a schematic of the experimental setup for the corona poling.

Poling of the piezoelectric metamaterials. The corona poling method was used to pole the as-fabricated samples (FIG. 21). The samples were placed on a planar electrode connected to a high-voltage power supply (Glassman High Voltage Inc., Series EK) and poled under 32 kV at room temperature for 1 h. The experimental setup was also equipped with a digital multimeter (Agilent 34410 A) for measuring the current through the sample under voltage. To avoid screening of the bottom electrode, we kept samples inside highly insulating liquids (details elsewhere herein and in, e.g., FIGS. 21-22B).

Characterization of the piezoelectric metamaterials. To evaluate the effective piezoelectric charge constants, a piezoelectric testing fixture was set up to record the voltage output of the samples with loads being applied. The electric charges generated from the samples were calculated by multiplying the voltage output by the capacitance of the circuit (FIG. 24B). The instrument was fully calibrated using two commercial PZT cylindrical samples with piezoelectric coefficients of 540 pC $N^{-1}$ and 175 pC $N^{-1}$ respectively (FIG. 24A). The effect of triboelectrification was eliminated by comparing the measurements before and after polarizations (FIG. 24B). To measure the signatures of the voltage output directly, a resistor with 40 MΩ resistance was connected to the sample and the voltage was directly measured from both ends of the resistor.

Finite element analysis. ABAQUS 6.1450 was used to conduct the finite element analysis. The base material properties used are summarized in elsewhere herein and FIG. 34. A ten-node quadratic piezoelectric tetrahedron (C3D10E) element was used to mesh the unit cells. Four degrees of freedom are allowed at each node: three translational degrees of freedom and one electrical potential degree of freedom. Periodic boundary conditions were applied to the node unit to capture the complete electromechanical response of the metamaterials[17]. Stresses are applied on the surfaces perpendicular to the 1-, 2- or 3-directions individually to calculate $d_3M$. Low strain and low linear deformation are also ensured.

Quantification of the difference between theoretical prediction and FEA results. Theoretical prediction of the dimensionless d constants. The analytical results of the N=5 structure were calculated with different relative orientations of projected struts denoted in manuscript. To determine the analytical results of $d_{3M}$, the analytical model in the as previously discussed. The effective electric displacement and effective stress are:

$$D_n^{eff} = \frac{1}{V}\sum_{i=1}^{N}\int_{V_i} D_n^{(i)} dV_i \qquad \text{(Eq. 6)}$$

$$\sigma_{KL}^{eff} = \frac{1}{V}\sum_{i=1}^{N}\int_{V_i} \delta_{Kk}\delta_{Ll}\sigma_{kl}^{(i)} dV_i \qquad \text{(Eq. 7)}$$

Where $\sigma_{kl}^{(i)}$ and $D_n^{(i)}$ (n k l=1, 2, 3) are, respectively, the stress matrix and electric displacement vector of each strut in the global coordinate system, V and Vi are, respectively, the volume of the unit cell and of the i-th strut. According to Eq. 1, $d_{3M}^{eff}$ in matrix becomes:

$$\begin{Bmatrix} d_{31}^{eff} \\ d_{32}^{eff} \\ d_{33}^{eff} \end{Bmatrix} = \begin{Bmatrix} \frac{D_3^{eff}}{\sigma_{11}} \\ \frac{D_3^{eff}}{\sigma_{22}} \\ \frac{D_3^{eff}}{\sigma_{33}} \end{Bmatrix} \qquad \text{(Eq. 8)}$$

Figure 7A:
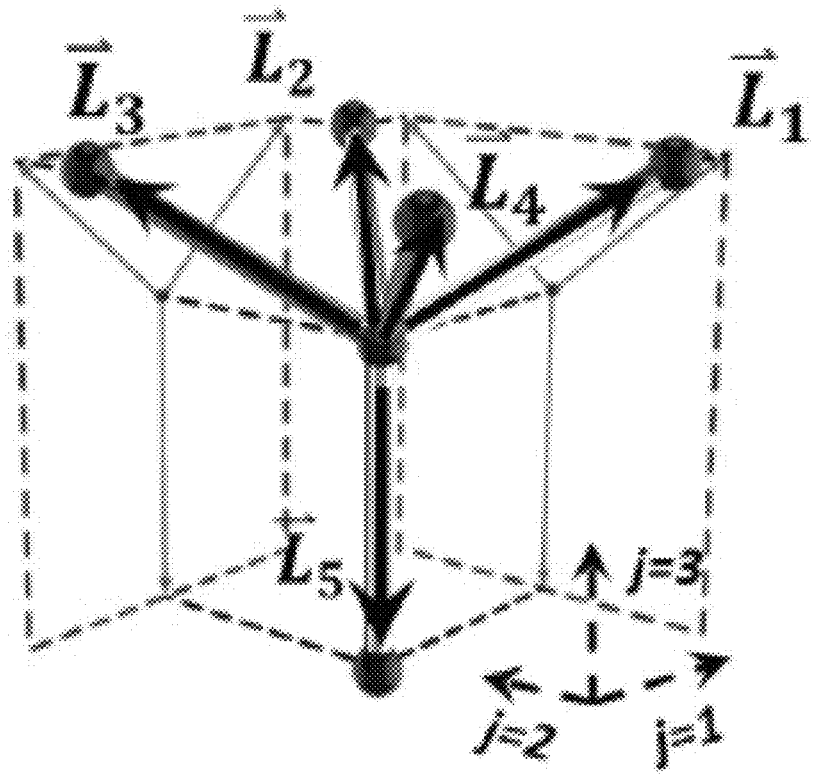
FIGS. 7A-7B show (FIG. 7A) Schematic of the N=5 design and (FIG. 7B) a schematic of a single strut with two coordinate systems.

As shown in FIGS. 6A-6G, the architecture design with symmetric constraints (e.g., same projection pattern in 1-3 and 2-3 plane) significantly reduces the complexity of Eq. (6) and Eq. (7) by grouping identical struts (i.e., identical electric displacement contribution, identical strut length, diameter, and cross-sectional shape). This allows the evaluation of the contribution of different type of struts to effective electric displacement field. As shown in FIG. 7A, two groups of identical struts are identified: i). strut parallel to 3-axis ($\vec{L}_5$); ii) struts that are not parallel to the 3-axis ($\vec{L}_1$, $\vec{L}_2$, $\vec{L}_3$, $\vec{L}_4$). It is therefore sufficient to represent the group by one strut in each group.

Figure 7B:
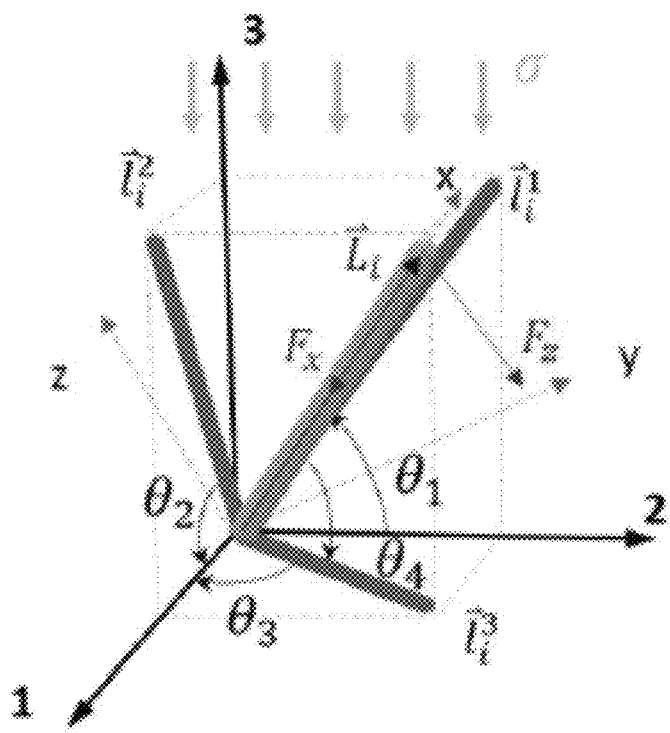

A closed-form expression of effective piezoelectric charge constant d was derived as a function of spatial orientations of ligaments within a unit cell. We started from force equilibrium of a single strut and established a local coordinate system (x-y-z coordinate system) and the global coordinate system (1-2-3). The parameters of these two-coordinate systems are shown in FIG. 7B. The x-axis of the local coordinate system is parallel to strut space vector $\vec{L}$ i. The axial stress σxy is firstly calculated in the local coordinate system (x-y-z), and then transformed to the global coordinate system $\sigma_{kl}^{(i)}$(k,l=1,2,3). The correlation between the stress matrix in the local coordinate system and the global coordinate system is achieved through the transformation matrix $N^i$ as:

$$\sigma_{kl}^{(i)} = N^i \sigma_{pq}^{(i)} (N^i)^T \qquad \text{(Eq. 9)}$$

Similarly, the electrical displacement contribution of each strut can be expressed as:

$$D_n^{(i)} = d_{nkl}\sigma_{kl}^{(i)} = d_{nkl}N^i\sigma_{pq}^{(i)}(N^i)^T \qquad \text{(Eq. 10)}$$

Hence, the expression of the transformation matrix $N^i$ correlating the local coordinate system to the global coordinate system to calculate the effective electrical displacement $D_n^{eff}$ and effective stress $D_{KL}^{eff}$ and further, calculate the effective charge constants.

According to Euler's rotation theorem, any coordinate system transformation may be described using three angles. In this situation, the force components that we considered is an axial force (F x), which is in alignment with strut space vector $\vec{L}_i$, and shear force (F z), which is perpendicular to the strut space vector $\vec{L}_i$. Here, we derive the transformation matrix via rotating the 1-axis of the global coordination system such that it overlaps with the x-axis of the local coordinate system of a single strut $\vec{L}_i$ and then define the rest of the coordinates. By doing this, the transformation matrix for $1^{st}$-$4^{th}$ and $5^{th}$ strut can be written as:

$$\begin{bmatrix} N^i_{11} & N^i_{12} & N^i_{13} \\ N^i_{21} & N^i_{22} & N^i_{23} \\ N^i_{31} & N^i_{32} & N^i_{33} \end{bmatrix} = \begin{bmatrix} \cos\theta_3\cos\theta_4 & -\sin\theta_3 & -\cos\theta_3\sin\theta_4 \\ \sin\theta_3\cos\theta_4 & \cos\theta_3 & -\sin\theta_3\sin\theta_4 \\ \sin\theta_4 & 0 & \cos\theta_4 \end{bmatrix} \quad \text{(Eq. 11)}$$

$$\begin{bmatrix} N^5_{11} & N^5_{12} & N^5_{13} \\ N^5_{21} & N^5_{22} & N^5_{23} \\ N^5_{31} & N^5_{32} & N^5_{33} \end{bmatrix} = \begin{bmatrix} 0 & 0 & 1 \\ 0 & 1 & 0 \\ -1 & 0 & 0 \end{bmatrix} \quad \text{(Eq. 12)}$$

For $D_{33}^{eff}$, regrouping Eq. 6 and Eq. 7 by identical struts yields $$D_3^{eff} = \frac{1}{V}\{d_{31}d_{32}d_{33}\}\left(4A_1|L_1|\begin{Bmatrix}\sigma^1_{11}\\\sigma^1_{22}\\\sigma^1_{33}\end{Bmatrix} + A_5|L_5|\begin{Bmatrix}\sigma^5_{11}\\\sigma^5_{22}\\\sigma^5_{33}\end{Bmatrix}\right) \quad \text{(Eq. 13)}$$

$$\sigma_{33} = \frac{1}{V}(4A_2|L_2|\sigma^1_{33} + A_5|L_5|\sigma^5_{33}) \quad \text{(Eq. 14)}$$

Consider a remote compressive stress σ along z direction that is applied to the infinite lattice structure consists of the node unit. From force equilibrium, the total force applied on the node unit F can be given as:

$$F = 4\sigma L^2 \sin^2\theta_3 \cos^2\theta_4 \quad \text{(Eq. 15)}$$

Under this z-direction stress o, the vertical strut $\vec{L}_5$ is subject to normal stress, while other strut ($\vec{L}_1, \vec{L}_2, \vec{L}_3, \vec{L}_4$) are subject to a combination of normal and shear stresses. From equilibrium, the local stress matrix of strut group ($\vec{L}_1, \vec{L}_2, \vec{L}_3, \vec{L}_4$) is:

$$\sigma_{pq}^{(i)} = \frac{\sigma L^2}{A_1}\begin{bmatrix} \sin^2\theta_3\cos^2\theta_4\sin\theta_4 & 0 & \sin^2\theta_3\cos^3\theta_4 \\ 0 & 0 & 0 \\ \sin^2\theta_3\cos^3\theta_4 & 0 & 0 \end{bmatrix} \quad \text{(Eq. 16)}$$

Similarly, the local stress matrix of vertical strut ($\vec{L}5$) is:

$$\sigma_{pq}^{(5)} = \frac{4\sigma L^2}{A_5}\begin{bmatrix} \sin^2\theta_3\cos^2\theta_4 & 0 & 0 \\ 0 & 0 & 0 \\ 0 & 0 & 0 \end{bmatrix} \quad \text{(Eq. 17)}$$

By substituting Eq. (16) and (17) into Eq. (9), the global stress matrix is obtained. Then substitute Eq. (13) and (14) into Eq. (8), $d_{3M}^{eff}$ is obtained for the N=5 structure as:

$$d_{33}^{eff} = \frac{-\cos^2\theta_3\cos^2\theta_4\sin\theta_4 d_{31} - \sin^2\theta_3\cos^2\theta_4\sin\theta_4 d_{32} + (\sin\theta_4(1+\cos^2\theta_4)+1)d_{33}}{2+2\sin\theta_4} \quad \text{(Eq. 18)}$$

Similarly $d_{3M}^{eff}$ could be obtained as $$d_{31}^{eff} = \frac{-\cos^3\theta_3\cos^2\theta_4\sin\theta_4 d_{31} - \sin^2\theta_3\cos\theta_3\cos^2\theta_4\sin\theta_4 d_{32} + \cos\theta_3\sin\theta_4(1+\cos^2\theta_4)d_{33}}{2\sin\theta_3\cos\theta_4} \quad \text{(Eq. 19)}$$

Due to symmetry, $d_{31}^{eff} = d_{32}^{eff}$.

It should be noted that since the bending stress is symmetric to the neutral surface of the strut (integration of bending stress over cross-section area is zero), it does not contribute to the effective electric displacement and charge constants.

Electric Displacement Manipulation Via Screw Angle in 2D Projection Patterns.

As shown in FIGS. 7A-7B the plane angles θ1, θ2 and θ3 obtained from projection pattern as: θ1=θ2=θ−90°, θ3=45°. The space angle θ4 could be expressed as: θ4=arctan (√2 tan(θ−90°)). From the two equations above, all the angles θ1, θ2, θ3 and θ4 invoked in the analytical analysis could be tuned through adjusting angle θ in the projection pattern. Therefore, the stress matrix of each strut in the global coordinate system could be conveniently manipulated through configuring its orientation in the projection pattern. Subsequently, the effective electric displacement and effective charge constants are manipulated through the configuration of strut orientation in the projection patterns.

Comparison between the theoretical prediction and the FEA results. ABAQUS 6.14 was used to conduct the finite element analysis on all the designs shown in FIGS. 6A-6G. Comparison between analytical derivations and finite element analysis shows great agreement between the two. We listed the calculated results in FIGS. 6A-6G. The minimal difference between the analytical model and FEA result can be explained by the difference of stress calculation of vertical struts during calculation of $d_{31}^{eff}$ and $d_{32}^{eff}$. The axial stress on the vertical strut $\vec{L}_5$ is considered zero in the analytical derivation of equilibrium state (Yang, L., Harrysson, O., West, H. & Cormier, D. Mechanical properties of 3D re-entrant honeycomb auxetic structures realized via additive manufacturing. Int J Solids Struct 69-70, 475-490 (2015)), whereas the FEM analysis indicated the stress within vertical strut still takes approximately 5% of that of the diagonal strut ($\vec{L}_1, \vec{L}_2, \vec{L}_3, \vec{L}_4$) due to stress transferred from the node.

Benchmark with other modeling schemes and finite element models. The modeling scheme has been benchmarked with other modeling schemes as well as finite element models for specific cases. The benchmarking is presented in two parts: compare with other modeling scheme and compare with other finite element models on established geometries.

Comparison with Other Modeling Schemes.

The approach described herein was first benchmarked with other modeling schemes on a classic, bulk piezoelectric composite. One of the commonly used modeling approaches is the micromechanics theory for composite. Micromechanics theory (Huang, J. H. & Kuo, W. S. Micromechanics determination of the effective properties of piezoelectric composites containing spatially oriented short fibers. Acta Mater 44, 4889-4898 (1996)) invoked in previous literature has been utilized for several problems, including the uncoupled mechanical and electric behavior of composites (Glushanin, S., Topolov, V. Y. & Krivoruchko, A. V. Features of piezoelectric properties of 0-3 PbTiO3-type ceramic/ polymer composites. Mater Chem Phys 97, 357-364 (2006)) and coupled electroelastic property of composites. In this method, the effective electroelastic moduli are obtained by considering the volume average of piezoelectric field variables.

This Example here utilizes the approach described herein to analyze effective charge displacement and compare it with a classical 3-3 piezoelectric composite model that has been widely studied by Bowen et al (Integr Ferroelectr 32, 1025-1034 (2001)), and Rittenmyer et al. (Ferroelectrics 41, 323-329 (1982)) using the volume averaging approach. The structure of the piezoelectric composite is sketched in FIGS. 10A-10B. The composite consists of two phases: active PZT ceramics and inactive polymer. The referenced approach assumes that the piezoelectric material parallel to the poling direction (z-direction) is fully poled (as indicated by the shaded volumes in FIG. 10A). The remaining columns perpendicular to the poling direction (x-direction and y-direction) are considered unpoled.

In the volume averaging model, the effective charge constant is the summation of the product of each phase's charge constant and its volume fraction within the composite. Rittenmyer et.al[5] derived the effective piezoelectric charge constant of the classical composite shown in FIGS. 10A-10F as:

$$d_{33}^{eff} = \frac{v^{d33PZT} d_{33}^{PZT}}{v^{d33PZT} + (1-v^{d33PZT})\frac{S_{33}^{PZT}}{S_{33}^{polymer}}}$$ (Eq. 20)

$$d_{31}^{eff} = v^{d31PZT} d_{31}^{PZT}$$ (Eq. 21)

where $S_{33}^{PZT}$ and $S_{33}^{polymer}$ are, respectively, the compliance of PZT ceramic and polymer, $v^{d33PZT}$ and $v^{d31PZT}$ are volume fraction of PZT ceramic that contributes to $d_{33}^{eff}$, $d_{31}^{eff}$, respectively. This classical composite model was then analyzed using the modeling scheme described here via deriving the effective electric displacement {D} distribution. In the case shown in FIGS. 10A-10B, only the poled piezoelectric portion (shaded volume in FIGS. 10A-10B) contributes to the electric displacement. Meanwhile, the only stress component for PZT ceramic and polymer are $\sigma_{33}^{PZT}$ and $\sigma_{33}^{polymer}$. Hence, Eq. 2, combined with piezoelectric properties of the base material of each ligament in the Materials and Methods section can be rewritten as:

$$D_3^{eff} = \frac{L^2(L+l_1)\sigma_{33}^{PZT} d_{33}^{PZT}}{(L+l_1)(L+l_2)^2}$$ (Eq. 22)

where $l_1$, $l_2$ and L are defined as the length and width of the columns, as shown in FIGS. 10A-10F. Simplify Eq. 22 and replace $\sigma_{33}^{PZT}$ with compliance, $S_{33}^{PZT}$, and strain $\varepsilon_{33}$, the following is obtained:

$$D_3^{eff} = \frac{v^{d33PZT}}{S_{33}^{PZT}} d_{33}^{PZT} \varepsilon_{33}$$ (Eq. 23)

$$\sigma_{33}^{eff} = \left(\frac{v^{d33PZT}}{S_{33}^{PZT}} + \frac{1-v^{d33PZT}}{S_{33}^{polymer}}\right)\varepsilon_{33}$$ (Eq. 24)

-continued

The effective charge constant $d_{33}^{eff}$ is:

$$d_{33}^{eff} = \frac{v^{d33PZT} d_{33}^{PZT}}{v^{d33PZT} + (1-v^{d33PZT})\frac{S_{33}^{PZT}}{S_{33}^{polymer}}}$$ (Eq. 25)

Similarly, $d_{31}^{eff}$ is calculated as:

$$d_{31}^{eff} = v^{d31PZT} d_{31}^{PZT}$$ (Eq. 26)

Therefore, the effective charge constants derived from our analytical model is identical to the one given in the reference using the benchmark approach. This benchmarking verifies the validity of the analytical modeling scheme via calculating the effective electric displacement.

Figures 10A, 10B:
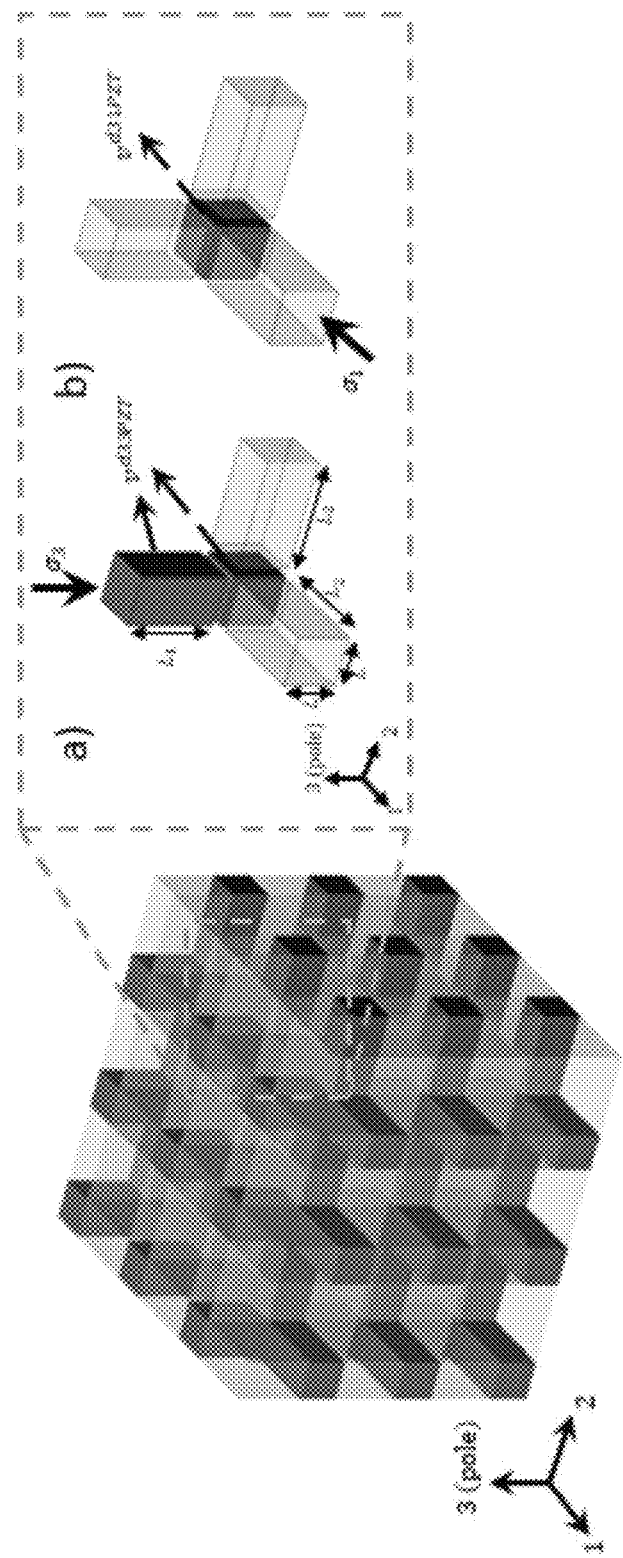
FIGS. 10A-10F show (FIGS. 10A-10B) the lattice and unit cell model of the piezoelectric composite. The shaded volumes in (FIG. 10A) indicate struts contributing to effective permittivity and d33 of the composite. The shaded volume in (FIG. 10B) indicates struts contributing to the d31 coefficient of the composite.
Figure 10C:
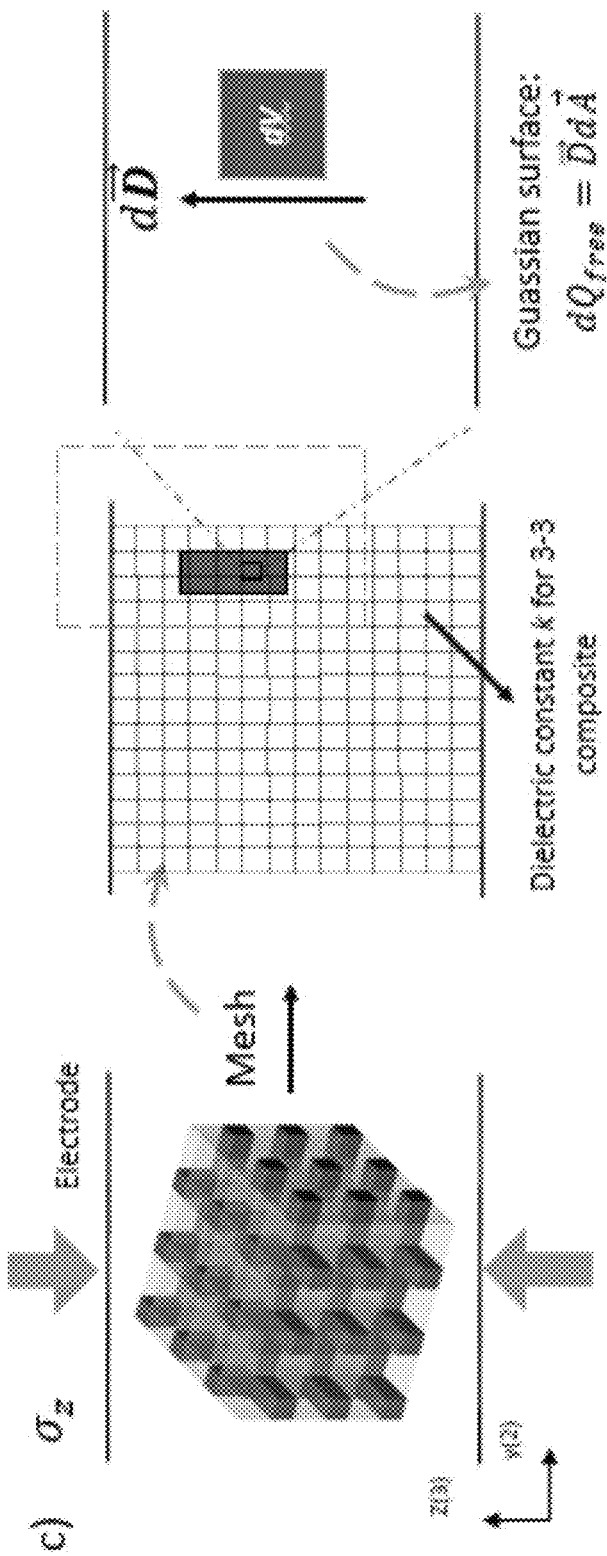
Figures 10D, 10E, 10F:
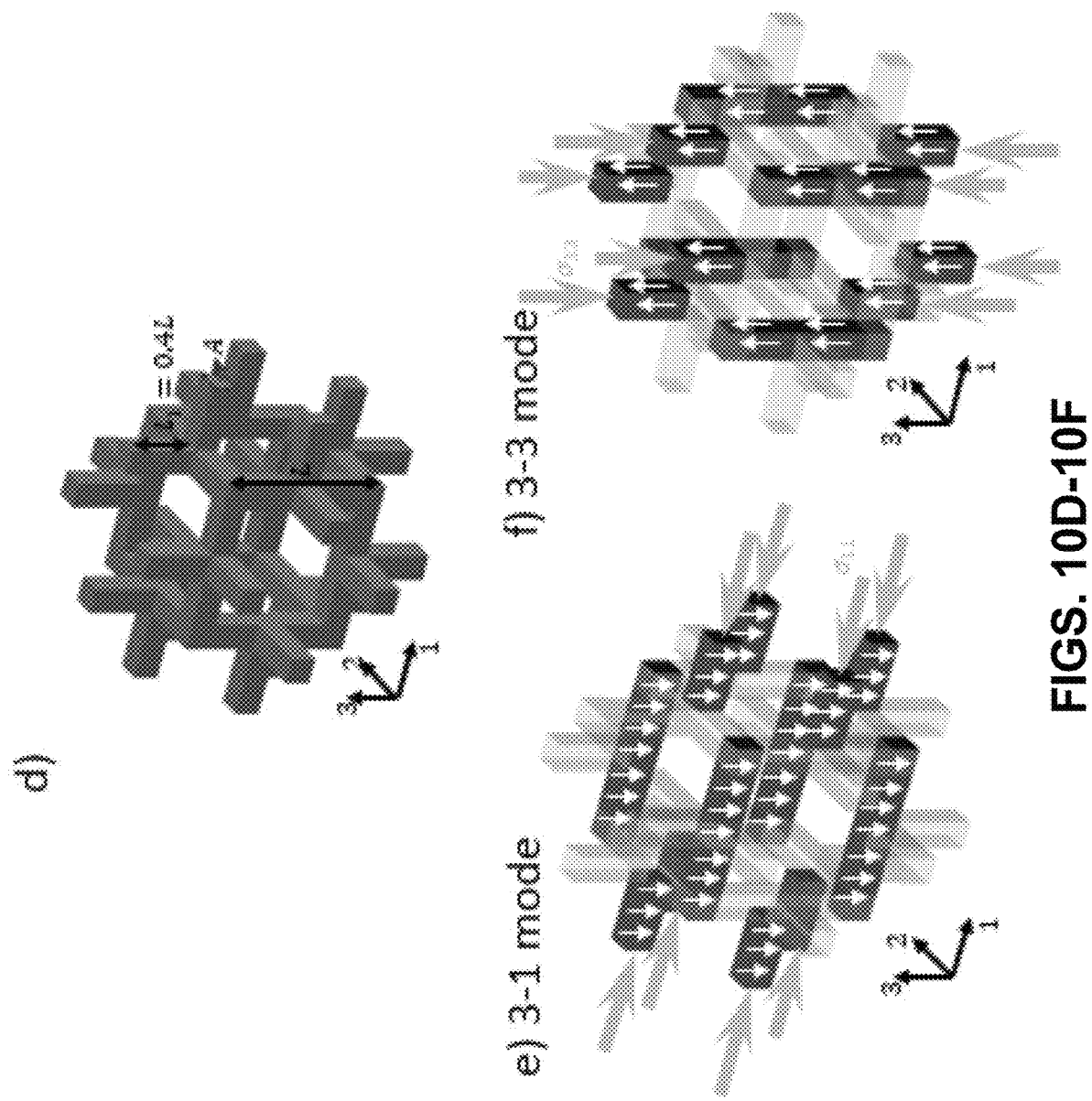

Compare with other finite element models. The analytical approach described herein was also benchmarked with an existing finite element model on piezoelectric open foam. Challagulla and Venkatesh (Acta Mater 60, 2111-2127 (2012). developed a numerical model based on an idealized unit cell to characterize the complete electro-mechanical response for porous piezoelectric foams. The idealized unit cell model is shown in FIG. 10D. All the shaded ligaments are PZT phase and the remaining volume of the unit cell is porosity. Cross-section areas of all ligaments, A, are the assumed to be uniform. Poling direction is 3-direction in FIG. 10D. Based on the numerical results in the paper, the normalized charge constant vector is $\{\bar{d}_{31}\ \bar{d}_{32}\ \bar{d}_{33}\}=\{-0.348\ -0.348\ 0.870\}$.

Here, this open-cell model was analyzed using the analytical modeling scheme described herein on calculating effective charge displacement contributions from ligaments. The portion of the piezoelectric material that contributes to electrical displacement in calculating $d_{31}$ and $d_{33}$ are the shaded volumes shown in FIGS. 10E and 10F, respectively. Electric charge displacement maps from the unit cell patterns are plotted as white arrows in the shaded ligament.

For $d_{31}^{eff}$, assume a uniform stress $\sigma_{11}$ is applied in 1-direction. The stress component on shaded ligaments is $\sigma_{11}$. The effective electrical displacement is calculated as:

$$D_3^{eff} = \frac{1}{V}\sum_{i=1}^{N}\int_{V_i} D_3^{(i)} dV_i$$ (Eq. 27)

where $L_i$ and L are defined as the length of the struts, as shown in FIGS. 10A-10F. The effective stress is $$\sigma_{11}^{eff} = \sigma_{11}$$ (Eq. 28)

Hence, the $d_{31}^{eff}$ is calculated as:

$$d_{31}^{eff} = \frac{4A d_{31}}{(2L_i + L)^2}$$ (Eq. 29)

Due to symmetry, $d_{32}^{eff} = d_{31}^{eff}$. Similarly, $$d_{33}^{eff} = \frac{4A d_{33}}{(2L_i + L)^2}$$ (Eq. 30)

The dimensionless charge constant vector calculated from our analytical modeling scheme is $\{\bar{d}_{31}\ \bar{d}_{32}\ \bar{d}_{33}\}=\{-0.332\ -0.332\ 0.883\}$, matching reasonably close to the finite element model used in the benchmark literature[6].

Expanded Architectures and their $d_{3M}$ Distributions.

Figure 8A:
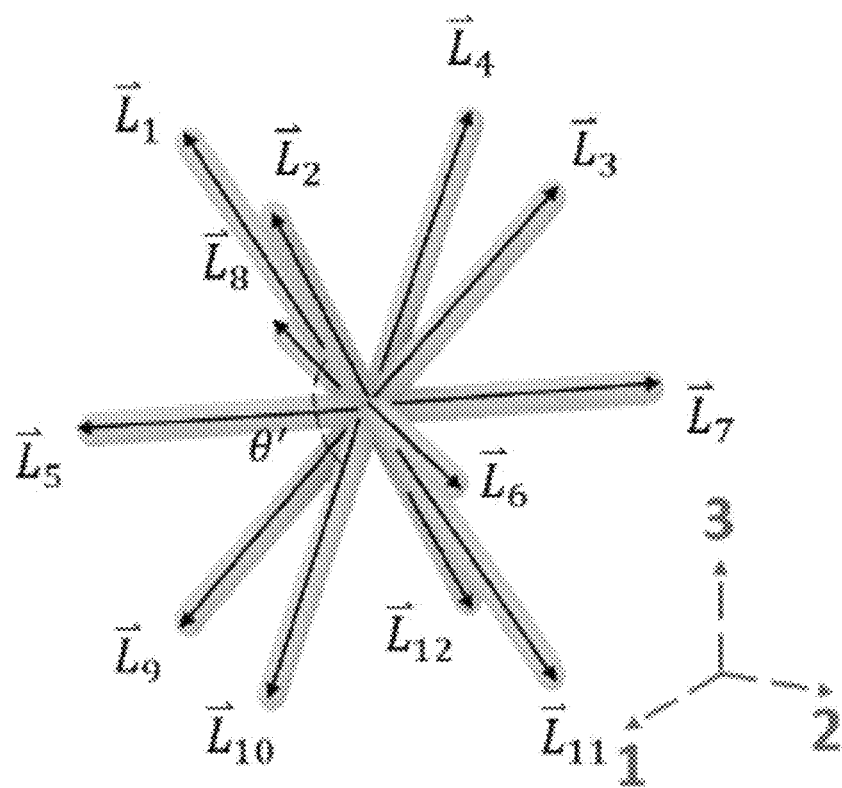
FIGS. 8A-8B show (FIG. 8A) N=12 designs with its corresponding projection patterns (FIG. 8B) on 2-3 plane for analytical calculation.
Figure 8B:
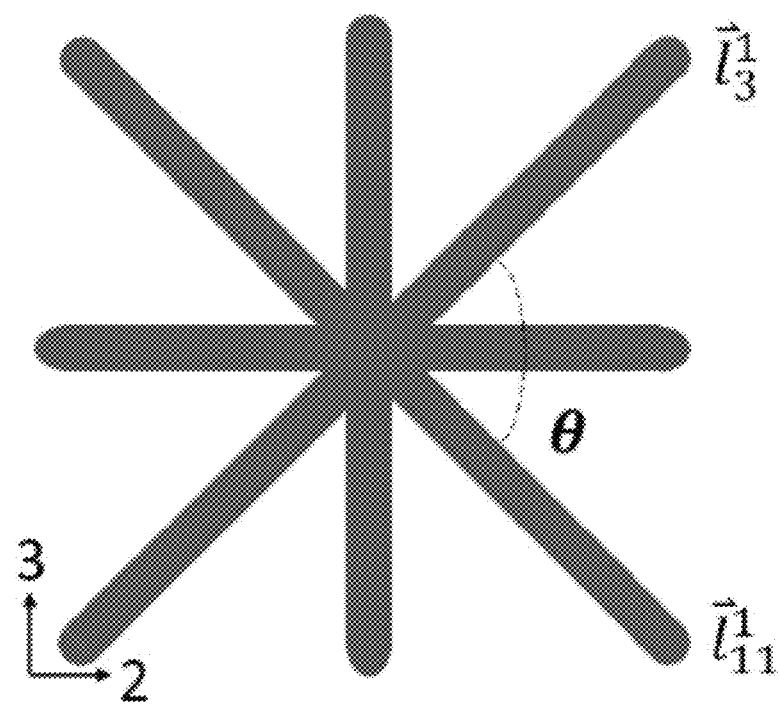
Figure 9:
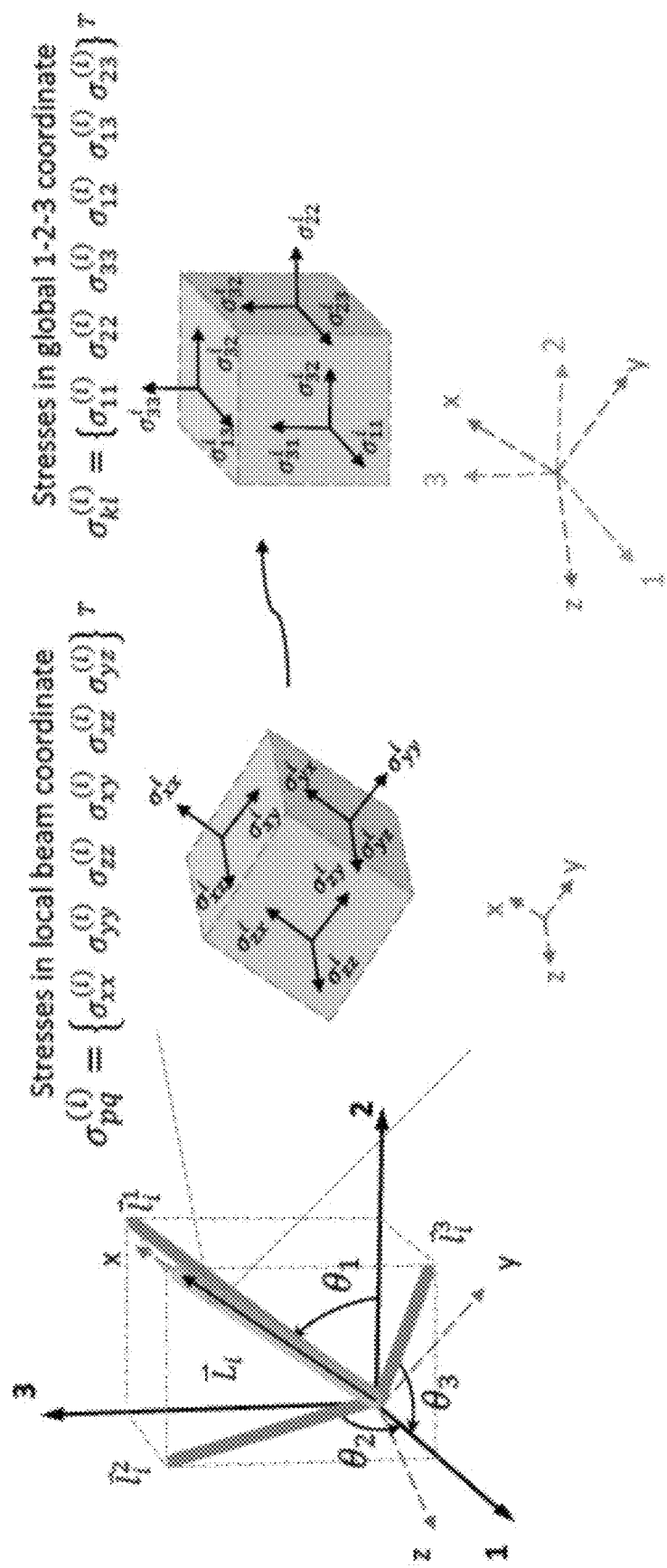
FIG. 9 shows a 3D strut defined in global and local coordinate systems for developing unit node model.

The design scheme was also demonstrated and the distribution of $d_{3M}^{eff}$ of N=12 structure was calculated, as shown in FIGS. 8A-8B. We denoted the local and global stresses of each strut in vector form. The stretching-dominated deformation mechanism gives rise to negligible bending and shear stresses, it is easier to express the local and global stresses in vector form. To determine $d_{3M}^{eff}$, rewriting Eq. 2 in a matrix form and in terms of strut stress for the convenience of analytical calculation, the following is obtained:

$$D_3^{eff} = \frac{1}{V}\sum_{i=1}^{N} A_i \quad \text{(Eq. 31)}$$

$$|\vec{L}_i|\cdot[d_{31}^i\ d_{32}^i\ d_{33}^i\ d_{34}^i\ d_{35}^i\ d_{36}^i]\begin{bmatrix}T_{11}^i & T_{12}^i & \cdots & T_{16}^i \\ T_{21}^i & T_{22}^i & \cdots & T_{26}^i \\ \vdots & \vdots & \ddots & \vdots \\ T_{61}^i & T_{62}^i & \cdots & T_{66}^i\end{bmatrix}\begin{Bmatrix}\sigma_{xx}^i \\ \sigma_{yy}^i \\ \sigma_{zz}^i \\ \sigma_{xy}^i \\ \sigma_{xz}^i \\ \sigma_{yz}^i\end{Bmatrix}$$

$$\begin{Bmatrix}\sigma_{11} \\ \sigma_{22} \\ \sigma_{33} \\ \sigma_{12} \\ \sigma_{13} \\ \sigma_{23}\end{Bmatrix} = \frac{1}{V}\sum_{i=1}^{N}A_i|\vec{L}_i|\cdot\begin{bmatrix}T_{11}^i & 0 & \cdots & 0 \\ 0 & T_{22}^i & \cdots & 0 \\ \vdots & \vdots & \ddots & \vdots \\ 0 & 0 & \cdots & T_{66}^i\end{bmatrix}\begin{Bmatrix}\sigma_{xx}^i \\ \sigma_{yy}^i \\ \sigma_{zz}^i \\ \sigma_{xy}^i \\ \sigma_{xz}^i \\ \sigma_{yz}^i\end{Bmatrix} \quad \text{(Eq. 32)}$$

where $\{\sigma_{xx}^i\ \sigma_{yy}^i\ \sigma_{zz}^i\ \sigma_{xy}^i\ \sigma_{xz}^i\ \sigma_{yz}^i\}^T$ is the vector form in terms of the local coordinate of $\sigma_{pq}^i$, and $T^i$ is the stress transformation matrix from the local coordinate system to the global coordinate system (FIG. 9). The architecture design with symmetric constraints significantly reduces the complexity of Eq. (32) and Eq. (33) by grouping identical struts (i.e. identical electric displacement contribution, identical strut length, diameter and cross-sectional shape). This allows the evaluation of contribution of different types of struts to the effective electric displacement field. Finally, according to Eq. (1), $d_{3M}^{eff}$ in matrix form becomes:

$$\begin{Bmatrix}d_{31}^{eff} \\ d_{32}^{eff} \\ d_{33}^{eff}\end{Bmatrix} = \begin{Bmatrix}\dfrac{D_3^{eff}}{\sigma_{11}} \\ \dfrac{D_3^{eff}}{\sigma_{22}} \\ \dfrac{D_3^{eff}}{\sigma_{44}}\end{Bmatrix} \quad \text{(Eq. 33)}$$

For N=12 structure, only axial stresses are considered due to its stretch-dominated nature. Eq. 31-33 then lead to the results of $d_{3M}^{eff}$ (only M=1, 2, 3 is of interest) of N=12 structure. For $d_{31}^{eff}$, the parent material piezoelectric charge constants are identical for each strut (FIG. 31). Eq. 31 and 32 then reduce to:

$$D_3^{eff} = \frac{1}{V}\sum_{i=1}^{12} A_i|\vec{L}_i|\cdot(d_{31}T_{11}^i + d_{32}T_{21}^i + d_{33}T_{31}^i)\sigma_{xx}^i \quad \text{(Eq. 34)}$$

$$\sigma_{11} = \frac{1}{V}\sum_{i=1}^{N} A_i|\vec{L}_i|\cdot T_{11}^i\sigma_{xx}^i \quad \text{(Eq. 35)}$$

Three groups of identical struts are identified (FIG. 8A): i) struts parallel to 1-3 plane subjected to axial compression ($\vec{L}_2$, $\vec{L}_4$, $\vec{L}_{10}$, $\vec{L}_{12}$); and ii) struts parallel to 1-2 plane subjected to axial compression ($\vec{L}_5$, $\vec{L}_6$, $\vec{L}_7$, $\vec{L}_8$); iii) struts parallel to 2-3 plane subjected to axial tension ($\vec{L}_1$, $\vec{L}_3$, $\vec{L}_9$, $\vec{L}_{11}$) therefore sufficient to represent the group by one strut in each group. Therefore, regrouping Eq. (34) and (35) by identical struts yields:

$$D_3^{eff} = \frac{1}{V}\{d_{31}\ d_{32}\ d_{33}\} \quad \text{Eq. 36}$$

$$\left(4\begin{Bmatrix}T_{11}^2 \\ T_{21}^2 \\ T_{31}^2\end{Bmatrix}A_2|\vec{L}_2|\sigma_{xx}^2 + 4\begin{Bmatrix}T_{11}^5 \\ T_{21}^5 \\ T_{31}^5\end{Bmatrix}A_5|\vec{L}_5|\sigma_{xx}^5 + 4\begin{Bmatrix}T_{11}^1 \\ T_{21}^1 \\ T_{31}^1\end{Bmatrix}A_1|\vec{L}_1|\sigma_{xx}^1\right)$$

$$\sigma_1 = \frac{1}{V}\left(4T_{11}^2 A_2|\vec{L}_2|\sigma_{xx}^2 + 4T_{11}^5 A_5|\vec{L}_5|\sigma_{xx}^5 + 4T_{11}^1 A_1|\vec{L}_1|\sigma_{xx}^1\right) \quad \text{Eq. 37}$$

where, from geometric relationships, $$T_{11}^2 = \frac{\sqrt{2}}{2}\cos\frac{1}{2}\theta \quad \text{(Eq. 38)}$$

$$T_{21}^2 = \frac{\sqrt{2}}{2}\cos\frac{1}{2}\theta$$

$$T_{31}^2 = \sin\frac{1}{2}\theta\cos\frac{1}{2}\theta$$

$$T_{11}^5 = \frac{1}{2}$$

$$T_{21}^5 = \frac{1}{2}$$

$$T_{31}^5 = 0$$

$$T_{11}^1 = 0$$

$$T_{21}^5 = \frac{1}{2}$$

$$T_{31}^5 = \frac{1}{2}$$

Also, $$|\vec{L}_2| = |\vec{L}_1| = \frac{\sqrt{2}}{\cos\dfrac{1}{2}\theta}|\vec{L}_5|\cdot A_2 = A_5 = A_1.$$

In this case, $$\theta = \angle \vec{l}_3^1 \vec{l}_1^1 = \theta'$$

(FIG. 8B). Using nodal force equilibrium, the relationships between axial stresses of three types of struts were obtained:

$$\sigma_{xx}^2 = -\sigma_{xx}^1 = \frac{\sqrt{2}}{2} \frac{1}{\cos\frac{1}{2}\theta} \sigma_{xx}^5.$$

Thus, substituting Eq. 36 and 37 into Eq. 33, the following $d_{31}^{eff}$ for N=12 structure was obtained as:

$$d_{31}^{eff} = \frac{\left(\frac{\sqrt{2}}{2}\cos\frac{1}{2}\theta + \frac{1}{2}\cos^2\frac{1}{2}\theta - \frac{1}{2}\right)(d_{32}+d_{31}) + \left(\sin\frac{1}{2}\theta\cos\frac{1}{2}\theta - \frac{1}{2}\right)d_{33}}{\frac{\sqrt{2}}{2}\cos\frac{1}{2}\theta + \frac{1}{2}\cos^2\frac{1}{2}\theta}$$

(Eq. 39)

Due to symmetry, $d_{31}^{eff} = d_{32}^{eff}$. Similarly, $d_{33}^{eff}$ can be obtained as:

$$d_{33}^{eff} = \frac{\left(\cos^2\frac{1}{2}\theta - \frac{\sqrt{2}}{12\sin\frac{1}{2}\theta - 4\cos\frac{1}{2}\theta}\right)(d_{31}+d_{32}) + 2\sin^2\frac{1}{2}\theta d_{33}}{\sqrt{2}\sin\frac{1}{2}\theta}$$

(Eq. 40)

Eq. (39) and (40) show that the variation of θ changes the effective piezoelectric charge constants by varying the contribution of material properties $d_{31}$, $d_{32}$ and $d_{33}$.

A list of some other designed node units and their normalized effective piezoelectric charge constants are estimated and shown in FIGS. 30A-30B. The 3D node unit with dissimilar projection patterns and its results are also shown. Despite that the projection patterns are 3-strut, with different skew angles between adjacent struts defined as $$\theta_1 = \angle \vec{l}_1^1 \vec{l}_2^1$$

and $$\theta_2 = \angle \vec{l}_1^2 \vec{l}_2^2,$$

this yields a distribution of $d_{3M}$ with $d_{31} \neq d_{32}$ (3-strut dissimilar projection patterns, FIGS. 30A-30B). Another node unit with 3-strut pattern on 1-3 plane and 5-strut pattern on 2-3 plane is also illustrated (3-strut/5-strut dissimilar projection patterns, FIGS. 30A-30B). This type of design further enhances the tunability of piezoelectric properties by utilizing the dissimilar projection patterns design. Another superposition structure by summing two 3-strut projection patterns is also generated (6-strut projection patterns, FIGS. 30A-30B). $d_{31}$ and $d_{32}$ are nearly zero for θ=60° due to the counteractive contributions of two groups of struts: i) struts paralleled to 1-3 plane; and ii) struts paralleled to 2-3 plane. $d_{33}$ is predicted as negative at θ=30° while $d_{31}=d_{32}>0$, reaching a quadrant different from other designs (FIGS. 30A-30B). The node units with 6-strut dissimilar projection patterns are also shown to verify its $d_{3M}$ distribution in (− + −) and (+ − +) quadrants (6-strut dissimilar projection patterns, FIGS. 30A-30B).

PZT particle properties. In this Example, commercial piezoelectric material particles (APC 850) were used. The size of the PZT particles was measured by dynamic light scattering (Malvern Zetasizer Nano ZS), and we found the average diameter to be 220.9 nm in acetonitrile solvent. The properties of the PZT particle are summarized in FIG. 31. The Curie temperature of the PZT (APC 850), used in this Example, was 360° C.

Figures 11A, 11B:
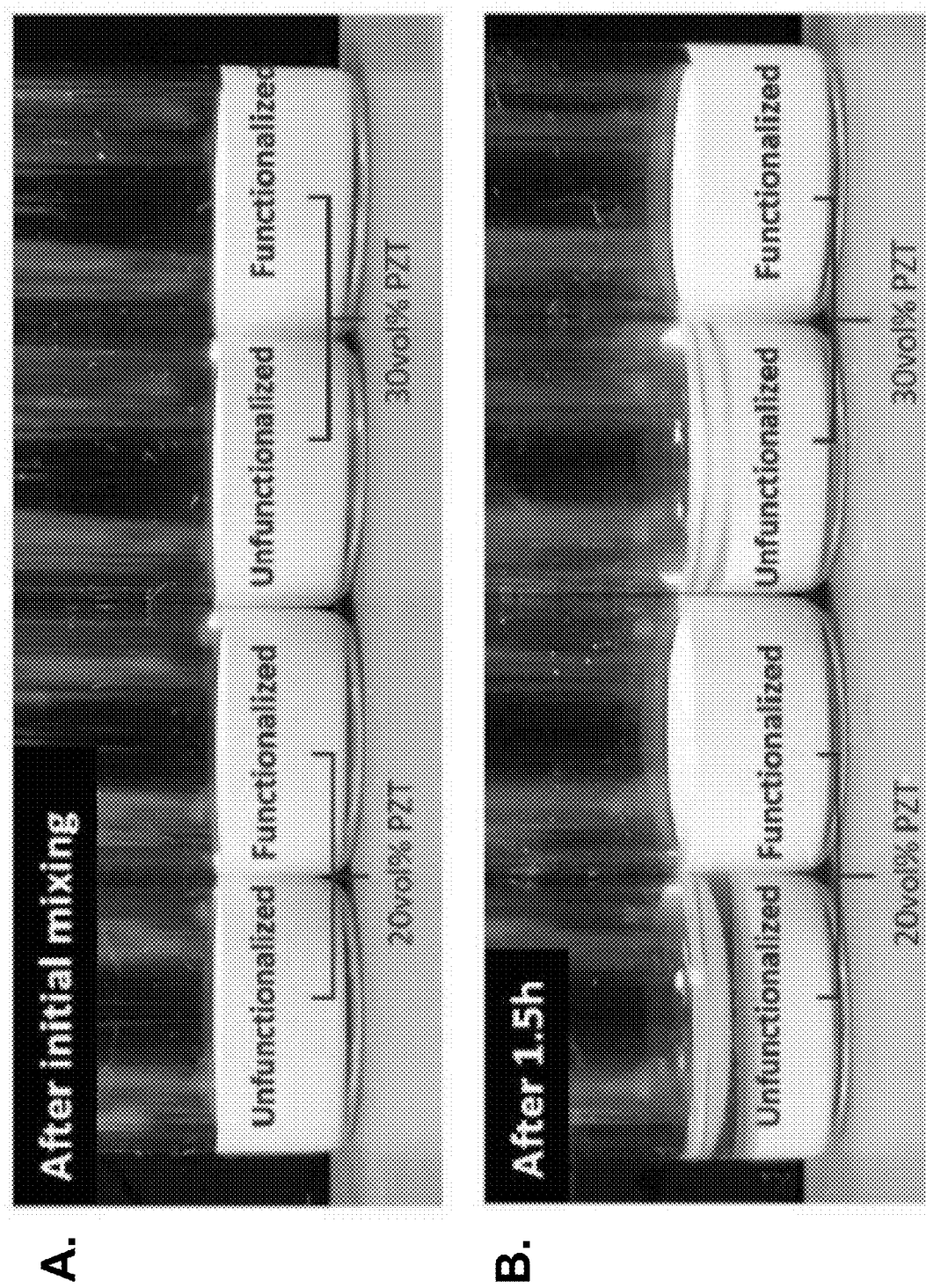
FIGS. 11A-11B show optical images of the resins mixed with unfunctionalized or functionalized particles (FIG. 11A) after initial mixing and (FIG. 11B) after 1.5h.
Figures 12A, 12B, 12C, 12D:
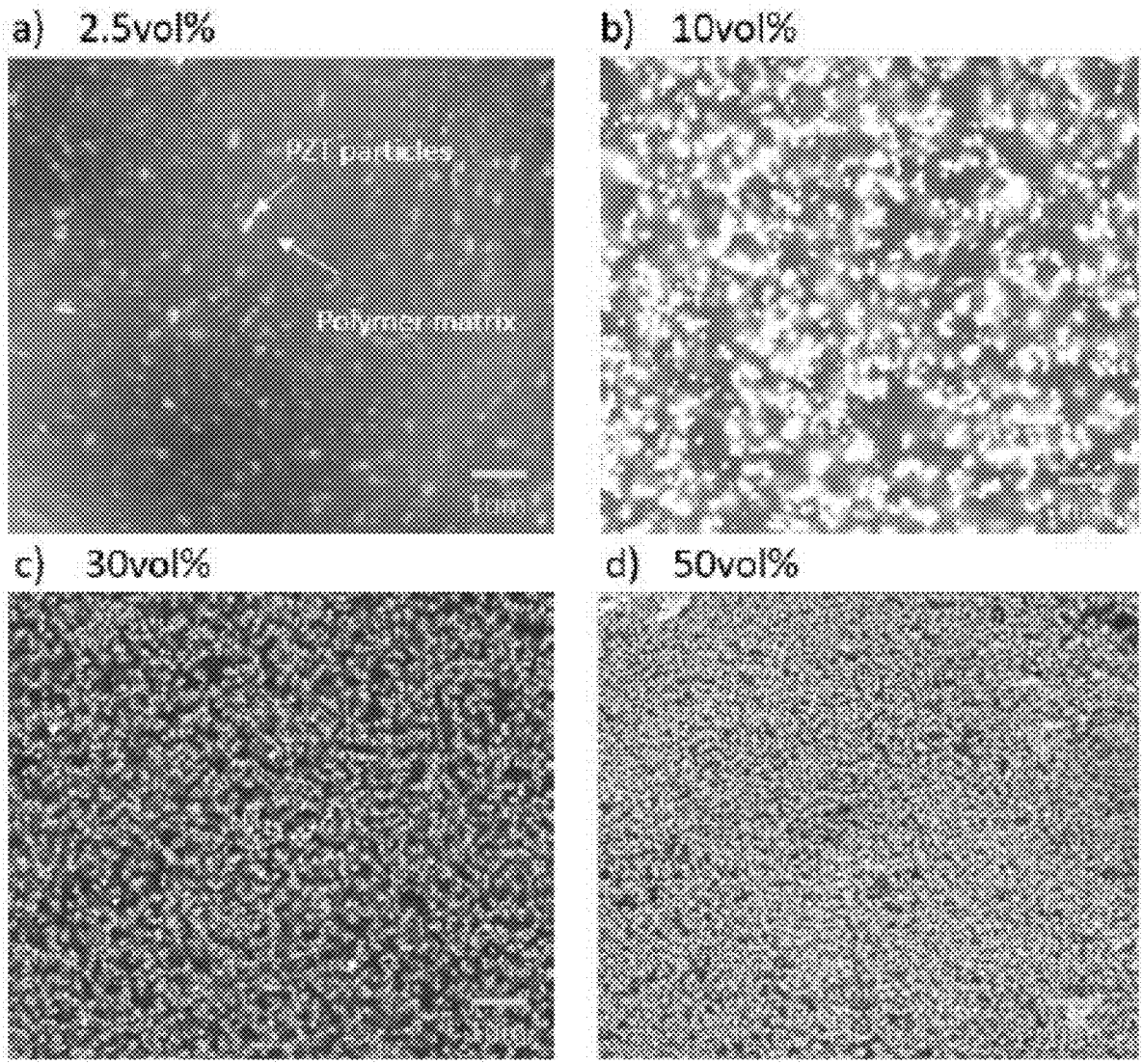
FIGS. 12A-12D show the SEM micrographs of the cross-section areas of the composite having (FIG. 12A) 2.5 vol %, (FIG. 12B) 10 vol % (FIG. 12C) 30 vol % (FIG. 12D) 50 vol % particle loading.

Particle uniformity in the polymer matrix. The PZT particle surface functionalization, resin mixing method and printing process collectively ensure the uniformity of the spatial distribution and no-settling occurred during the printing, even in the presence of high-volume loading (FIGS. 11A-11B). Surface functionalization helps achieve uniformity in the liquid resin by creating a sterically hindered surface, a common technique in nanomaterial synthesis (Sperling, R. A. & Parak, W. J. Surface modification, functionalization and bioconjugation of colloidal inorganic nanoparticles. Philos T R Soc A 368, 1333-1383 (2010)). During the functionalization procedure, PZT particles were ultrasonically dispersed in the deionized water with glacial acetic acid, after which the surface functionalization agent was added. The mixture was then refluxed while stirring for 5h. Particles were cleaned by centrifugation, discarding the supernatant, and then dispersing in pure ethanol for at least two cycles. The dried particles were mixed with photocurable resin using a high energy ball mill (EMAX, Retsch) for 30 minutes to ensure the mixture is uniform. During the printing procedure, the strong, irreversible bonding of the nanoparticle surface acrylates and the polymer matrix acrylates maintains the uniform dispersion within the printed parts. An average printing takes less than 1.5 hours to finish, and there is no noticeable particle sedimentation over that period of time for the resin mixed with functionalized particles, as shown in FIGS. 11A-11B.

To confirm the uniformity of the printed parts, we printed a series of beams with the same overall size (0.3 mm×0.3 mm×5 mm) and different particle loadings within the polymer matrix. Scanning electron microscopy (SEM, FEI Quanta 600FEG) was performed on these beams, and recorded the morphology of the surface of these beams. The SEM micrographs are shown in FIGS. 12A-12D. No visible variation in the spatial distribution of the PZT particles in the polymer matrix was observed.

Characterization of the effect of particle functionalization. To characterize the effect of functionalization, composite samples with varying degree of functionalization between nanoparticles and polymer matrix were prepared and probed their effect on the piezoelectric properties at different particle volume loading. These experiments confirmed that the fully functionalized systems provide the "upper bound" of properties obtainable for a particular volume fraction of the piezoelectric particles while the partially functionalized particle systems provide less.

Figure 13A:
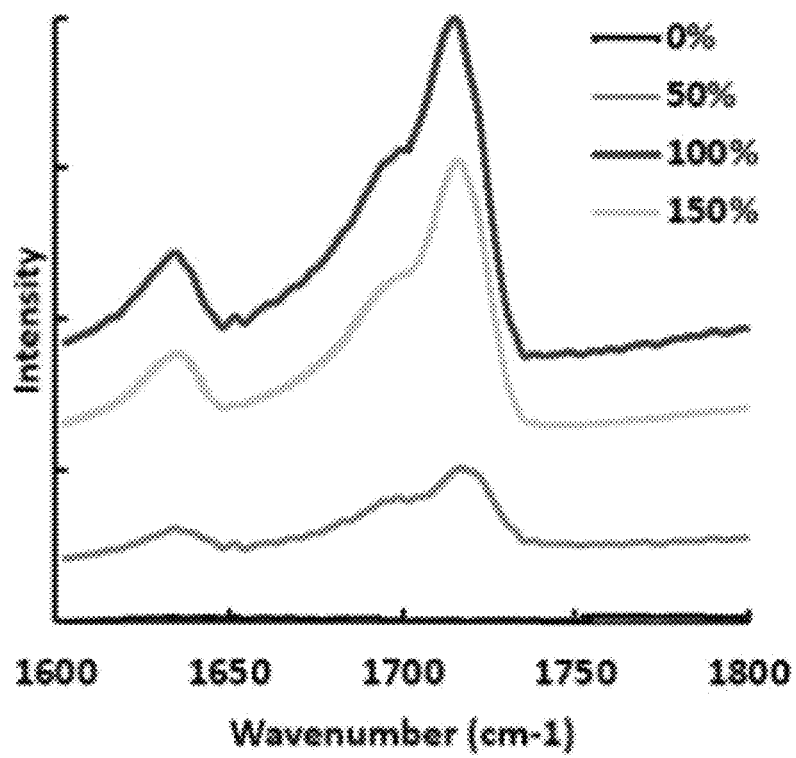
FIGS. 13A-13D show (FIG. 13A) Fourier-transform infrared spectroscopy (FTIR) result showing the effects of different TMSPM loading.
Figure 13B:
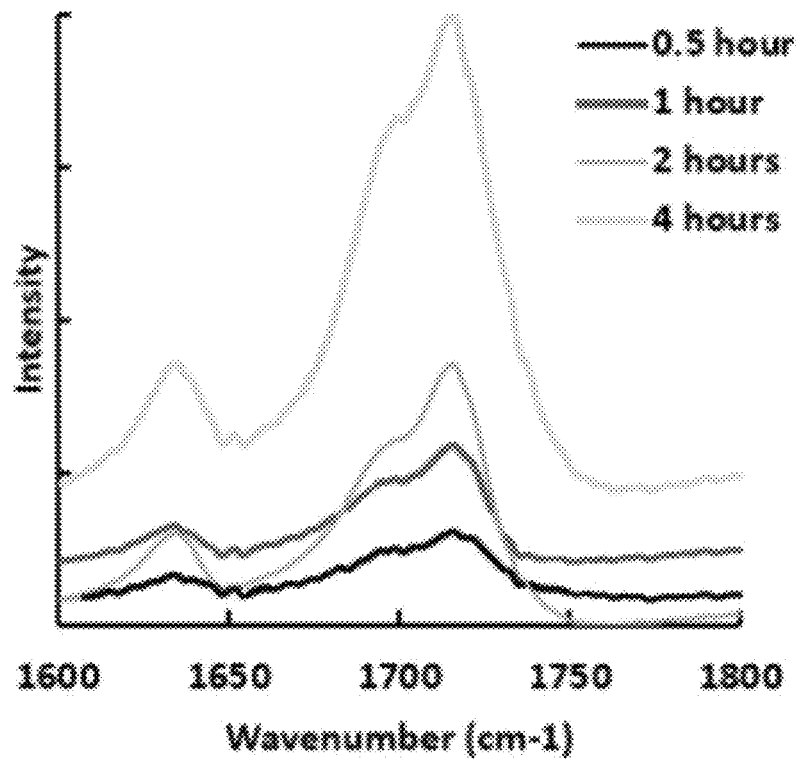
Figure 13C:
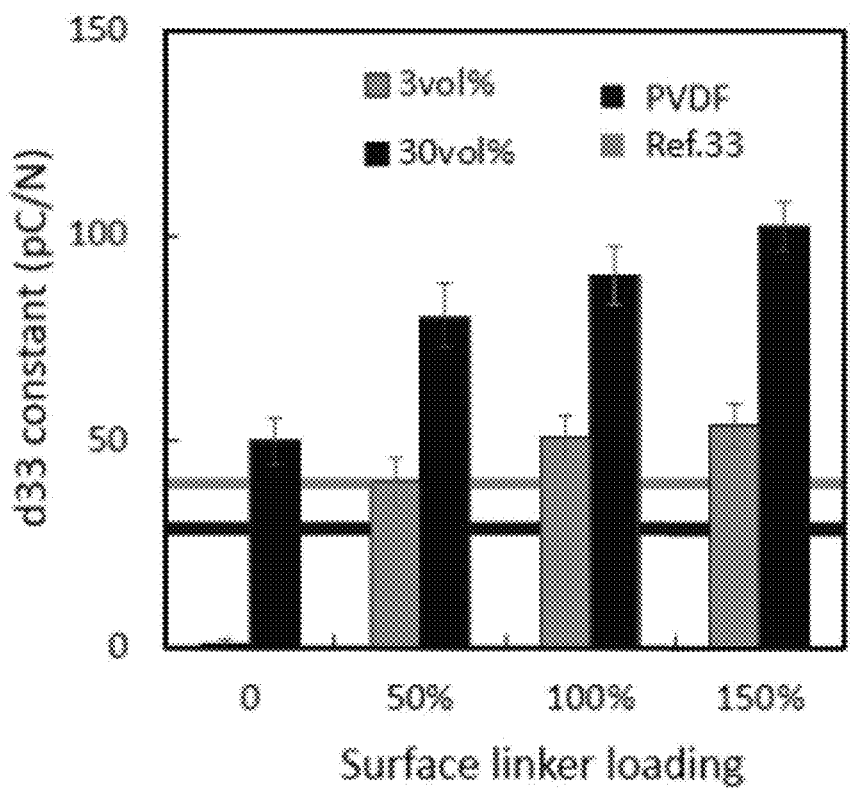

In FIGS. 13A-13B, it can be demonstrated the Fourier-transform Infrared Spectroscopy (FTIR) of thoroughly cleaned functionalized PZT particles with different intimal loadings of the surface agent or reaction times. The spectrum focuses on the carbonyl and alkene of the acrylate surface groups nominally at 1710 cm$^{-1}$ and 1630 cm$^{-1}$, respectively. It shows the functionalization level can be varied by the surface linker loading or reaction time.

PZT particles were functionalized with 0 wt % to about 150 wt % surface linker loadings. The particles with different functionalization levels were mixed with the UV curable resin with 3% to 30% volume loadings (equivalent to 18.8 wt % to about 76.3 wt % loading), and were used for fabricating cuboid samples (8 mm by 8 mm by 2 mm). As-fabricated samples were tested using the same apparatus described elsewhere herein. The $d_{33}$ constants of the samples are summarized in FIG. 13C. For the low particle loading (3vol %) composite, the d constant is nearly zero without functionalization, and increases with the functionalization level until the particles are fully functionalized. The same trend was observed for the high particle loading (30 vol %, i.e., 76.3 wt %) composite, i.e., the d constant increases from about 50pC/N to about 100pC/N with fully functionalized nanoparticles.

Figure 13D:
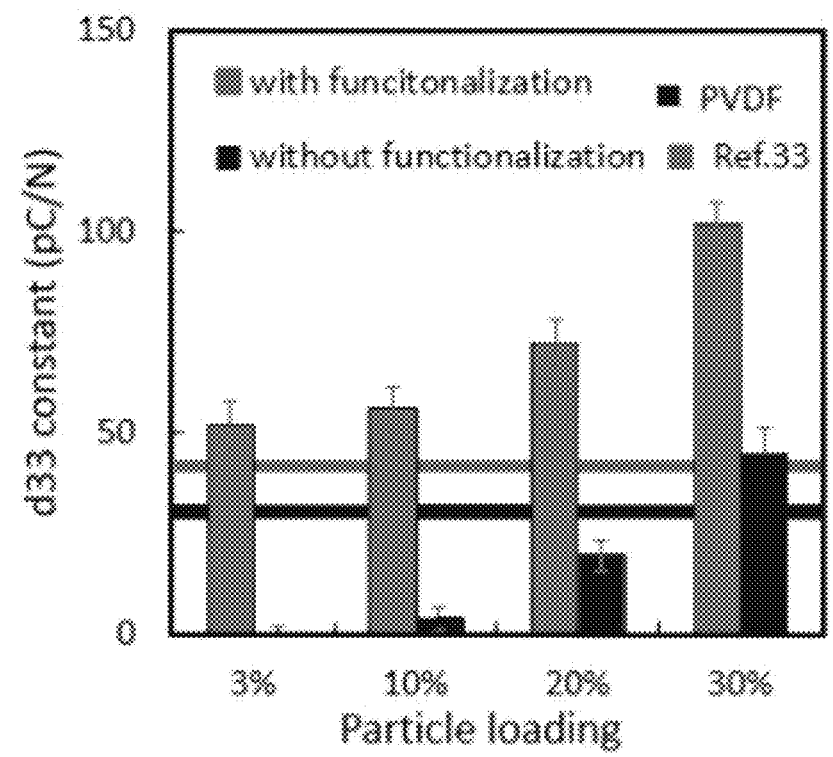

To investigate the effect of functionalization at different particle loadings, cuboid samples having the same dimensions with 3vol % to about 30 vol % PZT particles with and without functionalization were fabricated and tested. The results are shown in FIG. 13D. Within 30 vol % loading, the performance of the piezocomposite is increased by the surface functionalization of the piezo particles. It can be noted that in the absence of functionalization, the baseline piezoelectric response is increased with higher volume loadings.

Resolution and optimization of the fabrication process. The current system to process piezoelectric feedstock achieves minimum printable 3D feature size of about 20 µm in the transverse direction, which is determined by pixel resolution of the DMD array and the reduction lens. The resolution in vertical direction is controlled by the layer thickness during the printing. To ensure the layer thickness is well-controlled, layer recoating process and the cure depth of the resins with higher nanoparticle loadings are modeled and experimentally characterized in this Example.

Figures 14A, 14B:
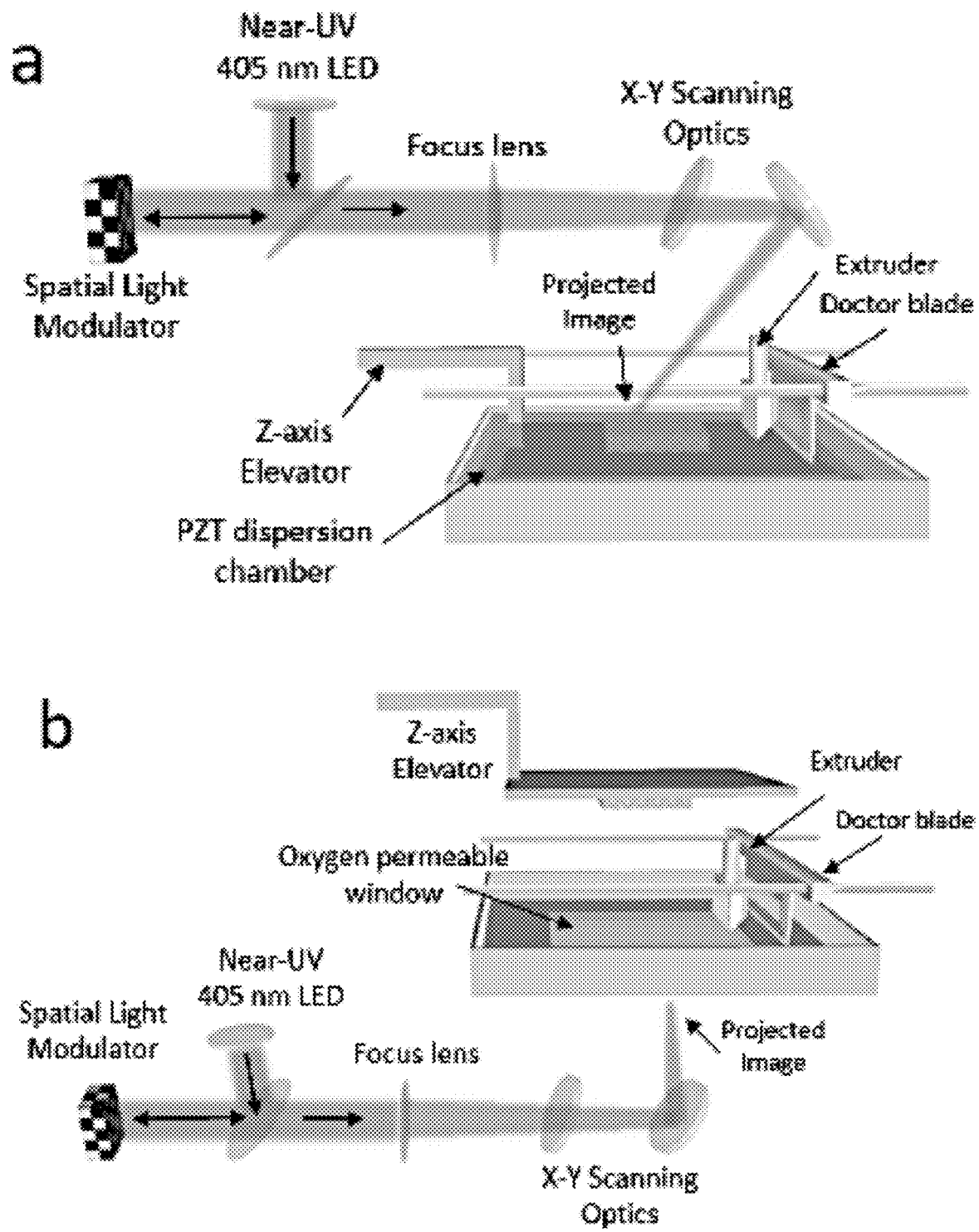
FIGS. 14A-14C shows (FIGS. 14A-14B) schematics of the projection stereolithography systems used in our study with resin dispensing and flattening setup for a range of functional material loadings and (FIG. 14C) three steps during the recoating process.
Figure 14C:
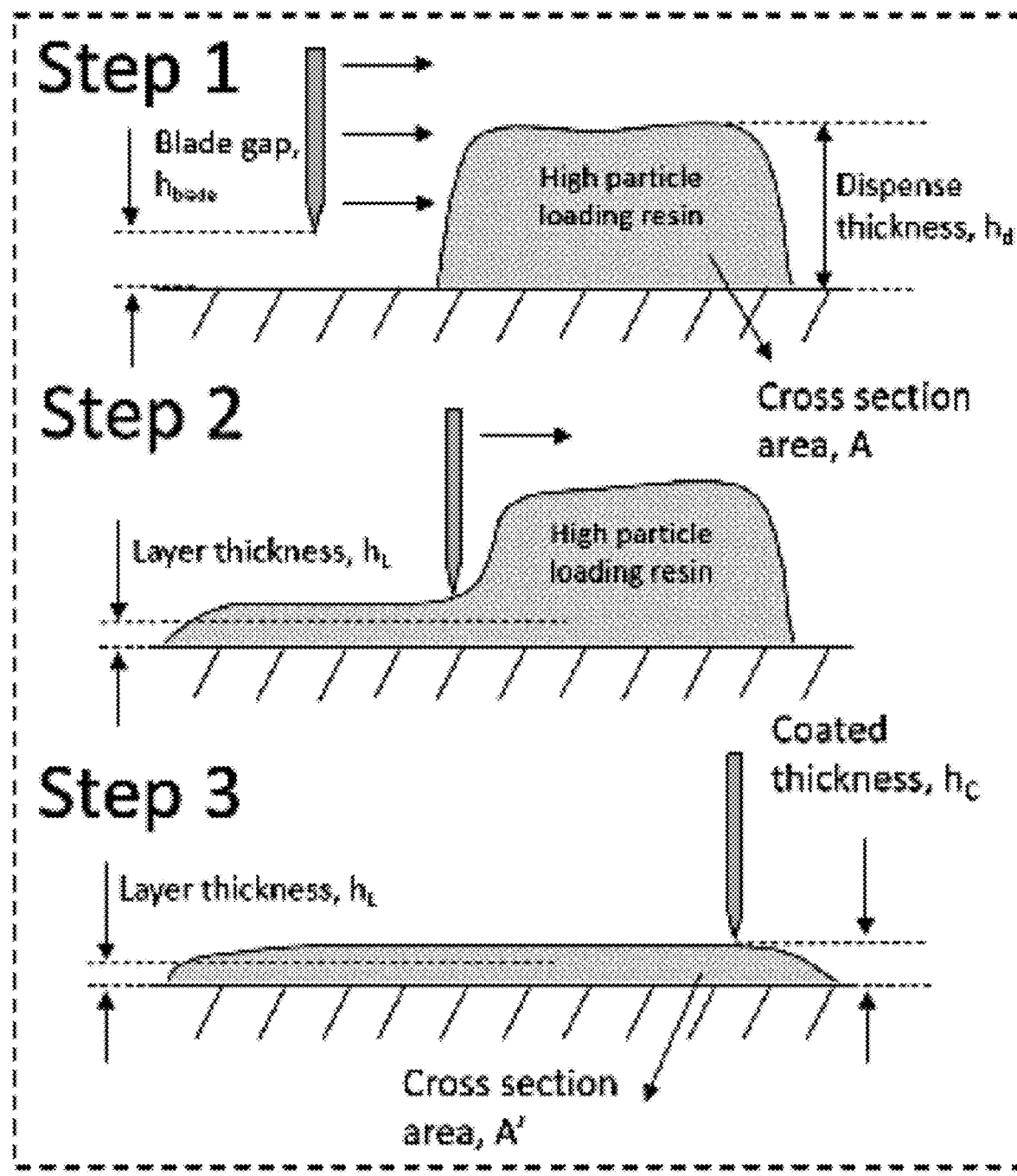

After one layer of resin is cured, a recoating process is followed. The stage on which the lattices were printed is moved for a layer thickness to recoat resin for the printing of next layer. While resin with low particle loading can be recoated within a short time between each layer, high particle loadings resin suffers from its dramatically increased viscosity as such it cannot flow into the gap uniformly within a reasonable time. To ensure the high particle loading resins can be uniformly and efficiently recoated, we used tape-casting method (Jabbari, M. & Hattel, J. Bingham plastic fluid flow model in tape casting of ceramics using two doctor blades—analytical approach. Mater Sci Tech Ser 30, 283-288 (2014)) to recoat the resin, as shown in FIGS. 14A-14B. As shown in FIGS. 14A-14C, once a layer is cured, the Z stage moves. Right after the movement, an extruder squeezes a small amount of the resin on the oxygen permeable membrane and a doctor blade produces a thin resin film on the membrane. Then the Z stage moves back, leaving a flat layer height resin.

Optimization of the blade height to control thickness. In the process described herein, only a small amount of resin for each layer was dispensed. The blade position was designed such that the gap between the blade head and the substrate is sufficient to ensure 1) dispensed nanoparticle resin can spread out the printing area, 2) the spread resin height is higher than exposure thickness. FIG. 14C illustrates the blade design criteria to ensure adequate nanoparticle resin quality. The blade height must satisfy $$\frac{2h_L A'}{A} < h_{blade} < \frac{Ah_d}{A'}$$

where A is the cross-section area of the dispensed resin, hd is the thickness of the dispensed resin and A' is the cross-section area of the recoated resin (FIG. 14C).

Figure 15A:
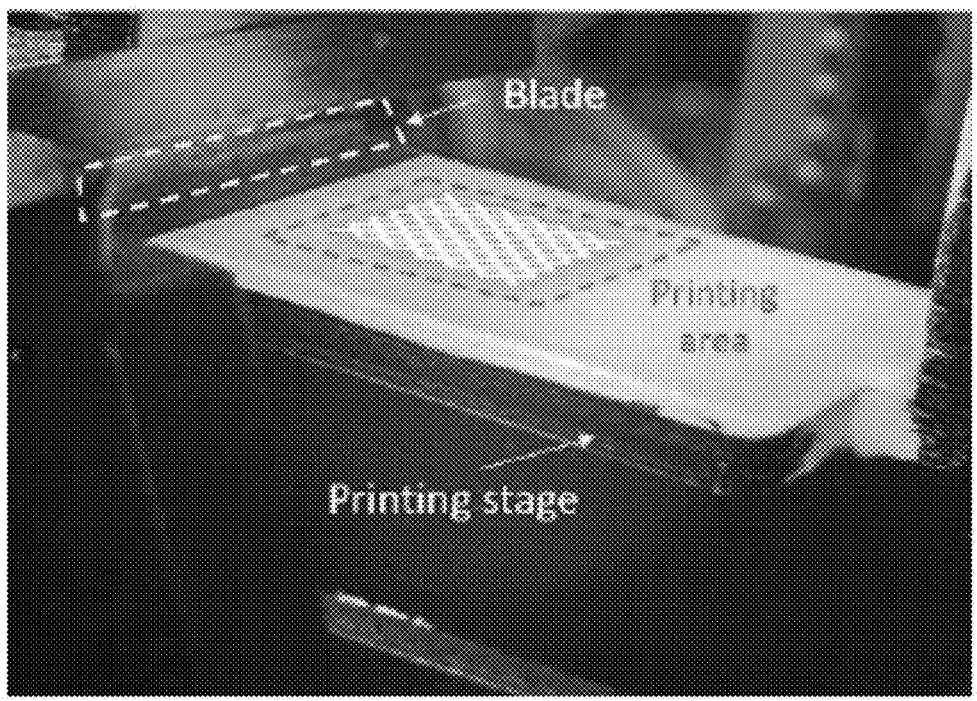
FIGS. 15A-15B shows (FIG. 15A) Camera image of an as-cast uniform piezoelectric photosensitive resin film for Projection Micro-stereolithography; doctor blade height is 100 μm.
Figure 15B:
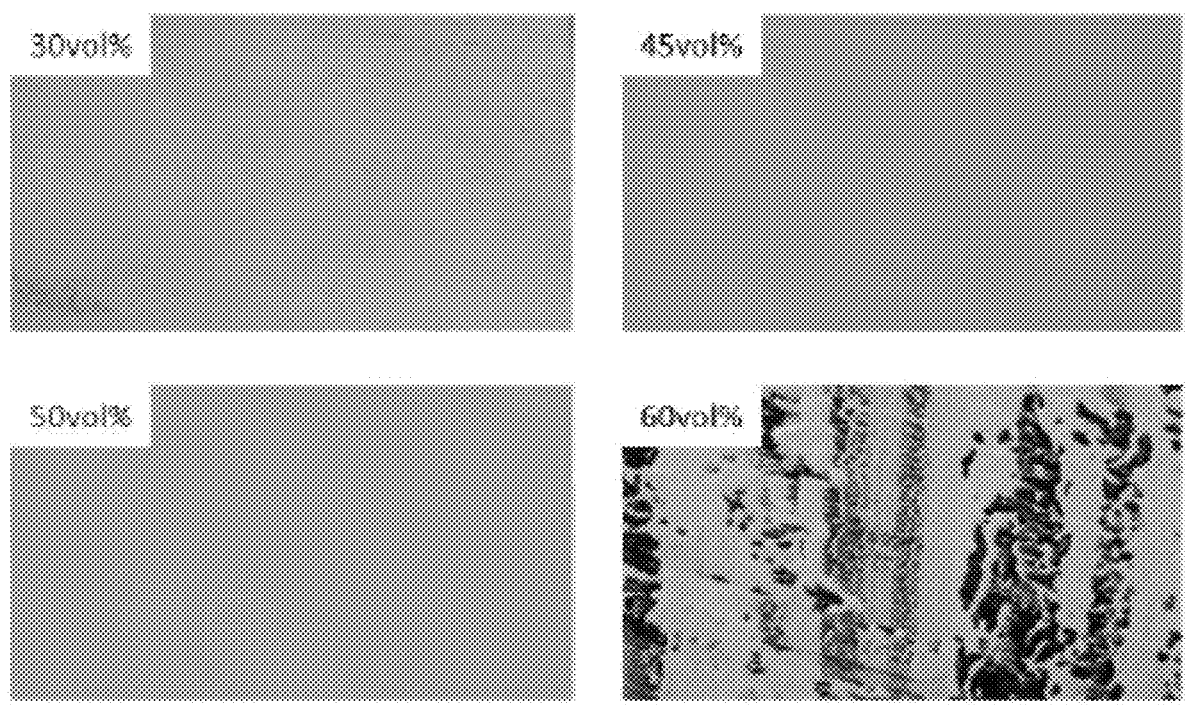

The recoating quality of the resins having different particle loadings and the results are summarized in FIGS. 15A-15B. The particle loading that can yield a relatively uniform layer with high quality (without pores) for final fabrication was found to be 50 vol % (about 88 wt %) in this Example.

Curing depth of highly loaded piezoelectric monomers. Another important parameter affecting the layer thickness is the cure depth of the resin. In SLA process, the curing depth is related to the Beer-Lambert law, which is formulated as (Tumbleston, J. R. et al. Continuous liquid interface production of 3D objects. Science 347, 1349-1352 (2015)):

$$Z_{ct} = \frac{1}{\alpha} \ln\left(\frac{E}{E_c}\right) \quad \text{(Eq. 41)}$$

where $\alpha$ is the resin absorption coefficient, E and Ec are the actual and critical exposure respectively. E can be controlled by the UV light intensity or exposure time.

For resins loaded with particles, the UV light is scattered or absorbed when it travels through the resin. The absorption coefficient of the resins, $\alpha$, becomes quite large in highly particle loaded resins, and can be formulated as (Song, X. et al. Piezoelectric component fabrication using projection-based stereolithography of barium titanate ceramic suspensions. Rapid Prototyping J 23, 44-53 (2017), Griffith, M. L. & Halloran, J. W. Stereolithography of ceramics. Proceedings of the Sixth International Conference on Rapid Prototyping—1995, 25-34 (1995), and Griffith, M. L. & Halloran, J. W. Freeform fabrication of ceramics via stereolithography. J Am Ceram Soc 79, 2601-2608 (1996)):

$$\alpha \sim \frac{3S\phi}{2d} \quad \text{(Eq. 42)}$$

$$S \sim \left(\frac{\Delta n}{n_0}\right)^2 \left(\frac{d}{\lambda}\right)^2 \quad \text{(Eq. 43)}$$

where S is a constant related to the scattering efficiency of the particles, d is the mean diameter of particles, Ø is the volume fraction of the particle in the high particle loading resin, no is the refractive index of the resin, Δn is the refractive index difference between the particle and the solution and λ is the light wavelength.

Figure 16A:
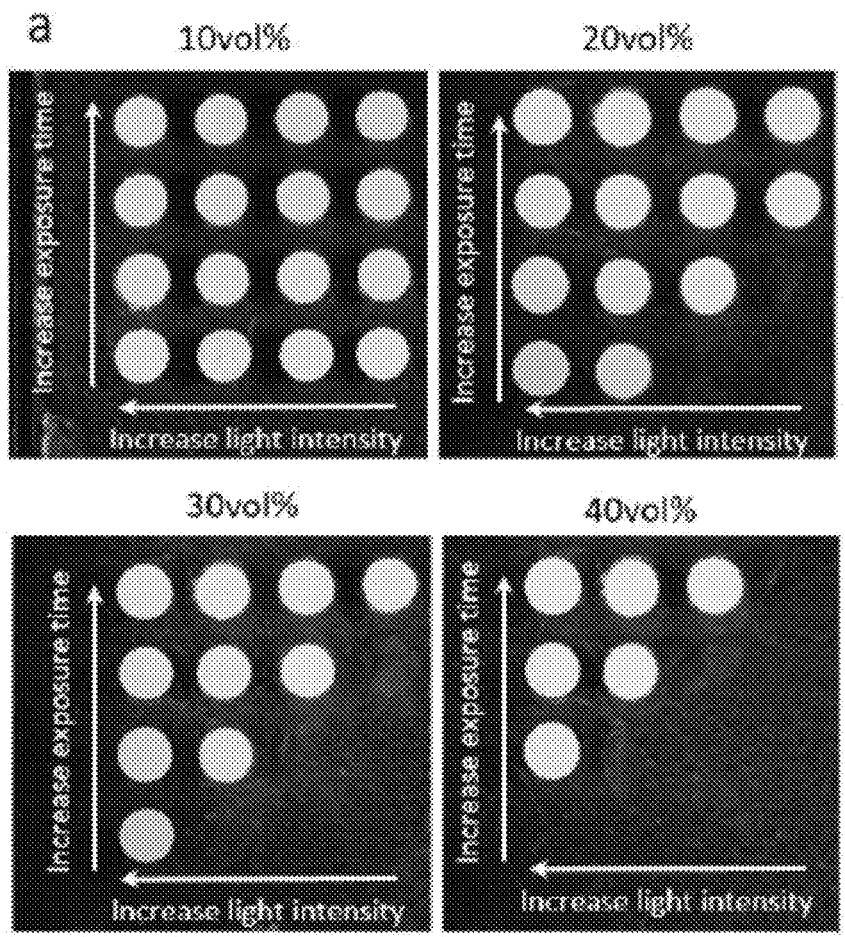
FIGS. 16A-16B show (FIG. 16A) Optical images showing the curing depth of resins with 10 vol %, 20 vol %, 30 vol % and 40 vol % particle loadings and (FIG. 16B) curing depth of the 40 vol % loading resin as a function of the exposure time.

Empirically, it was determined that the layer thickness has to be set less than half of the cure depth in order to ensure tight bonding force between neighboring layers. This creates challenge as higher particle loadings nanoparticles cause reduction of the resin penetration depth based on Eq. (41) due to higher resin absorption constant. For each particle loading a series of exposure time and dosage must be carefully conducted to characterize the penetration depth of the loading. Additionally, this enclosed system allows accurate control of oxygen concentration (typically below 1%), which helps to increase the cure depth of the resin via prevention of oxygen inhibition mechanism (Zheng, X. Y. et al. Design and optimization of a light-emitting diode projection microstereolithography three-dimensional manufacturing system. Rev. Sci. Instrum 83, 125001 (2012). and promote more photopolymerization and Cui, H., Hesleigh, R., Chen, H. & Zheng, X. Fabrication and Size-dependent Mechanical Properties of Three-dimensional Microarchitected, High-temperature Ceramic Metamaterials. Journal of Material Research 33, 360-371 (2017)). To find the dosage and exposure time for sufficient cure depth (twice of the layer thickness) of resins with different particle loadings, an identical circle array pattern with various exposure time and dosage is used to characterize the cure depth. Excess resin is then wiped away and the thickness of the printed dot is measured under microscope. As shown in FIG. 16A, the number of cured disk patterns decreases as the particle loading increases under the same exposure profile, which indicates different exposure parameters are needed for each loading concentrations.

Figure 16B:
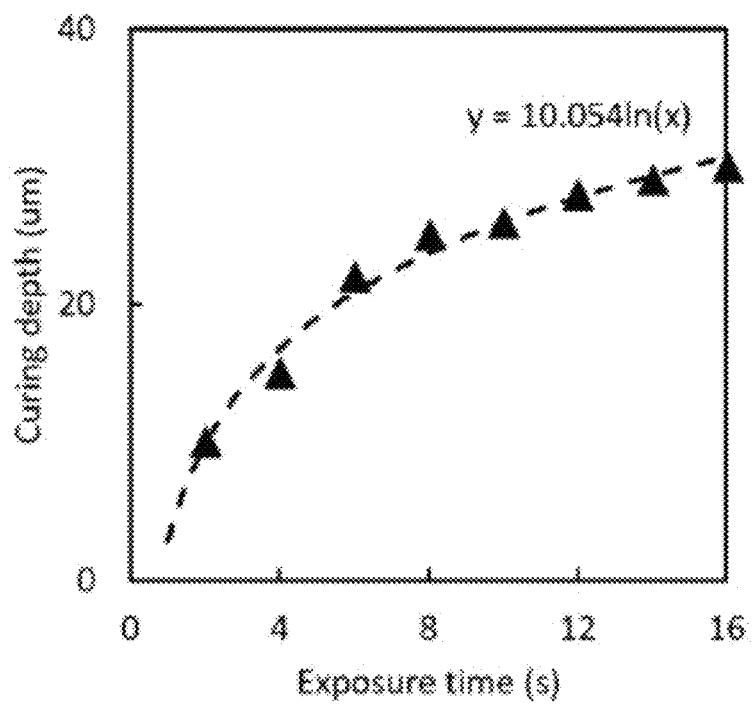

As an example, we plotted the working curve of the resin with 40 vol % loading particles in FIG. 16B. The light intensity we used is the highest intensity of the projection system, which is about 20W. Various exposure time is used to achieve different curing depth. The curing depth is 30 µm with 16s exposure time and start to saturate after 16s. 15 µm as the layer thickness during the printing of the 40 vol % particle loading resin.

Figure 17:
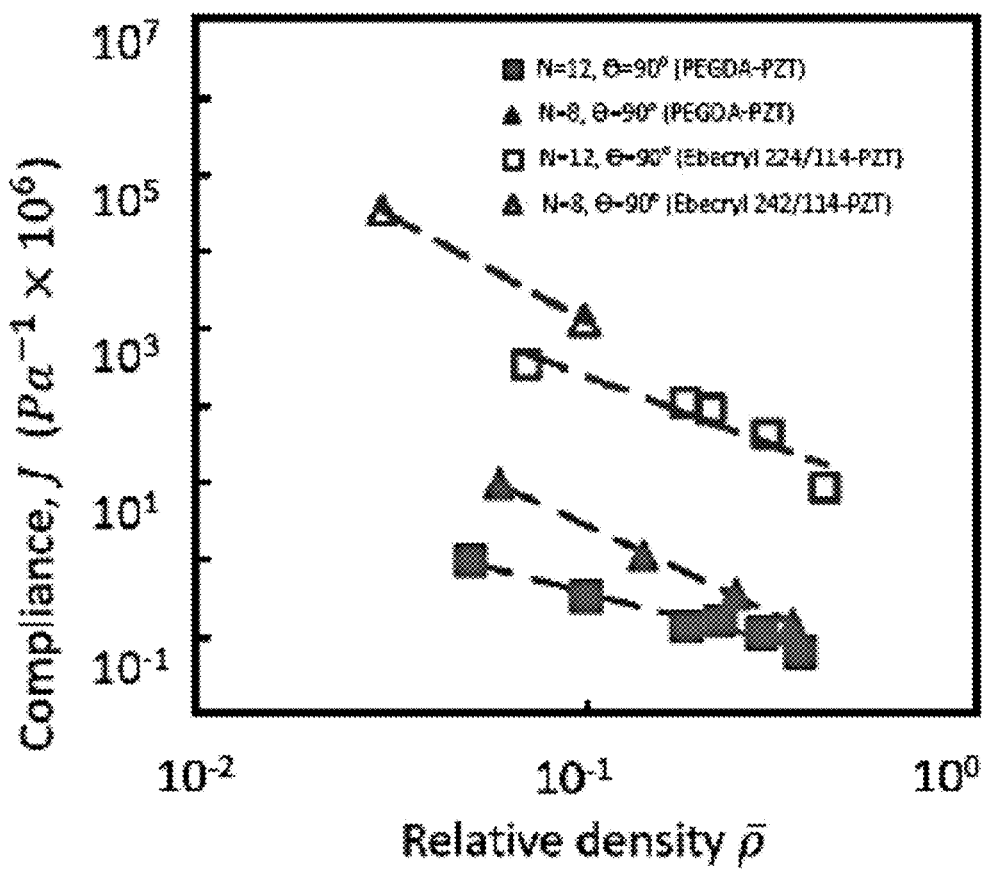
FIG. 17 shows the tunable elastic compliance as a function of the relative densities.
Figure 18:
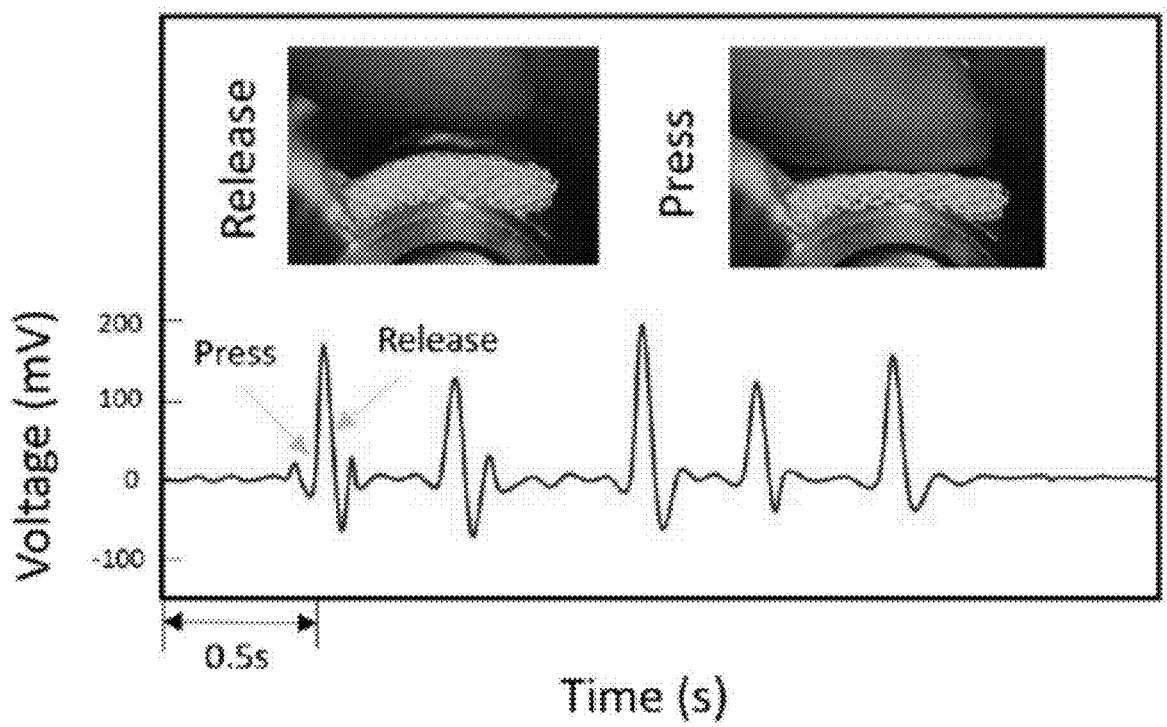
FIG. 18 shows the hand tapping induced voltage response of the N=12 flexible piezoelectric metamaterial conformally attached onto a curved surface.

Tailorable compliance, sensing and energy harvesting capability. FIG. 17 shows the compliance measurement of the metamaterial having different relative densities and monomers with different elasticity. These metamaterials were compressed using INSTRON-5944 with 0.05/min strain rate. The compliance is calculated from the reciprocal of the slope of the stress-strain curve (FIG. 32). The testing results show that these group of piezoelectric metamaterials possess tailorable compliance over three orders of magnitude. FIG. 18 shows the voltage output of a flexible piezoelectric metamaterial when it's attached onto a curved surface and compressed by fingers. Besides, two demos with a flexible 3D architected skin-like sensor and impact energy harvesting apparatus to were generated to further validate the potential of the architected piezoelectric materials.

Figure 19A:
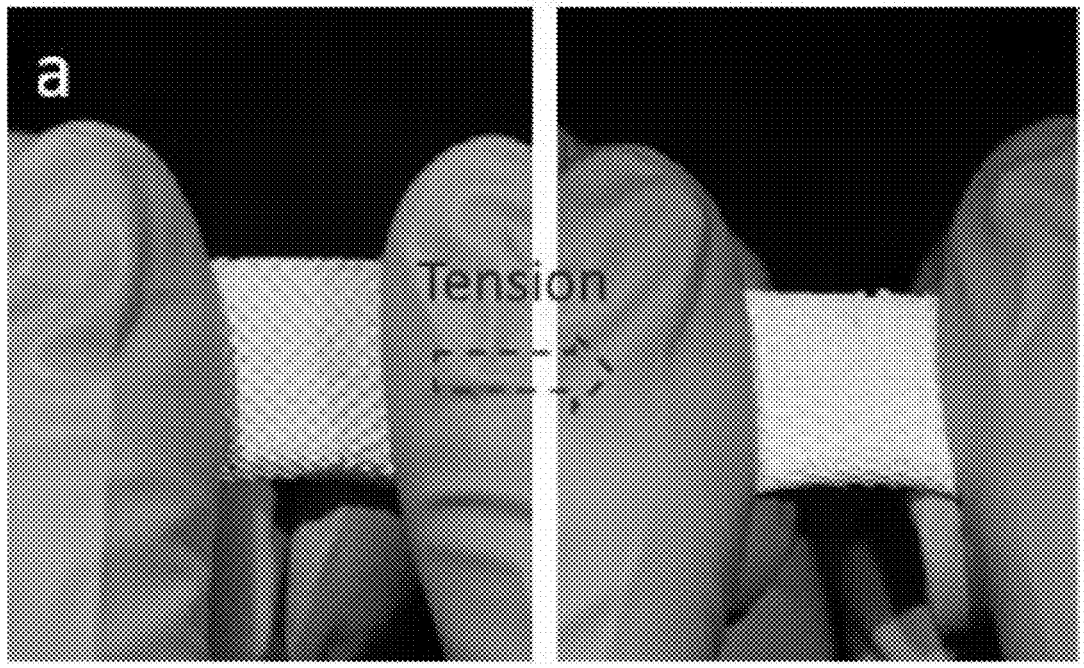
FIGS. 19A-19E show (FIGS. 19A-19B) the optical images of the flexible 3D architected piezoelectric composite sensor with the N=12, ⊖=90° structural design. Tensile and bending forces are applied to the lattice by fingers, showing the mechanical flexibility (FIGS. 19C-19D) A ring-like flexible 3D architected sensor attached on the finger. The sensor is compressed during the "fold" status of the finger.
Figure 19B:
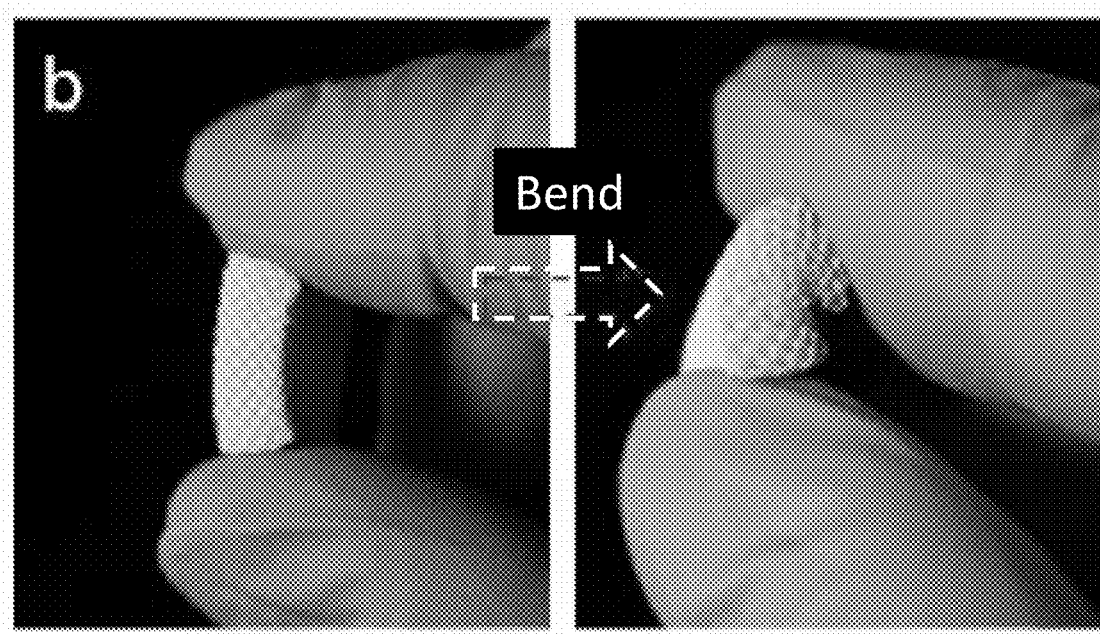
Figures 19C, 19D:
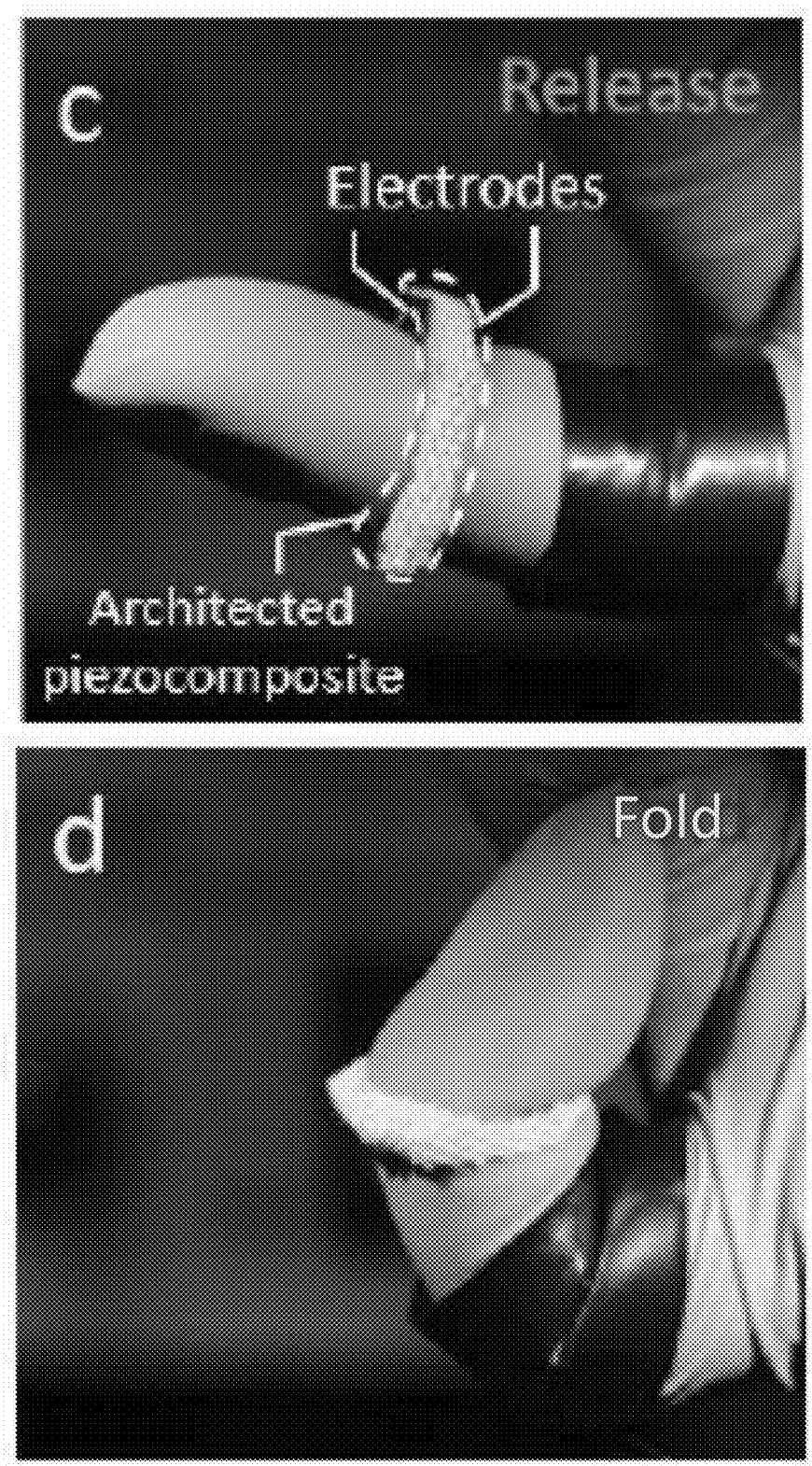
Figure 19E:
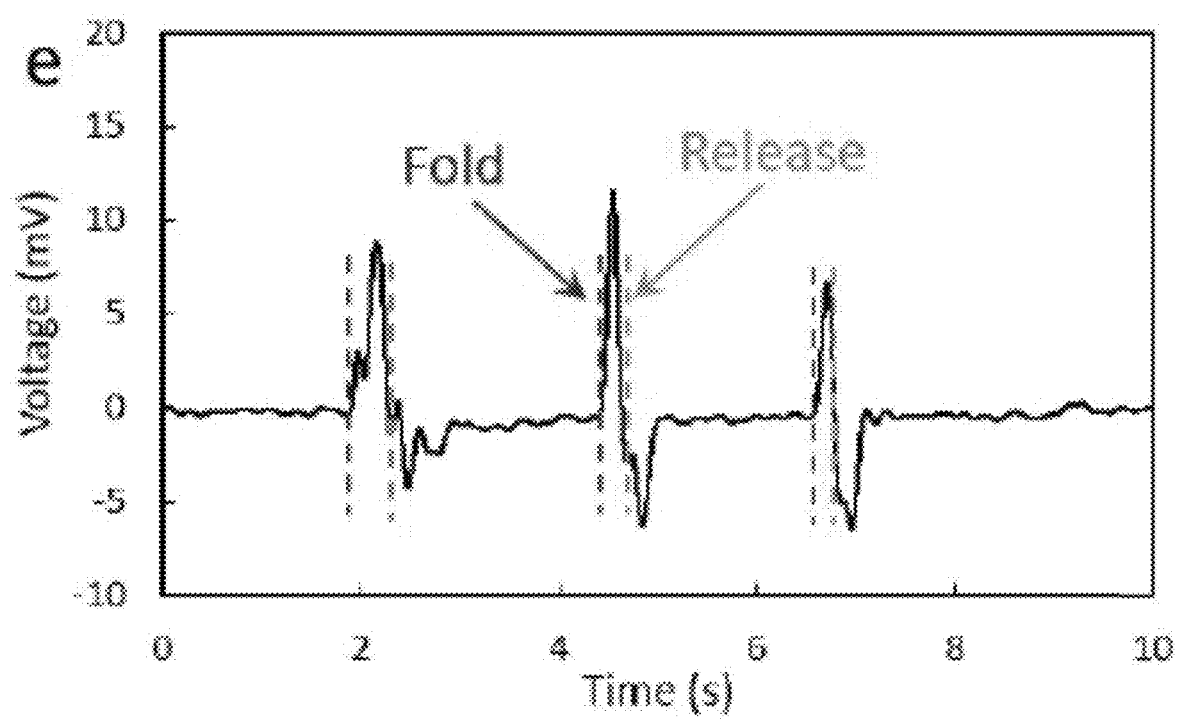

3D architected flexible tactile sensor. As shown in FIGS. 19A-19B, the 3D architected piezoelectric metamaterial can be stretched and bent by fingers with ease without fracture, and are highly conformable to different shapes, e. g., fingers and joints, suggesting their applicability in wearable devices and skin like sensors. As a demonstration, a ring-like sensor was prepared and tested to show the voltage output during the folding and unfolding process of the author's little thumb, as shown in FIGS. 19C-19D. When the finger was folded, the architected sensor is under 3-3 working mode, which means the pressure is applied along the 3-direction (polarization direction) and the voltage is generated on the electrodes along the 3-direction. FIG. 14E displays the real-time waveforms of the folding and unfolding pressure pulse recorded from the sensor.

Figure 20A:
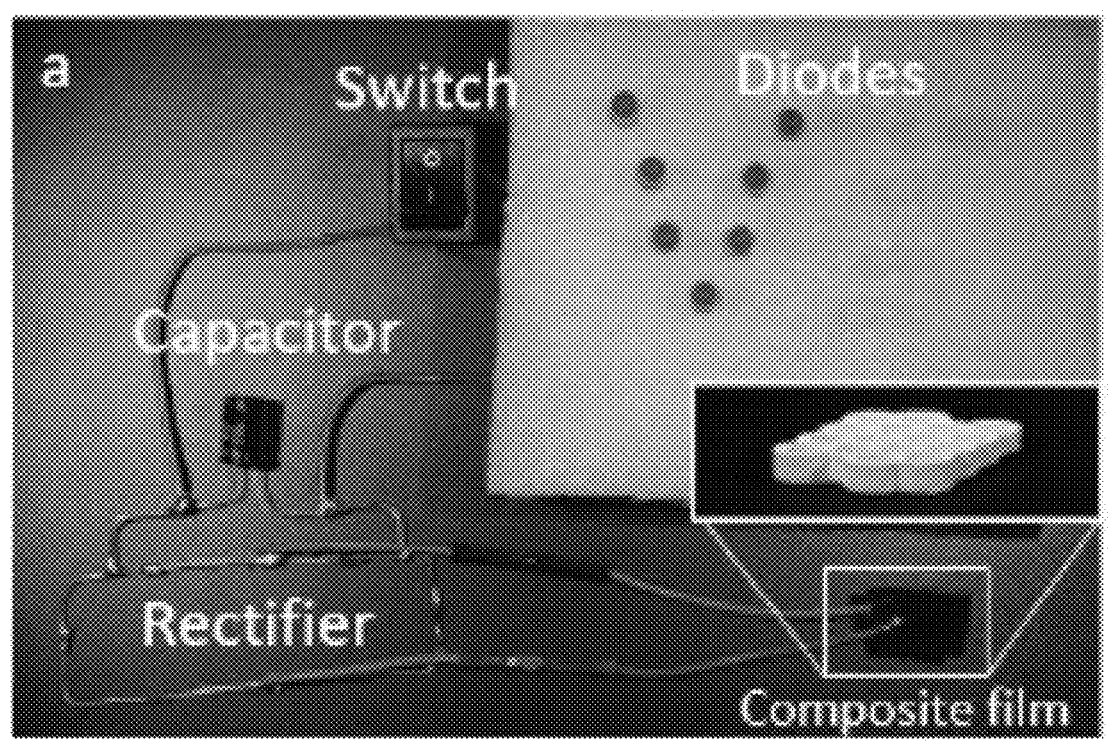
FIGS. 20A-20D show results from an energy harvesting experiment (FIG. 20A) Camera image of the energy harvesting setup with architected piezoelectric metamaterial film.

Energy generation and stability of the piezocomposite energy harvester. To demonstrate the energy harvesting capability of our piezocomposite, the piezoelectric metamaterial was used to harvest energy from the external impacts. An architected film with 40% porosity was printed using the 50 vol % PZT composite, as shown in the inset of FIG. 20A. The as-fabricated sample was then poled with a 4V/µm electric field under room temperature for 1 hour. After poling, two silver electrodes with cables were attached to the sample to form the piezoelectric energy harvester.

Figures 20B, 20C:
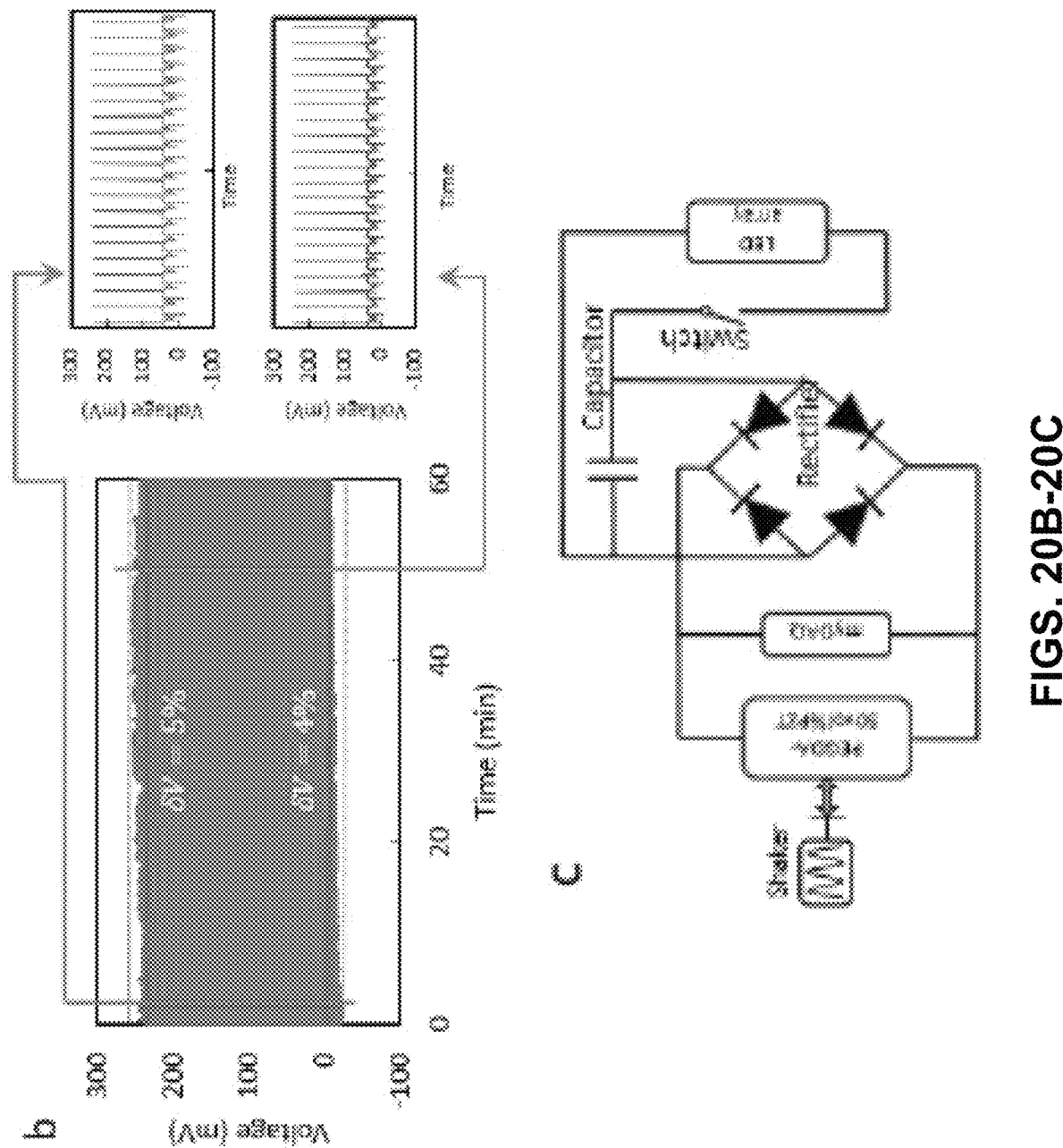
Figure 20D:
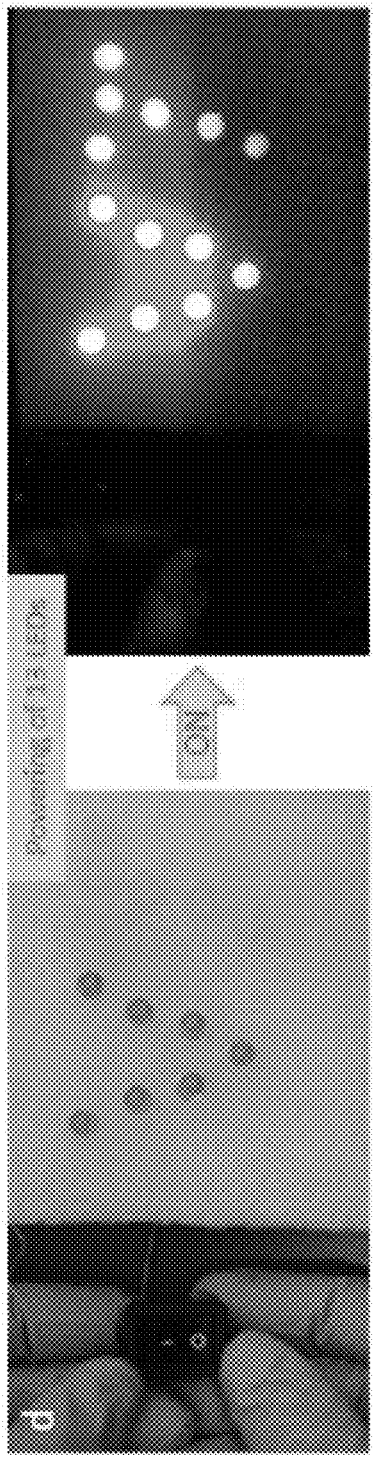

A rectifier and charge storage circuit including the bridge rectifier, a capacitor (C=100 µF), a switch and the LED array were connected to the piezocomposite energy harvester, as shown in FIGS. 20A and 20C. A shaker with integrated force sensor in contact with the surface of the energy harvester applied a small cyclical loading (about 1N peak to peak) on the sample. The generated voltage was measured through myDAQ, while the generated charge was stored in the capacitor. The voltage output of the harvester was relatively stable over 360000 cycles, as shown in FIG. 20B. We observed a small variation in the generated voltage ($\delta V$=7 to about 8%), showing the stability of our piezoelectric composite. The stored energy was then used to illuminate a pattern formed by 13 LEDs. FIG. 20D shows the illumination of the LEDs after turning on the switch between the capacitor and the LED pattern. The LEDs are illuminated for 0.5s with a 2.85V voltage (U) on the capacitor.

Polarization method and results. A standard corona poling method (Kim, H. et al. Integrated 3D printing and corona poling process of PVDF piezoelectric films for pressure sensor application. Smart Mater Struct 26, 085027 (2017)) that has been commonly used for poling PZT composites (Min, Y. H., Lee, K. S., Yoon, C. S. & Do, L. M. Surface morphology study of corona-poled thin films derived from sol-gel processed organic-inorganic hybrid materials for photonics applications. J Mater Chem 8, 1225-1232 (1998)). A schematic of the poling fixture is shown in FIG. 21. Poling process at the elevated temperature (about 110° C.) for some of our samples in contact mode and did not observe any appreciable change in the physical properties. As such, the poling process was performed at the room temperature for most of the samples. The corona process is a non-contact poling process and it involves application of very high field through a needle, while the sample is attached below on the grounded plate. Under the application of high field, the surrounding air is ionized. These ions are collected on the top surface of the sample generating the effective field across the thickness of the sample. This resulted aligning the dipoles (i.e., poling) in the direction of the applied field. The applied voltage during the poling process is 32 kV and the height of needle from the sample surface is 2 cm.

The testing results for tactile mapping also confirmed good uniformity of the poling process. A N=12, $\ominus$=90° lattice was prepared with four electrodes attached at different positions across the lattice surface (FIGS. 22A-22B) The electrodes were connected to 4 resistors (10MΩ) with a data acquisition system for reading output voltages from different positions. Identical, calibrated loadings (2.2N) from a shaker (Model V203, Ling dynamic systems LTD) were applied along 3-direction on the electrodes, the peak voltage generated from four positions were nearly identical, which indicates uniform polarization in lattice upon poling.

Assembly and calibration of the piezoelectric testing apparatus for 3D piezoelectric metamaterials. The piezoelectric metamaterials were first activated by a polarization process in strong electric fields as described in the Methods section. After the poling was completed, the electrodes coated with the composite resin was attached to the sample to eliminate triboelectric effects. The sample was compressed with the electrodes to ensure the sample is fully attached to the electrodes (FIG. 24A). Leads were connected to the electrodes through copper wires. The sample was put on the top of a high precision force sensor (APPLIED MEASUREMENTS LTD. DBCR-20N-002-000) from which the impact force was read, and a shaker (LING DYNAMIC SYSTEMS, LTD. V203) having a sawtooth voltage input was used to applied impact on the sample. One side of the electrodes was grounded while another side is connected to the circuit shown in FIG. 24B (Kim, K. et al. 3D Optical Printing of Piezoelectric Nanoparticle-Polymer Composite Materials. Acs Nano 8, 9799-9806 (2014)). The voltage readout from the circuit was recorded by a data acquisition system (LabView myDAQ) and multiplied by the reference capacitor to calculate the charge generated from the sample. FIG. 24D shows the response of the non-polarized and polarized samples with about 0.5N periodic impact force.

The measurement of piezoelectric coefficient was calibrated using standard calibration piezoelectric sample provided by APC International, Ltd. Wide-Range Piezo d33 Tester Meter. FIG. 24C shows the generated charge as a function of impact force for two standard samples having 540pC/N and 175pC/N standard piezoelectric materials. The slope equals the piezoelectric constant. The error of measured results is below 5% comparing with values reported from the manufacturer. Zero voltage output of the non-polarized sample indicates the triboelectric effects have been eliminated from the system.

Piezoelectric voltage constant and hydrostatic figure of merit. While the mechanical properties (strength, stiffness) in architected metamaterials scale down with volume fractions, creating volume fractions (low relative density) in these piezoelectrics invoke many unique advantages for piezoelectric properties as compared to their bulk material. As seen in Eq. 18 and 19, d constants are not sensitive to relative density in the linear elastic regime, therefore at low volume fractions, their mechanical-electro coupling factors remain consistent with higher volume fractions of the same architecture. This Example can demonstrate that, the piezoelectric voltage constant, g, another key piezoelectric property constant, increases with the reduction of relative density and outperform their original starting material. g constant is the most relevant piezoelectric constant characterizing electro-mechanical coupling for transducer and sensor performance (Jaffe, H. & Berlincourt, D. A. Piezoelectric Transducer Materials. Pr Inst Electr Elect 53, 1372-1386 (1965)). The $g_{33}$ constants is related with $d_{33}$ and electric permittivity via, $$g_{33} = \frac{d_{33}}{\varepsilon_{33}}$$

where $d_{33}$ and $\varepsilon_{33}$ are the piezoelectric charge constant and permittivity in the 3-direction, respectively. The permittivity of the lattices has a nearly linear relationship with the relative density and can be calculated using the following equation (Lifson, M. L., Kim, M. W., Greer, J. R. & Kim, B. J. Enabling Simultaneous Extreme Ultra Lowklin Stiff, Resilient, and Thermally Stable Nano-Architected Materials. Nano Lett 17, 7737-7743 (2017)):

$$\varepsilon_{33} = [\bar{\rho}(k_c - 1) + 1]\varepsilon_0,$$

where $\bar{\rho}$ is the relative density of the lattices, kc is the dielectric constant of the bulk composite and ε0 is the permittivity of vacuum. For the bulk composite, the relative density can be considered as 1. The relationship between the permittivity and relative density was further verified using a commercial capacitance meter (KEYSIGHT, E4990A). The capacitance of the lattices was measured, and the permittivity can be calculated from the following equation:

$$\varepsilon_{33} = \frac{Cd}{A}$$

where C is the capacitance of the lattice, d is the distance between the electrodes and A is the cross-section area of the lattice.

As a result, it can be seen that the lower electric permittivity inherent within the piezoelectric metamaterials contributes to the increased piezoelectric voltage constant g. For example, the $g_{33}$ constant of the N=12, ⊖=90° lattices increases as the relative density decreases, as plotted in FIG. 3D previously discussed. Therefore, the voltage constants of the low relative density lattices outperform that of the bulk composites, indicating superior sensing capabilities.

Additionally, these micro-architected metamaterials outperform its base material and other piezoelectric materials regarding their hydrostatic properties. For hydrophone applications, an important parameter is the hydrostatic figure of merit (FOM) (Kara, H., Ramesh, R., Stevens, R. & Bowen, C. R. Porous PZT ceramics for receiving transducers. Ieee T Ultrason Ferr 50, 289-296 (2003)), which defines the material's suitability for underwater sonar applications, FOM=dh·gh (Pa$^{-1}$) where, $d_h$=$d_{33}$+($d_{32}$+$d_{31}$) (CN$^{-1}$) and $$g_h = \frac{d_h}{\varepsilon}(Vm^{-1}).$$

As shown in FIG. 25, the FOM of the piezoelectric metamaterials can be tuned in a large range by tuning the piezoelectric anisotropy via architecture and exceeding other piezoelectric materials and other piezoelectric foams (Kara et al., 2003, Liu, W. et al. Processing and Properties of Porous PZT Ceramics from Particle-Stabilized Foams via Gel Casting. J Am Ceram Soc 96, 1827-1831 (2013), Bowen, C. R., Perry, A., Lewis, A. C. F. & Kara, H. Processing and properties of porous piezoelectric materials with high hydrostatic figures of merit. J Eur Ceram Soc 24, 541-545 (2004), Marselli, S. et al. Porous piezoelectric ceramic hydrophone. J Acoust Soc Am 106, 733-738 (1999), Yang, A. K., Wang, C. A., Guo, R. & Huang, Y. Microstructure and Electrical Properties of Porous PZT Ceramics Fabricated by Different Methods. J Am Ceram Soc 93, 1984-1990 (2010), Zhang, Y., Chen, L. J., Zeng, J., Zhou, K. C. & Zhang, D. Aligned porous barium titanate/hydroxyapatite composites with high piezoelectric coefficients for bone tissue engineering. Mat Sci Eng C-Mater 39, 143-149 (2014), Guo, R., Wang, C. A. & Yang, A. K. Effects of pore size and orientation on dielectric and piezoelectric properties of 1-3 type porous PZT ceramics. J Eur Ceram Soc 31, 605-609 (2011) and Liu, W., Du, L. J., Wang, Y. Z., Yang, J. L. & Xu, H. Effects of foam composition on the microstructure and piezoelectric properties of macroporous PZT ceramics from ultrastable particle stabilized foams. Ceram Int 39, 8781-8787 (2013)). This beneficial property is attributed to, i) through changing the micro-architectures, the anisotropy of the d and h constants of these piezoelectric metamaterials can be tuned from {−, −, +} to {+, +, +} leading to the increase of dh. ii) higher overall gh at lower densities as compared to the base material and other piezoelectric materials, attributed to the low electric permittivity ε. This benefit of lower densities (e.g., lower permittivity) also validates predictions obtained from piezoelectric foam structures.

Details of the Material Selection Chart.

The envelope of the "Present work" in FIG. 3E will be enlarged if all configurations of metamaterials are mapped out based on the tunable range of the relative density, configuration of the micro-architectures, as well as stiffness of the binding monomers. Furthermore, the composite we used includes a large range of particle loading (3vol % to about 50 vol %) and as a result, their density varies with particle loading. The |d33| was normalized with with density to exclude the density variation with different particle loadings and highlight the benefit of consistent |d33| constant with decreasing relative density unique to piezo-active metamaterials, in contrast to the commonly known degradation of mechanical properties at lower relative density in structural metamaterials.

FIG. 26 plots the approximate envelop with most architectures and materials considered here. There are three factors affecting the tunable property envelope. The first factor is the tuned stiffness from the binding monomers employed in our study, marked as "stiff" and "flexible", respectively. The second factor is the nodal connectivity of the architectures. Based on the nodal connectivity which affects their effective modulus of the metamaterial, we group them into bending dominated and stretching dominated. The third factor is the screw angle of these structures, which affects the d33 constant as well as compliance.

The boundary and scaling relationships on effective charge constants, modulus and effect of relative density are estimated using the method as previously described above. The compliance is calculated based on the following equation: $J = \alpha \bar{\rho}^{-\beta} J_s$ where α is a pre-factor, β is the scaling factor, $\bar{\rho}$ is the relative density and Js is the compliance of the base materials. α is related to the screw angle and varies from 0.2~5 for different structures (Zheng, X. Y. et al. Ultralight, Ultrastiff Mechanical Metamaterials. Science 344, 1373-1377 (2014) and Yang, L., Harrysson, O., West, H. & Cormier, D. Modeling of uniaxial compression in a 3D periodic re-entrant lattice structure. J Mater Sci 48, 1413-1422 (2013)). For the bend-dominated structure, β falls within the range of 2.1~2.3 (Deshpande, V. S., Ashby, M. F. & Fleck, N. A. Foam topology bending versus stretching dominated architectures. Acta Mater 49, 1035-1040 (2001) and Gibson, L. J. & Ashby, M. F. Cellular Solids: Structure and Properties. (Cambridge University Press, Cambridge, 1999)). For the stretch-dominated structure, β is set within the range of 1.1~1.3 (Zheng et al., 2014) and Dong, L., Deshpande, V. & Wadley, H. Mechanical response of Ti-6Al-4V octet-truss lattice structures. Int J Solids Struct 60-61, 107-124 (2015). Js has two values as we change the polymer matrix. In the logarithmic coordinate system, the scaling between the dimensionless effective charge constant and the compliance of the structural group is a constant and can be calculated by:

$$\frac{\Delta \log(|d_{33}^{eff}|/\rho)}{\Delta \log(J)} = \frac{1}{\beta}$$

Based on the fabrication capability for the range of relative densities, the range of the relative density was set as 5%~45%. For particle loading, mapping the envelope was set at 3vol %. The envelope is mapped out in FIG. 26 using dashed lines and shaded areas in red. The straight dashed lines represent structures with the same structural group, screw angle and base material. Experimental results on the scaling relationships two categories, N=12, ⊖=90° and N=5, ⊖=120° structures were plotted.

Figure 27A:
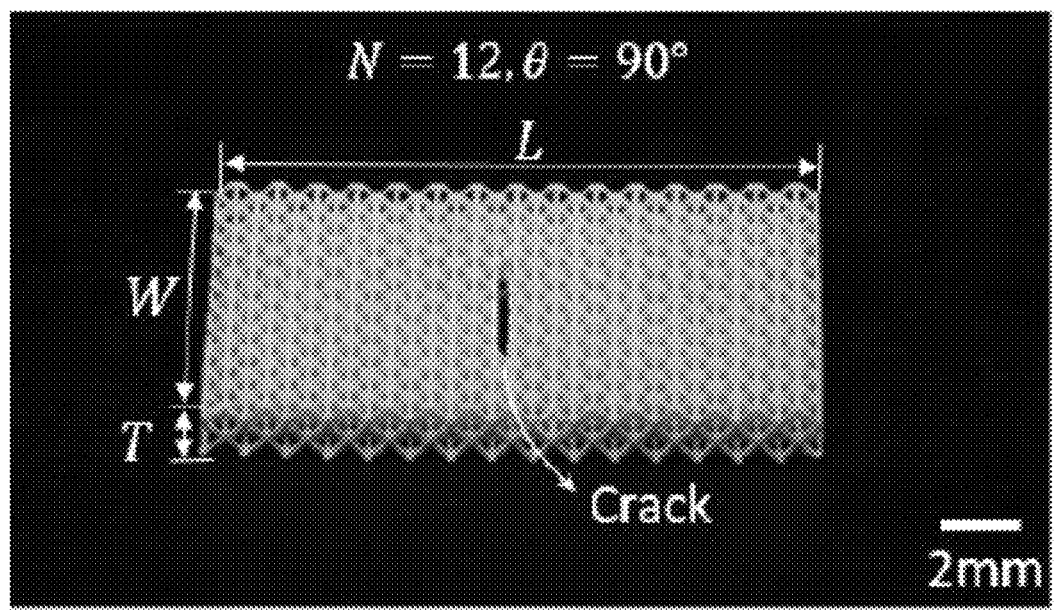
FIGS. 27A-27D show (FIG. 27A) Optical image of a piezoelectric sample (N=12, ⊖=90°, 28% relative density) with a central crack for fracture toughness testing.
Figure 27B:
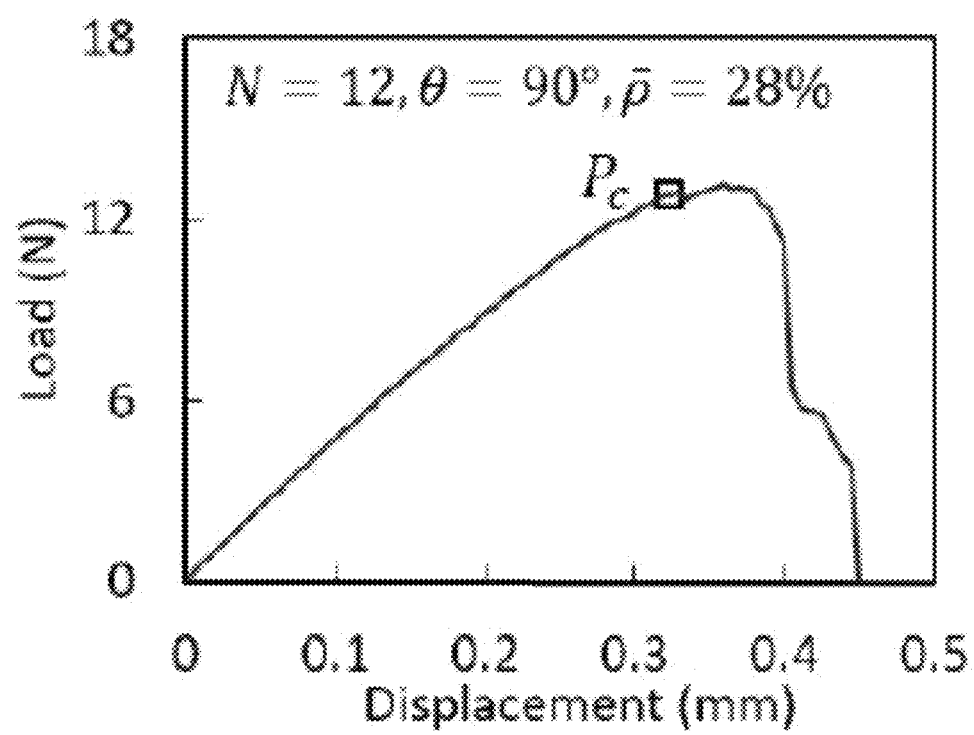
Figure 27C:
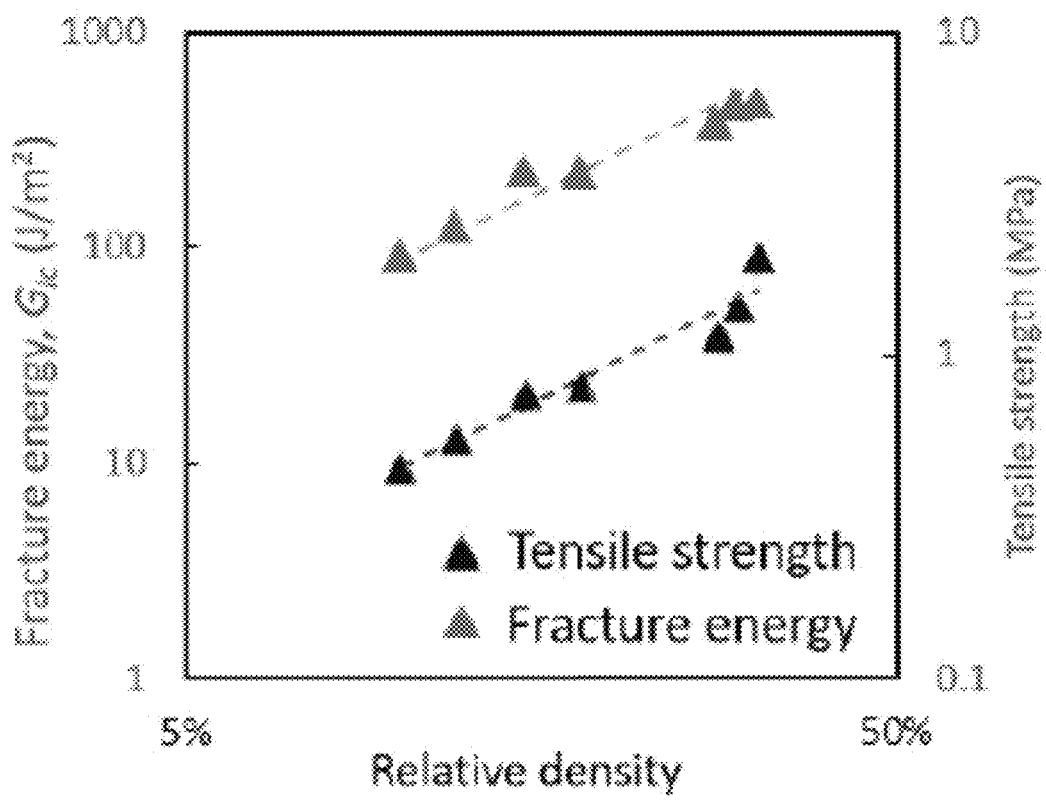
Figure 27D:
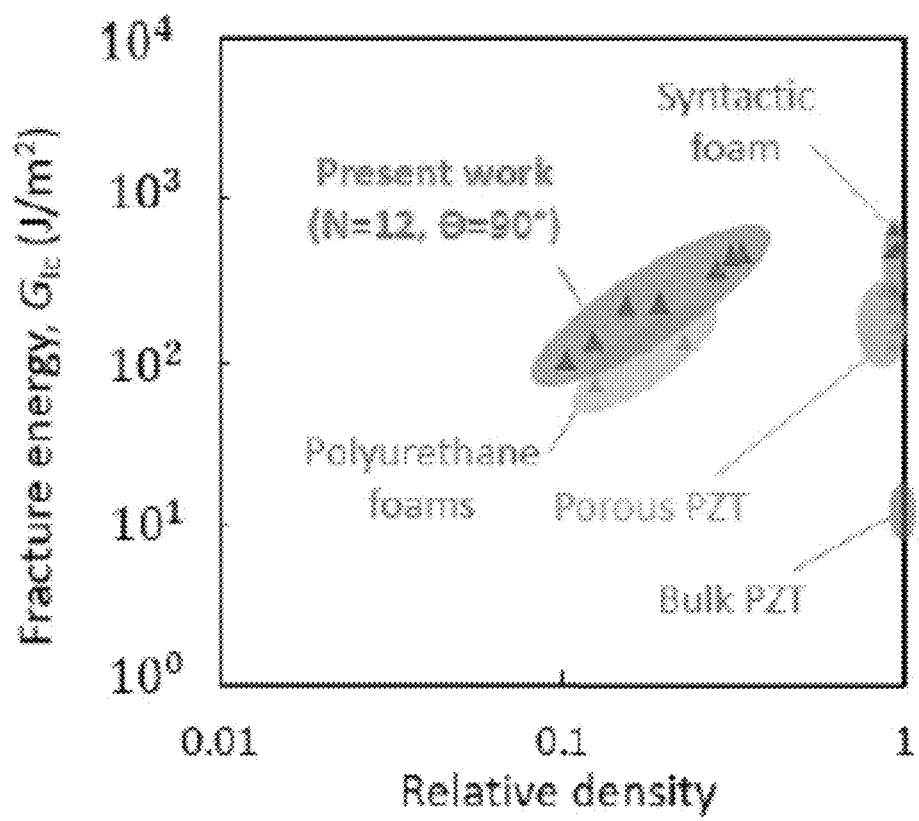

Fracture test of the piezoelectric metamaterial containing a crack. Here a center cracked tension (CCT) test Tada, H., Paris, P. C. & Irwin, G. R. The stress analysis of cracks handbook. (Del Rdearch Corporation, St. Louis, 1977) was performed to evaluate the fracture toughness of the metamaterials. CCT tests were conducted on the N=5, ⊖=120° design, with outer dimensions defined by L (length), W (width) and T (thickness) and an initial through-thickness notch of length about W/2, as shown in FIG. 27A. The relative density of the samples varies from 10% to 32% and all samples were fabricated using our elastic-brittle composite (PEGDA-PZT) with 3vol % PZT and tested with Instron 5944. The applied tensile load, P, versus load-line displacement, v, of a piezoelectric sample with a central notch at a relative density $\bar{\rho}$=28% is shown in FIG. 27B. After an initially linear P–v response, a peak load, $P_c$, was reached followed by a load drop, which was caused by the fracture of the struts right in front of the crack tip. The fracture toughness, KIc, of the samples was measured from the measured critical load, $P_c$, values from samples with relative density ranging from 10% to 32%. Here the fracture energy (GIc) (Johnson, F. A., Glover, A. P. & Radon, J. C. Fracture Toughness and Fracture Energy Measurements on Aluminum-Alloys. Eng Fract Mech 8, 381-390 (1976)) of these metamaterials of relative density ranging from 10% to 32% was compared with those of other piezoelectric relevant materials and porous materials (Mcintyre, A. & Anderton, G. E. Fracture Properties of a Rigid Polyurethane Foam over a Range of Densities. Polymer 20, 247-253 (1979), Lam, D. C. C., Lange, F. F. & Evans, A. G. Mechanical-Properties of Partially Dense Alumina Produced from Powder Compacts. J Am Ceram Soc 77, 2113-2117 (1994), and Wouterson, E. M., Boey, F. Y. C., Hu, X. & Wong, S. C. Specific properties and fracture toughness of syntactic foam: Effect of foam microstructures. Compos Sci Technol 65, 1840-1850 (2005)). Due to the very limited reported fracture toughness data on existing piezoelectric materials and foams to date, only the fracture energy of these samples was compared with a few types of porous materials against their relative density, as shown in FIG. 27D. The high fracture energy of the metamaterial shows its potential as energy absorbing materials when compared to other porous materials. The effective tensile strength of the samples with the same design and relative density range was measured by uniaxial tensioning the samples (with the same overall dimension) without crack, plotted in FIG. 27C.

Figure 28:
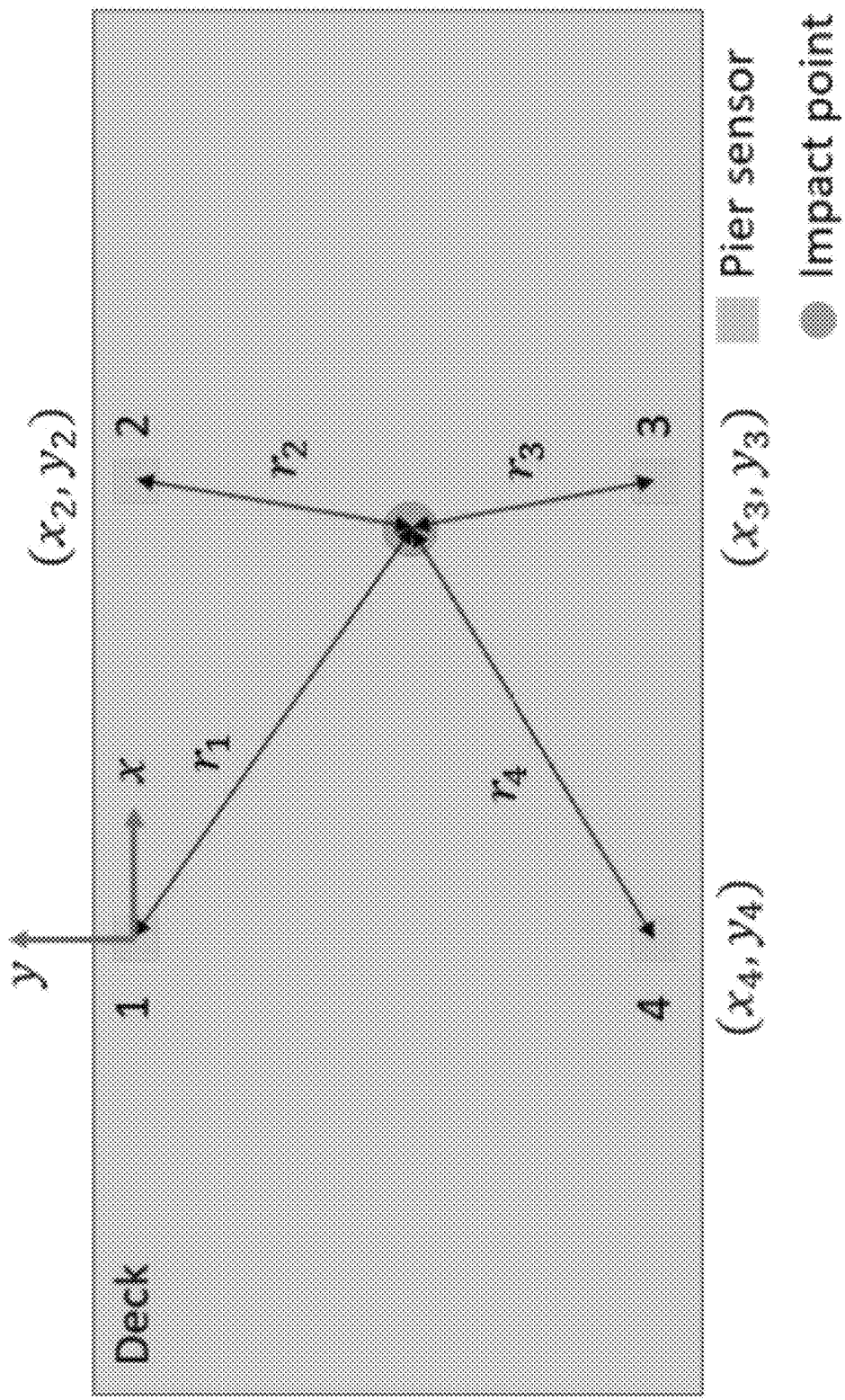

Impact mapping of the piezoelectric bridge infrastructure. The impact point on the bridge-like structure was first predicted by using four known displacements at the piers and relative positions among piers. A wave propagation and attenuation theory within the planar boundary (the deck) is utilized. The amplitude of the induced response at a given position within the boundary could be simplified to follow an exponential attenuation relation as: $u = Ce^{-Dr}$ (Eq. 44), where u is the induced response amplitude (displacement) of the point of interest (at the pier), C and D is a coefficient depending on the amplitude of the impulse and the damped frequency of the deck, r is the distance between the pier and the impact point. To obtain the displacements at four piers, the proportional relationship between peak voltage output and pier displacement is used due to the linear deformation of the piers: u=A·Vpeak (Eq. 45), where A is the coefficient of proportionality, Vpeak is the peak voltage output at the pier. Combining Eq. (44) and Eq. (45) yields the direct relationship between voltage output and distance r. A coordinate system is then set originating from pier 1, and therefore, the coordinates of each pier is defined (FIG. 28). Let the unknown impact point as (x, y), with four r's in terms of voltage outputs given by Eq. (44) and Eq. (45), four relationships between r's and (x, y) are denoted as: $r_k^2=(x-x_k)^2+(y-y_k)^2$ (Eq. 46), where rk is the distance between k-th pier and the impact point, xk and yk are coordinates of the k-th pier, k=1~4. With four circles defined by Eq. (46), one intersect point (i.e., impact point (x, y)) is determined while the maximum displacement induced by the impact force is also determined. By knowing the impact point, using Eq. (44), the strain at each point on the deck normalized by the maximum strain is thus solved.

Material Properties Used in FEA.

Density: $\rho=1.36\times10^3$ kg/m$^3$.

Elastic property: $E_1=E_2=770$ MPa, $E_3=480$ MPa, $v_{12}=0.46$, $v_{23}=0.64$, $v_{13}=0.37$, $G_{12}=257$ MPa, $G_{23}=G_{13}=480$ MPa.

Dielectric permittivity: $\in_{11}=\in_{22}=2.6\times10^{-10}$ F/m, $\in_{33}=1.2\times10^{-10}$ F/m.

Piezoelectric charge constant: $d_{15}=d_{24}=70$ pC/N. $d_{31}=d_{32}=-15$ pC/N. $d_{33}=52$ pC/N. the other dij=0.

REFERENCES FOR EXAMPLE 1

1. Hashimoto, K. Y. & Yamaguchi, M. Elastic, piezoelectric and dielectric properties of composite materials. IEEE 1986 Ultras. Symp. 2, 697-702 (1986).
2. Glushanin, S., Topolov, V. Y. & Krivoruchko, A. V. Features of piezoelectric properties of 0-3 PbTiO3-type ceramic/polymer composites. Mater. Chem. Phys. 97, 357-364 (2006).
3. Huang, J. H. & Kuo, W. S. Micromechanics determination of the effective properties of piezoelectric composites containing spatially oriented short fibers. Acta Mater. 44, 4889-4898 (1996).
4. Bowen, C. R. & Topolov, V. Y. Electromechanical Properties In Composites Based On Ferroelectrics 1-202 (Springer, London, 2).
5. Nix, E. L. & Ward, I. M. The measurement of the shear piezoelectric coefficients of polyvinylidene fluoride. Ferroelectrics.
6. Wang, H., Zhang, Q. M., Cross, L. E. & Sykes, A. O. Piezoelectric, dielectric, and elastic properties of poly (vinylidene fluoride/trifluoroethylene). J. Appl. Phys. 74, 3394-3398 (1993).
8. Deshpande, V. S., Ashby, M. F. & Fleck, N. A. Foam topology bending versus stretching dominated architectures. Acta Mater. 49, 1035-1040 (2001).
9. Kim, K. et al. 3D optical printing of piezoelectric nanoparticle-polymer composite materials. ACS Nano 8, 9799-9806 (2014).
10. He, X. M. et al. Synthetic homeostatic materials with chemo-mechano-chemical self-regulation. Nature 487, 214-218 (2012).
11. Eliades, S. J. & Wang, X. Q. Neural substrates of vocalization feedback monitoring in primate auditory cortex. Nature 453, 1102-1106 (2008).
12. Wu, W. Z., Wen, X. N. & Wang, Z. L. Taxel-addressable matrix of vertical-nanowire piezotronic transistors for active and adaptive tactile imaging. Science 340, 952-957 (2013).
13. Wan, Hu, J. & Park, T. Continuum models for the plastic deformation of octet-truss lattice materials under multiaxial loading. J. Eng. Mater. Technol. 135, 021004 (2013).
14. Zheng, X. et al. Multiscale metallic metamaterials. Nat. Mater. 15, 1100-1106 (2016).
15. Netfabb, Netfabb Ultimate 2019 (Autodesk, 2019).
16. Liu, L., Kamm, P., Garcia-Moreno, F., Banhart, J. & Pasini, D. Elastic and failure response of imperfect three-dimensional metallic lattices: the role of geometric defects induced by Selective Laser Melting. J. Mech. Phys. Solids. 107, 160-184 (2017).
17. Kar-Gupta, R. & Venkatesh, T. A. Electromechanical response of piezoelectric composites: effects of geometric connectivity and grain size. Acta Mater. 56, 3810-3823 (2008).
18. Challagulla, K. S. & Venkatesh, T. A. Electromechanical response of piezoelectric foams. Acta Mater. 60, 2111-2127 (2012).

Further attributes, features, and embodiments of the present invention can be understood by reference to the following numbered aspects of the disclosed invention. Reference to disclosure in any of the preceding aspects is applicable to any preceding numbered aspect and to any combination of any number of preceding aspects, as recognized by appropriate antecedent disclosure in any combination of preceding aspects that can be made. The following numbered aspects are provided:

1. A three-dimensional (3D) piezoelectric structure comprising:
    a 3D periodic microlattice comprising a piezoelectric composite material, wherein the 3D periodic microlattice comprises a plurality of interconnected 3D node units capable of generating a piezoelectric response upon application of a stress to the 3D periodic microlattice, and wherein the plurality of interconnected 3D node units form a tailored piezoelectric tensor space.

2. The 3D piezoelectric structure of aspect 1, wherein the piezoelectric composite material comprises: a plurality of functionalized piezoelectric particles crosslinked to a polymer matrix.

3. The 3D piezoelectric structure of any one of aspects 1-2, wherein the polymer matrix comprises photosensitive monomers.

4. The 3D piezoelectric structure of any one of aspects 1-3, wherein the polymer matrix comprises a polymer selected from the group consisting of: polydimethylsiloxane (PDMS), poly(ethylene glycol) diacrylate, polyvinylidene fluoride (PVDF), hexanediol diacrylate (HDDA) a thermoset polymer, a thermoplastic polymer, and combinations thereof.

5. The 3D piezoelectric structure of any one of aspects 1-4, wherein the functionalized piezoelectric particles comprise a piezoelectric particle and a functionalization moiety, wherein the functionalization moiety is covalently attached to the piezoelectric particle.

6. The 3D piezoelectric structure of any one of aspects 1-5, wherein the piezoelectric particle is selected from the group consisting of: quartz, berlinite (AlPO$_4$), sodium potassium tartrate tetrahydrate, topaz, a tourmaline-group mineral, (PbTiO$_3$), langasite (La$_3$Ga$_5$SiO$_{14}$), gallium orthophosphate (GaPO$_4$), lithium niobite (LiNbO$_3$), lithium tantalite (LiTaO$_3$), barium titanate (BaTiO$_3$), lead zirconate titanate (PZT), potassium niobite (KNbO$_3$), sodium tungstate (Na$_2$WO$_3$), Ba$_2$NaNb$_5$O$_5$, Pb$_2$KNb$_5$O$_{15}$, sodium potassium niobite (K,Na)NbO$_3$), bismuth ferrite (BiFeO$_3$), sodium niobite (NaNbO$_3$), bismuth titanate (Bi$_4$Ti$_3$O$_{12}$), sodium bismuth titanate (NaBi(TiO$_3$)$_2$), Zinc oxide (ZnO), niobite-lead titanate (PMN-PT), and combinations thereof.

7. The 3D piezoelectric structure of any one of aspects 1-6, wherein the functionalization moiety is a moiety capable of forming hydroxyl groups on the nanoparticle surfaces to form covalent linkage with the polymer matrix.

8. The 3D piezoelectric structure of any one of aspects 1-7, wherein the functionalization moiety is selected from the group consisting of: a moiety comprising an acrylate containing group, trimethoxysilylpropyl methacrylate (TMSPM), t trimethoxysilylpropyl acrylate (TMSPA), and combinations thereof.

9. The 3D piezoelectric structure of any one of aspects 1-8, wherein the functionalized piezoelectric particles are crosslinked to the polymer matrix via the functionalization moiety.

10. A three dimensional (3D) piezoelectric structure comprising:
two or more interconnected three dimensional (3D) piezoelectric structures as in any one of aspects 1-9, wherein at least two of the 3D piezoelectric structures have different 3D microlattices and wherein the at least two 3D piezoelectric structures having different 3D microlattices produce a different piezoelectric response upon application of a stress to the two or more interconnected 3D piezoelectric structures.

11. A three dimensional (3D) piezoelectric structure as in any one of any one of aspects 1-10, wherein the 3D piezoelectric structure is manufactured using an additive manufacturing technique.

12. The 3D piezoelectric structure of any one of aspects 1-11, wherein the additive manufacturing technique is a light-based additive manufacturing technique.

13. A system comprising:
one or more three dimensional (3D) piezoelectric structures as in any one of any one of aspects 1-12; and
one or more electrodes, wherein the one or more electrodes are coupled to at least one of the one or more 3D piezoelectric structures.

14. The system of aspects 13, further comprising an electric current generator, wherein the electric current generator is coupled to at least one of the one or more 3D piezoelectric structures.

15. The system of any one of aspects 13-14, further comprising an output sensor, wherein the electric output sensor is coupled to at least one of the one or more 3D piezoelectric structures and wherein the output sensor is configured to receive an output signal from the one or more 3D piezoelectric structures.

16. The system of any one of aspects 13-15, wherein the output signal is an electrical signal.

17. A method comprising:
applying a stress to a three dimensional (3D) piezoelectric structure of any one of aspects 1-12 or to one more 3D piezoelectric structures in the system of any one of aspects 13-16; and
generating a piezoelectric response to the applied stress, wherein the piezoelectric response is generated by the 3D piezoelectric structure as in any one of aspects 1-12 or by one or more of the 3D piezoelectric structure in the system of any one of aspects 13-16.

18. The method of aspect 17, wherein the stress is an electrical current and the piezoelectric response is a mechanical response.

19. The method of aspect 17, wherein the stress is a mechanical force and the piezoelectric response is an electrical output.

20. A method of generating a 3D piezoelectric structure comprising:
a) coating a substrate with functionalized piezoelectric particles;
b) exposing the functionalized piezoelectric particles to a photosensitive monomeric polymer resin, wherein the functionalized piezoelectric particle comprises a piezoelectric material and a functionalization moiety comprising a monomeric polymer, wherein the functionalization moiety is covalently bonded to the piezoelectric particle;
c) exposing the functionalized piezoelectric particles to light to polymerize the photosensitive monomeric polymer resin and the functionalization moiety of the piezoelectric particle, wherein the exposure to light is controlled to form a layer a 3D-microlattice of the 3D piezoelectric structure;
e) coating the layer of the 3D-microlattice and substrate with functionalized piezoelectric particles; and
d) repeating steps a) to d) as many times as desired to form the 3D-microlattice.

21. The method of aspect 20, further comprising the step of forming the functionalized piezoelectric particle, wherein the step comprises functionalizing a particle comprising a piezoelectric material with the functionalization moiety by covalently bonding the functionalization moiety to the particle to form the functionalized piezoelectric particle and wherein the step of forming the functionalized piezoelectric particle occurs before step a).

22. A method of generating 3D piezoelectric lattice architectures capable of generating directional voltage or strain response comprising:
(a) designing three-dimensional unit cell structures, wherein each unit cell structures comprises symmetric or asymmetric strut members which give rise to different electric charge density distributions;
(b) designing arbitrary piezoelectric charge coefficient tensors via varying the angles and orientation of intersecting artificial unit cell members; and
(c) tessellating the of unit cell structures into piezoelectric lattice materials of any macroscopic shapes.

23. Use of artificial unit cell design methods to design piezoelectric materials with different voltage responses to stresses in different directions.

24. Use of the piezoelectric voltage responses to detect and decouple stress components, wherein the stress components can be selected from the group consisting of: shear stress, normal stress, twisting, bending, and combinations thereof.

25. Use of the artificial unit cell design methods to design piezoelectric lattice materials to detect elastic waves and sound signals coming from different directions and locations.

What is claimed is:
1. A three-dimensional (3D) piezoelectric structure comprising:
a 3D periodic microlattice comprising a piezoelectric composite material, wherein the 3D periodic microlattice comprises a plurality of interconnected 3D node units capable of generating a piezoelectric response upon application of a stress to the 3D periodic microlattice, and wherein the plurality of interconnected 3D node units form a tailored piezoelectric tensor space, wherein each 3D node unit of the plurality of interconnected 3D node units comprises struts that are arranged in 3D space and wherein at least one of the struts in a first 3D node unit is connected to a struct in a second 3D node unit so as to form an interconnected 3D node unit.

2. The 3D piezoelectric structure of claim 1, wherein the piezoelectric composite material comprises: a plurality of functionalized piezoelectric particles crosslinked to a polymer matrix.

3. The 3D piezoelectric structure of claim 2, wherein the polymer matrix comprises photosensitive monomers.

4. The 3D piezoelectric structure of claim 2, wherein the polymer matrix comprises a polymer selected from the group consisting of: polydimethylsiloxane (PDMS), poly(ethylene glycol) diacrylate, polyvinylidene fluoride (PVDF), hexanediol diacrylate (HDDA) a thermoset polymer, a thermoplastic polymer, and combinations thereof.

5. The 3D piezoelectric structure of claim 2, wherein the functionalized piezoelectric particles comprise a piezoelectric particle and a functionalization moiety, wherein the functionalization moiety is covalently attached to the piezoelectric particle.

6. The 3D piezoelectric structure of claim 5, wherein the piezoelectric particle is selected from the group consisting of: quartz, berlinite ($AlPO_4$), sodium potassium tartrate tetrahydrate, topaz, a tourmaline-group mineral, ($PbTiO_3$), langasite ($La_3Ga_5SiO_{14}$), gallium orthophosphate ($GaPO_4$), lithium niobite ($LiNbO_3$), lithium tantalite ($LiTaO_3$), barium titanate ($BaTiO_3$), lead zirconate titanate (PZT), potassium niobite ($KNbO_3$), sodium tungstate ($Na_2WO_3$), $Ba_2NaNb_5O_5$, $Pb_2KNb_5O_{15}$, sodium potassium niobite ($(K,Na)NbO_3$), bismuth ferrite ($BiFeO_3$), sodium niobite ($NaNbO_3$), bismuth titanate ($Bi_4Ti_3O_{12}$), sodium bismuth titanate ($NaBi(TiO_3)_2$), Zinc oxide (ZnO), niobite-lead titanate (PMN-PT), and combinations thereof.

7. The 3D piezoelectric structure of claim 6, wherein the functionalization moiety is a moiety capable of forming hydroxyl groups on the nanoparticle surfaces to form covalent linkage with the polymer matrix.

8. The 3D piezoelectric structure of claim 7, wherein the functionalization moiety is selected from the group consisting of: a moiety comprising an acrylate containing group, trimethyoxysilylpropyl methacrylate (TMSPM), trimethyoxysilylpropyl acrylate (TMSPA), and combinations thereof.

9. The 3D piezoelectric structure of claim 5, wherein the functionalized piezoelectric particles are crosslinked to the polymer matrix via the functionalization moiety.

10. The three dimensional (3D) piezoelectric structure of claim 1, wherein the 3D piezoelectric structure is manufactured using an additive manufacturing technique.

11. The 3D piezoelectric structure of claim 10, wherein the additive manufacturing technique is a light-based additive manufacturing technique.

12. A system comprising:
one or more three dimensional (3D) piezoelectric structures as in claim 1; and
one or more electrodes, wherein the one or more electrodes are coupled to at least one of the one or more 3D piezoelectric structures.

13. The system of claim 12, further comprising an electric current generator, wherein the electric current generator is coupled to at least one of the one or more 3D piezoelectric structures.

14. The system of claim 12, further comprising an output sensor, wherein the electric output sensor is coupled to at least one of the one or more 3D piezoelectric structures and, wherein the output sensor is configured to receive an output signal from the one or more 3D piezoelectric structures.

15. The system of claim 14, wherein the output signal is an electrical signal.

16. A method comprising:
applying a stress to a three dimensional (3D) piezoelectric structure of claim 1; and
generating a piezoelectric response to the applied stress, wherein the piezoelectric response is generated by the 3D piezoelectric structure as in claim 1.

17. The method of claim 16, wherein the stress is an electrical current and the piezoelectric response is a mechanical response.

18. The method of claim 16, wherein the stress is a mechanical force and the piezoelectric response is an electrical output.

19. The system of claim 12, wherein the system comprises two or more three dimensional (3D) piezoelectric structures, wherein the two or more 3D structures are interconnected, wherein at least two of the 3D piezoelectric structures have different 3D microlattices, and wherein the at least two 3D piezoelectric structures having different 3D microlattices produce a different piezoelectric response upon application of a stress to the two or more interconnected 3D piezoelectric structures.

* * * * *